(12) United States Patent
Sekar et al.

(10) Patent No.: US 8,450,804 B2
(45) Date of Patent: May 28, 2013

(54) SEMICONDUCTOR DEVICE AND STRUCTURE FOR HEAT REMOVAL

(75) Inventors: Deepak Sekar, San Jose, CA (US); Zvi Or-Bach, San Jose, CA (US); Brian Cronquist, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 0 days.

(21) Appl. No.: 13/571,614

(22) Filed: Aug. 10, 2012

(65) Prior Publication Data

US 2012/0306082 A1    Dec. 6, 2012

(51) Int. Cl.
*H01L 27/01* (2006.01)
*H01L 27/12* (2006.01)
*H01L 31/0392* (2006.01)

(52) U.S. Cl.
USPC .......................... 257/347; 257/758; 257/712

(58) Field of Classification Search
USPC .......... 257/347, 758, 747, 712–718, E27.064, 257/E23.051
See application file for complete search history.

(56) References Cited

U.S. PATENT DOCUMENTS

| | | |
|---|---|---|
| 3,007,090 A | 10/1961 | Rutz |
| 3,819,959 A | 6/1974 | Chang et al. |
| 4,197,555 A | 4/1980 | Uehara et al. |
| 4,400,715 A | 8/1983 | Barbee et al. |
| 4,487,635 A | 12/1984 | Kugimiya et al. |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |

(Continued)

FOREIGN PATENT DOCUMENTS

| | | |
|---|---|---|
| EP | 1267594 A2 | 12/2002 |
| EP | 1909311 A2 | 4/2008 |
| WO | PCT/US2008/063483 | 5/2008 |

OTHER PUBLICATIONS

Ishihara, R., et al., "Monolithic 3D-ICs with single grain Si thin film transistors," Solid-State Electronics 71 (2012) pp. 80-87.

(Continued)

*Primary Examiner* — Cuong Q Nguyen

(57) ABSTRACT

A device, including: a first layer of first transistors, overlaid by at least one interconnection layer, wherein the interconnection layer includes metals such as copper or aluminum; a second layer including second transistors, the second layer overlaying the interconnection layer, wherein the second layer is less than about 0.4 micron thick; and a connection path connecting the second transistors to the interconnection layer, wherein the connection path includes at least one through-layer via, and the through-layer via includes material whose co-efficient of thermal expansion is within about 50 percent of the second layer coefficient of thermal expansion.

30 Claims, 62 Drawing Sheets

U.S. PATENT DOCUMENTS

| | | | |
|---|---|---|---|
| 5,087,585 A | 2/1992 | Hayashi | |
| 5,093,704 A | 3/1992 | Sato et al. | |
| 5,106,775 A | 4/1992 | Kaga et al. | |
| 5,152,857 A | 10/1992 | Ito et al. | |
| 5,162,879 A | 11/1992 | Gill | |
| 5,217,916 A | 6/1993 | Anderson et al. | |
| 5,250,460 A | 10/1993 | Yamagata et al. | |
| 5,258,643 A | 11/1993 | Cohen | |
| 5,265,047 A | 11/1993 | Leung et al. | |
| 5,266,511 A | 11/1993 | Takao | |
| 5,277,748 A | 1/1994 | Sakaguchi et al. | |
| 5,286,670 A | 2/1994 | Kang et al. | |
| 5,294,556 A | 3/1994 | Kawamura | |
| 5,308,782 A | 5/1994 | Mazure et al. | |
| 5,312,771 A | 5/1994 | Yonehara | |
| 5,317,236 A | 5/1994 | Zavracky et al. | |
| 5,324,980 A | 6/1994 | Kusunoki | |
| 5,355,022 A | 10/1994 | Sugahara et al. | |
| 5,371,037 A | 12/1994 | Yonehara | |
| 5,374,564 A | 12/1994 | Bruel | |
| 5,374,581 A | 12/1994 | Ichikawa et al. | |
| 5,424,560 A | 6/1995 | Norman et al. | |
| 5,475,280 A | 12/1995 | Jones et al. | |
| 5,478,762 A | 12/1995 | Chao | |
| 5,485,031 A | 1/1996 | Zhang et al. | |
| 5,498,978 A | 3/1996 | Takahashi et al. | |
| 5,527,423 A | 6/1996 | Neville et al. | |
| 5,535,342 A | 7/1996 | Taylor | |
| 5,554,870 A | 9/1996 | Fitch et al. | |
| 5,563,084 A | 10/1996 | Ramm et al. | |
| 5,583,349 A | 12/1996 | Norman et al. | |
| 5,583,350 A | 12/1996 | Norman et al. | |
| 5,594,563 A | 1/1997 | Larson | |
| 5,604,137 A | 2/1997 | Yamazaki et al. | |
| 5,617,991 A | 4/1997 | Pramanick et al. | |
| 5,627,106 A | 5/1997 | Hsu | |
| 5,656,548 A | 8/1997 | Zavracky et al. | |
| 5,670,411 A | 9/1997 | Yonehara | |
| 5,681,756 A | 10/1997 | Norman et al. | |
| 5,695,557 A | 12/1997 | Yamagata et al. | |
| 5,701,027 A | 12/1997 | Gordon et al. | |
| 5,707,745 A | 1/1998 | Forrest et al. | |
| 5,714,395 A | 2/1998 | Bruel | |
| 5,721,160 A | 2/1998 | Forrest et al. | |
| 5,737,748 A | 4/1998 | Shigeeda | |
| 5,739,552 A | 4/1998 | Kimura et al. | |
| 5,744,979 A | 4/1998 | Goetting | |
| 5,748,161 A | 5/1998 | Lebby et al. | |
| 5,757,026 A | 5/1998 | Forrest et al. | |
| 5,770,881 A | 6/1998 | Pelella et al. | |
| 5,781,031 A | 7/1998 | Bertin et al. | |
| 5,829,026 A | 10/1998 | Leung et al. | |
| 5,835,396 A | 11/1998 | Zhang | |
| 5,854,123 A | 12/1998 | Sato et al. | |
| 5,861,929 A | 1/1999 | Spitzer | |
| 5,877,070 A | 3/1999 | Goesele et al. | |
| 5,882,987 A | 3/1999 | Srikrishnan | |
| 5,883,525 A | 3/1999 | Tavana et al. | |
| 5,889,903 A | 3/1999 | Rao | |
| 5,893,721 A | 4/1999 | Huang et al. | |
| 5,915,167 A | 6/1999 | Leedy | |
| 5,937,312 A | 8/1999 | Iyer et al. | |
| 5,943,574 A | 8/1999 | Tehrani et al. | |
| 5,952,680 A | 9/1999 | Strite | |
| 5,952,681 A | 9/1999 | Chen | |
| 5,965,875 A | 10/1999 | Merrill | |
| 5,977,579 A | 11/1999 | Noble | |
| 5,977,961 A | 11/1999 | Rindal | |
| 5,980,633 A | 11/1999 | Yamagata et al. | |
| 5,985,742 A | 11/1999 | Henley et al. | |
| 5,998,808 A | 12/1999 | Matsushita | |
| 6,001,693 A | 12/1999 | Yeouchung et al. | |
| 6,009,496 A | 12/1999 | Tsai | |
| 6,020,252 A | 2/2000 | Aspar et al. | |
| 6,020,263 A | 2/2000 | Shih et al. | |
| 6,027,958 A | 2/2000 | Vu et al. | |
| 6,030,700 A | 2/2000 | Forrest et al. | |
| 6,052,498 A | 4/2000 | Paniccia | |
| 6,057,212 A | 5/2000 | Chan et al. | |
| 6,071,795 A | 6/2000 | Cheung et al. | |
| 6,103,597 A | 8/2000 | Aspar et al. | |
| 6,111,260 A | 8/2000 | Dawson et al. | |
| 6,125,217 A | 9/2000 | Paniccia et al. | |
| 6,153,495 A | 11/2000 | Kub et al. | |
| 6,191,007 B1 | 2/2001 | Matsui et al. | |
| 6,222,203 B1 | 4/2001 | Ishibashi et al. | |
| 6,229,161 B1 | 5/2001 | Nemati et al. | |
| 6,242,324 B1 | 6/2001 | Kub et al. | |
| 6,259,623 B1 | 7/2001 | Takahashi | |
| 6,264,805 B1 | 7/2001 | Forrest et al. | |
| 6,281,102 B1 | 8/2001 | Cao et al. | |
| 6,294,018 B1 | 9/2001 | Hamm et al. | |
| 6,306,705 B1 | 10/2001 | Parekh et al. | |
| 6,321,134 B1 | 11/2001 | Henley et al. | |
| 6,322,903 B1 | 11/2001 | Siniaguine et al. | |
| 6,331,468 B1 | 12/2001 | Aronowitz et al. | |
| 6,331,790 B1 | 12/2001 | Or-Bach et al. | |
| 6,353,492 B2 | 3/2002 | McClelland et al. | |
| 6,355,501 B1 | 3/2002 | Fung et al. | |
| 6,358,631 B1 | 3/2002 | Forrest et al. | |
| 6,365,270 B2 | 4/2002 | Forrest et al. | |
| 6,376,337 B1 | 4/2002 | Wang et al. | |
| 6,380,046 B1 | 4/2002 | Yamazaki | |
| 6,392,253 B1 | 5/2002 | Saxena | |
| 6,417,108 B1 | 7/2002 | Akino et al. | |
| 6,420,215 B1 | 7/2002 | Knall et al. | |
| 6,423,614 B1 | 7/2002 | Doyle | |
| 6,429,481 B1 | 8/2002 | Mo et al. | |
| 6,429,484 B1 | 8/2002 | Yu | |
| 6,430,734 B1 | 8/2002 | Zahar | |
| 6,475,869 B1 | 11/2002 | Yu | |
| 6,476,493 B2 | 11/2002 | Or-Bach et al. | |
| 6,479,821 B1 | 11/2002 | Hawryluk et al. | |
| 6,515,511 B2 | 2/2003 | Sugibayashi et al. | |
| 6,526,559 B2 | 2/2003 | Schiefele et al. | |
| 6,528,391 B1 | 3/2003 | Henley et al. | |
| 6,534,352 B1 | 3/2003 | Kim | |
| 6,534,382 B1 | 3/2003 | Sakaguchi et al. | |
| 6,544,837 B1 | 4/2003 | Divakauni et al. | |
| 6,545,314 B2 | 4/2003 | Forbes et al. | |
| 6,555,901 B1 | 4/2003 | Yoshihara et al. | |
| 6,563,139 B2 | 5/2003 | Hen | |
| 6,580,289 B2 | 6/2003 | Cox | |
| 6,600,173 B2 | 7/2003 | Tiwari | |
| 6,624,046 B1 | 9/2003 | Zavracky et al. | |
| 6,627,518 B1 | 9/2003 | Inoue et al. | |
| 6,630,713 B2 | 10/2003 | Geusic | |
| 6,635,552 B1 | 10/2003 | Gonzalez | |
| 6,635,588 B1 | 10/2003 | Hawryluk et al. | |
| 6,638,834 B2 | 10/2003 | Gonzalez | |
| 6,642,744 B2 | 11/2003 | Or-Bach et al. | |
| 6,653,209 B1 | 11/2003 | Yamagata | |
| 6,661,085 B2 | 12/2003 | Kellar et al. | |
| 6,677,204 B2 | 1/2004 | Cleeves et al. | |
| 6,686,253 B2 | 2/2004 | Or-Bach | |
| 6,703,328 B2 | 3/2004 | Tanaka et al. | |
| 6,756,633 B2 | 6/2004 | Wang et al. | |
| 6,756,811 B2 | 6/2004 | Or-Bach | |
| 6,759,282 B2 | 7/2004 | Campbell et al. | |
| 6,762,076 B2 | 7/2004 | Kim et al. | |
| 6,774,010 B2 | 8/2004 | Chu et al. | |
| 6,805,979 B2 | 10/2004 | Ogura et al. | |
| 6,806,171 B1 | 10/2004 | Ulyashin et al. | |
| 6,809,009 B2 | 10/2004 | Aspar et al. | |
| 6,815,781 B2 | 11/2004 | Vyvoda et al. | |
| 6,819,136 B2 | 11/2004 | Or-Bach | |
| 6,821,826 B1 | 11/2004 | Chan et al. | |
| 6,844,243 B1 | 1/2005 | Gonzalez | |
| 6,864,534 B2 | 3/2005 | Ipposhi et al. | |
| 6,875,671 B2 | 4/2005 | Faris | |
| 6,882,572 B2 | 4/2005 | Wang et al. | |
| 6,888,375 B2 | 5/2005 | Feng et al. | |
| 6,917,219 B2 | 7/2005 | New | |
| 6,930,511 B2 | 8/2005 | Or-Bach | |
| 6,943,067 B2 | 9/2005 | Greenlaw | |
| 6,943,407 B2 | 9/2005 | Ouyang et al. | |
| 6,953,956 B2 | 10/2005 | Or-Bach et al. | |

| | | |
|---|---|---|
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,282,951 B2 | 10/2007 | Huppenthal et al. |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,335,573 B2 | 2/2008 | Takayama et al. |
| 7,337,425 B2 | 2/2008 | Kirk |
| 7,338,884 B2 | 3/2008 | Shimoto et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 * | 5/2008 | Lee .................. 257/296 |
| 7,393,722 B1 | 7/2008 | Issaq et al. |
| 7,419,844 B2 | 9/2008 | Lee et al. |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,557,367 B2 | 7/2009 | Rogers et al. |
| 7,563,659 B2 | 7/2009 | Kwon et al. |
| 7,566,855 B2 | 7/2009 | Olsen et al. |
| 7,586,778 B2 | 9/2009 | Ho et al. |
| 7,589,375 B2 | 9/2009 | Jang et al. |
| 7,608,848 B2 | 10/2009 | Ho et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,749,884 B2 | 7/2010 | Mathew et al. |
| 7,759,043 B2 | 7/2010 | Tanabe et al. |
| 7,768,115 B2 | 8/2010 | Lee et al. |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,199 B2 | 9/2010 | Oh et al. |
| 7,846,814 B2 | 12/2010 | Lee |
| 7,867,822 B2 | 1/2011 | Lee |
| 7,888,764 B2 | 2/2011 | Lee |
| 7,915,164 B2 | 3/2011 | Konevecki et al. |
| 8,014,195 B2 | 9/2011 | Okhonin et al. |
| 8,031,544 B2 | 10/2011 | Kim et al. |
| 8,044,464 B2 | 10/2011 | Yamazaki et al. |
| 8,107,276 B2 | 1/2012 | Breitwisch et al. |
| 8,129,256 B2 | 3/2012 | Farooq et al. |
| 8,158,515 B2 | 4/2012 | Farooq et al. |
| 8,184,463 B2 | 5/2012 | Saen et al. |
| 8,203,187 B2 | 6/2012 | Lung et al. |
| 8,208,279 B2 | 6/2012 | Lue |
| 2001/0000005 A1 | 3/2001 | Forrest et al. |
| 2001/0014391 A1 | 8/2001 | Forrest et al. |
| 2002/0024140 A1 | 2/2002 | Nakajima et al. |
| 2002/0025604 A1 | 2/2002 | Tiwari |
| 2002/0081823 A1 | 6/2002 | Cheung et al. |
| 2002/0141233 A1 | 10/2002 | Hosotani et al. |
| 2002/0153243 A1 | 10/2002 | Forrest et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0067043 A1 | 4/2003 | Zhang |
| 2003/0102079 A1 | 6/2003 | Kalvesten et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0157748 A1 | 8/2003 | Kim et al. |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2004/0014299 A1 | 1/2004 | Moriceau et al. |

| | | | | | | |
|---|---|---|---|---|---|---|
| 2004/0033676 A1 | 2/2004 | Coronel et al. | 2008/0032463 A1 | 2/2008 | Lee | |
| 2004/0036126 A1 | 2/2004 | Chau et al. | 2008/0038902 A1 | 2/2008 | Lee | |
| 2004/0047539 A1 | 3/2004 | Okubora et al. | 2008/0048327 A1 | 2/2008 | Lee | |
| 2004/0061176 A1 | 4/2004 | Takafuji et al. | 2008/0067573 A1* | 3/2008 | Jang et al. | 257/315 |
| 2004/0113207 A1 | 6/2004 | Hsu et al. | 2008/0099780 A1 | 5/2008 | Tran | |
| 2004/0150068 A1 | 8/2004 | Leedy | 2008/0124845 A1 | 5/2008 | Yu et al. | |
| 2004/0152272 A1 | 8/2004 | Fladre et al. | 2008/0128745 A1 | 6/2008 | Mastro et al. | |
| 2004/0155301 A1 | 8/2004 | Zhang | 2008/0136455 A1 | 6/2008 | Diamant et al. | |
| 2004/0156233 A1 | 8/2004 | Bhattacharyya | 2008/0150579 A1 | 6/2008 | Madurawe | |
| 2004/0166649 A1 | 8/2004 | Bressot et al. | 2008/0160431 A1 | 7/2008 | Scott et al. | |
| 2004/0178819 A1 | 9/2004 | New | 2008/0160726 A1 | 7/2008 | Lim et al. | |
| 2004/0259312 A1 | 12/2004 | Schlosser et al. | 2008/0179678 A1 | 7/2008 | Dyer et al. | |
| 2004/0262635 A1 | 12/2004 | Lee | 2008/0191247 A1* | 8/2008 | Yin et al. | 257/316 |
| 2004/0262772 A1 | 12/2004 | Ramanathan et al. | 2008/0191312 A1 | 8/2008 | Oh et al. | |
| 2005/0003592 A1 | 1/2005 | Jones | 2008/0194068 A1 | 8/2008 | Temmler et al. | |
| 2005/0023656 A1 | 2/2005 | Leedy | 2008/0203452 A1 | 8/2008 | Moon et al. | |
| 2005/0067620 A1 | 3/2005 | Chan et al. | 2008/0213982 A1 | 9/2008 | Park et al. | |
| 2005/0067625 A1 | 3/2005 | Hata | 2008/0220558 A1 | 9/2008 | Zehavi et al. | |
| 2005/0073060 A1 | 4/2005 | Datta et al. | 2008/0220565 A1 | 9/2008 | Hsu et al. | |
| 2005/0098822 A1 | 5/2005 | Mathew | 2008/0224260 A1 | 9/2008 | Schmit et al. | |
| 2005/0110041 A1 | 5/2005 | Boutros et al. | 2008/0237591 A1 | 10/2008 | Leedy | |
| 2005/0121676 A1 | 6/2005 | Fried et al. | 2008/0251862 A1 | 10/2008 | Fonash et al. | |
| 2005/0121789 A1 | 6/2005 | Madurawe | 2008/0254561 A2 | 10/2008 | Yoo | |
| 2005/0130351 A1 | 6/2005 | Leedy | 2008/0254572 A1 | 10/2008 | Leedy | |
| 2005/0130429 A1 | 6/2005 | Rayssac et al. | 2008/0261378 A1 | 10/2008 | Yao et al. | |
| 2005/0148137 A1 | 7/2005 | Brask et al. | 2008/0272492 A1 | 11/2008 | Tsang | |
| 2005/0225237 A1 | 10/2005 | Winters | 2008/0277778 A1 | 11/2008 | Furman et al. | |
| 2005/0280061 A1 | 12/2005 | Lee | 2008/0283875 A1 | 11/2008 | Mukasa et al. | |
| 2005/0280090 A1 | 12/2005 | Anderson et al. | 2008/0284611 A1 | 11/2008 | Leedy | |
| 2005/0280154 A1 | 12/2005 | Lee | 2008/0296681 A1 | 12/2008 | Georgakos et al. | |
| 2005/0280155 A1 | 12/2005 | Lee | 2008/0315351 A1 | 12/2008 | Kakehata | |
| 2005/0280156 A1 | 12/2005 | Lee | 2009/0001469 A1 | 1/2009 | Yoshida et al. | |
| 2005/0282019 A1 | 12/2005 | Fukushima et al. | 2009/0001504 A1 | 1/2009 | Takei et al. | |
| 2006/0014331 A1 | 1/2006 | Tang et al. | 2009/0016716 A1 | 1/2009 | Ishida | |
| 2006/0024923 A1 | 2/2006 | Sarma et al. | 2009/0032899 A1 | 2/2009 | Irie | |
| 2006/0033110 A1 | 2/2006 | Alam et al. | 2009/0039918 A1 | 2/2009 | Madurawe | |
| 2006/0033124 A1 | 2/2006 | Or-Bach et al. | 2009/0052827 A1 | 2/2009 | Durfee et al. | |
| 2006/0067122 A1 | 3/2006 | Verhoeven | 2009/0055789 A1 | 2/2009 | McIlrath | |
| 2006/0071322 A1 | 4/2006 | Kitamura | 2009/0061572 A1 | 3/2009 | Hareland et al. | |
| 2006/0071332 A1 | 4/2006 | Speers | 2009/0064058 A1 | 3/2009 | McIlrath | |
| 2006/0083280 A1 | 4/2006 | Tauzin et al. | 2009/0066365 A1 | 3/2009 | Solomon | |
| 2006/0113522 A1 | 6/2006 | Lee et al. | 2009/0066366 A1 | 3/2009 | Solomon | |
| 2006/0121690 A1 | 6/2006 | Pogge et al. | 2009/0070727 A1 | 3/2009 | Solomon | |
| 2006/0179417 A1 | 8/2006 | Madurawe | 2009/0079000 A1 | 3/2009 | Yamasaki et al. | |
| 2006/0181202 A1 | 8/2006 | Liao et al. | 2009/0081848 A1 | 3/2009 | Erokhin | |
| 2006/0189095 A1 | 8/2006 | Ghyselen et al. | 2009/0087759 A1 | 4/2009 | Matsumoto et al. | |
| 2006/0194401 A1 | 8/2006 | Hu et al. | 2009/0096009 A1 | 4/2009 | Dong et al. | |
| 2006/0195729 A1 | 8/2006 | Huppenthal et al. | 2009/0096024 A1 | 4/2009 | Shingu et al. | |
| 2006/0207087 A1 | 9/2006 | Jafri et al. | 2009/0115042 A1 | 5/2009 | Koyanagi | |
| 2006/0249859 A1 | 11/2006 | Eiles et al. | 2009/0128189 A1 | 5/2009 | Madurawe et al. | |
| 2006/0275962 A1 | 12/2006 | Lee | 2009/0134397 A1 | 5/2009 | Yokoi et al. | |
| 2007/0014508 A1 | 1/2007 | Chen et al. | 2009/0144669 A1 | 6/2009 | Bose et al. | |
| 2007/0035329 A1 | 2/2007 | Madurawe | 2009/0144678 A1 | 6/2009 | Bose et al. | |
| 2007/0063259 A1 | 3/2007 | Derderian et al. | 2009/0146172 A1 | 6/2009 | Pumyea | |
| 2007/0072391 A1 | 3/2007 | Pocas et al. | 2009/0159870 A1 | 6/2009 | Lin et al. | |
| 2007/0076509 A1 | 4/2007 | Zhang | 2009/0160482 A1 | 6/2009 | Karp et al. | |
| 2007/0077694 A1 | 4/2007 | Lee | 2009/0161401 A1 | 6/2009 | Bigler et al. | |
| 2007/0077743 A1 | 4/2007 | Rao et al. | 2009/0179268 A1 | 7/2009 | Abou-Khalil et al. | |
| 2007/0090416 A1 | 4/2007 | Doyle et al. | 2009/0194152 A1 | 8/2009 | Liu et al. | |
| 2007/0102737 A1 | 5/2007 | Kashiwabara et al. | 2009/0194768 A1 | 8/2009 | Leedy | |
| 2007/0108523 A1 | 5/2007 | Ogawa et al. | 2009/0204933 A1 | 8/2009 | Rezgui | |
| 2007/0111386 A1 | 5/2007 | Kim et al. | 2009/0212317 A1 | 8/2009 | Kolodin et al. | |
| 2007/0111406 A1 | 5/2007 | Joshi et al. | 2009/0218627 A1 | 9/2009 | Zhu | |
| 2007/0132049 A1 | 6/2007 | Stipe | 2009/0221110 A1 | 9/2009 | Lee et al. | |
| 2007/0132369 A1 | 6/2007 | Forrest et al. | 2009/0224364 A1 | 9/2009 | Oh et al. | |
| 2007/0135013 A1 | 6/2007 | Faris | 2009/0234331 A1 | 9/2009 | Langereis et al. | |
| 2007/0158659 A1 | 7/2007 | Bensce | 2009/0242893 A1 | 10/2009 | Tomiyasu | |
| 2007/0187775 A1 | 8/2007 | Okhonin et al. | 2009/0250686 A1 | 10/2009 | Sato et al. | |
| 2007/0190746 A1 | 8/2007 | Ito et al. | 2009/0262583 A1 | 10/2009 | Lue | |
| 2007/0194453 A1 | 8/2007 | Chakraborty et al. | 2009/0263942 A1 | 10/2009 | Ohnuma et al. | |
| 2007/0210336 A1 | 9/2007 | Madurawe | 2009/0267233 A1 | 10/2009 | Lee | |
| 2007/0218622 A1 | 9/2007 | Lee et al. | 2009/0272989 A1 | 11/2009 | Shum et al. | |
| 2007/0228383 A1 | 10/2007 | Bernstein et al. | 2009/0290434 A1 | 11/2009 | Kurjanowicz | |
| 2007/0252203 A1 | 11/2007 | Zhu et al. | 2009/0302387 A1 | 12/2009 | Joshi et al. | |
| 2007/0262457 A1 | 11/2007 | Lin | 2009/0302394 A1 | 12/2009 | Fujita | |
| 2007/0275520 A1 | 11/2007 | Suzuki | 2009/0309152 A1 | 12/2009 | Knoefler et al. | |
| 2007/0281439 A1 | 12/2007 | Bedell et al. | 2009/0321830 A1 | 12/2009 | Maly | |
| 2007/0283298 A1 | 12/2007 | Bernstein et al. | 2009/0321853 A1 | 12/2009 | Cheng | |
| 2007/0287224 A1 | 12/2007 | Alam et al. | 2009/0321948 A1 | 12/2009 | Wang et al. | |

| | | |
|---|---|---|
| 2009/0325343 A1 | 12/2009 | Lee |
| 2010/0001282 A1 | 1/2010 | Mieno |
| 2010/0025766 A1 | 2/2010 | Nuttinck et al. |
| 2010/0031217 A1 | 2/2010 | Sinha et al. |
| 2010/0038743 A1 | 2/2010 | Lee |
| 2010/0052134 A1 | 3/2010 | Werner et al. |
| 2010/0058580 A1 | 3/2010 | Yazdani |
| 2010/0081232 A1 | 4/2010 | Furman et al. |
| 2010/0112753 A1 | 5/2010 | Lee |
| 2010/0112810 A1 | 5/2010 | Lee et al. |
| 2010/0123202 A1 | 5/2010 | Hofmann |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0190334 A1 | 7/2010 | Lee |
| 2010/0193884 A1 | 8/2010 | Park et al. |
| 2010/0193964 A1 | 8/2010 | Farooq et al. |
| 2010/0276662 A1 | 11/2010 | Colinge |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0037052 A1 | 2/2011 | Schmidt et al. |
| 2011/0042696 A1 | 2/2011 | Smith et al. |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0143506 A1 | 6/2011 | Lee |
| 2011/0147791 A1 | 6/2011 | Norman et al. |
| 2011/0221022 A1 | 9/2011 | Toda |
| 2011/0241082 A1 | 10/2011 | Bernstein et al. |
| 2011/0284992 A1 | 11/2011 | Zhu |
| 2011/0286283 A1 | 11/2011 | Lung et al. |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0074466 A1 | 3/2012 | Setiadi et al. |
| 2012/0181654 A1 | 7/2012 | Lue |
| 2012/0182801 A1 | 7/2012 | Lue |

OTHER PUBLICATIONS

Lee, S. Y., et al., "Architecture of 3D Memory Cell Array on 3D IC," IEEE International Memory Workshop, May 20, 2012, Monterey, CA.

Lee, S. Y., et al., "3D IC Architecture for High Density Memories," IEEE International Memory Workshop, p. 1-6, May 2010.

Rajendran, B., et al., "CMOS transistor processing compatible with monolithic 3-D Integration," Proceedings VMIC 2005.

Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate SiO2," IEEE Electron Device Lett., vol. 13, No. 4, pp. 186-188, Apr. 1992.

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Topol, A.W., et al., "Enabling SOI-Based Assembly Technology for Three-Dimensional (3D) Integrated Circuits (ICs)," IEDM Tech. Digest, Dec. 5, 2005, pp. 363-366.

Demeester, P., et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T., et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., no., pp. 14-15, Jun. 12-14, 2007.

Burr, G. W., et al., "Overview of candidate device technologies for storage-class memory," IBM Journal of Research and Development, vol. 52, No. 4.5, pp. 449-464, Jul. 2008.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Bez, R., et al., "Introduction to Flash memory," Proceedings IEEE, 91(4), 489-502 (2003).

Kim, W., et al., "Multi-layered Vertical Gate NAND Flash overcoming stacking limit for terabit density storage", Symposium on VLSI Technology Digest of Technical Papers, 2009, pp. 188-189.

Auth, C., et al., "45nm High-k + Metal Gate Strain-Enhanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et al., "Nickel vs. Cobalt Silicide integration for sub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Dicioccio, L., et. al., "Direct bonding for wafer level 3D integration", ICICDT 2010, pp. 110-113.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.

Celler, G.K., et al., "Frontiers of silicon-on-insulator," J. App. Phys., May 1, 2003, pp. 4955-4978, vol. 93, No. 9.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to 053511-2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European, pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr. and Meth. in Phys. Res. B, 2002, pp. 761-766, vol. 190.

Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Vengurlekar, A., et al., "Mechanism of Dopant Activation Enhancement in Shallow Junctions by Hydrogen", Proceedings of the Materials Research Society, vol. 864, Spring 2005, E9.28.1-6.

Hui, K. N., et al., "Design of vertically-stacked polychromatic light-emitting diodes," Optics Express, Jun. 8, 2009, pp. 9873-9878, vol. 17, No. 12.

Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.

Guo, X., et al., "Cascade single-chip phosphor-free white light emitting diodes," Applied Physics Letters, 2008, pp. 013507-1-013507-3, vol. 92.

Chuai, D. X., et al., "A Trichromatic Phosphor-Free White Light-Emitting Diode by Using Adhesive Bonding Scheme," Proc. SPIE, 2009, vol. 7635.

Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Takafuji, Y., et al., "Integration of Single Crystal Si TFTs and Circuits on a Large Glass Substrate," IEEE International Electron Devices Meeting (IEDM), Dec. 7-9, 2009, pp. 1-4.

Flamand, G., et al., "Towards Highly Efficient 4-Terminal Mechanical Photovoltaic Stacks," III-Vs Review, Sep.-Oct. 2006, pp. 24-27, vol. 19, Issue 7.

Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Wierer, J.J., et al., "High-power AlGaInN flip-chip light-emitting diodes," Applied Physics Letters, May 28, 2001, pp. 3379-3381, vol. 78, No. 22.

El-Gamal, A., "Trends in CMOS Image Sensor Technology and Design," International Electron Devices Meeting Digest of Technical Papers, Dec. 2002.

Ahn, S.W., "Fabrication of a 50 nm half-pitch wire grid polarizer using nanoimprint lithography," Nanotechnology, 2005, pp. 1874-1877, vol. 16, No. 9.

Johnson, R.C., "Switching LEDs on and off to enlighten wireless communications," EE Times, Jun. 2010, last accessed Oct. 11, 2010, <http://www.embeddedinternetdesign.com/design/225402094>.

Ohsawa, et al.,"Autonomous Refresh of Floating Body Cell (FBC)", International Electron Device Meeting, 2008, pp. 801-804.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.

Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.

Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.

Chen, W., et al., "InP Layer Transfer with Masked Implantation," Electrochemical and Solid-State Letters, Issue 12, No. 4, Apr. 2009, H149-150.

Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D., et al., "Design and CAD for 3D Integrated Circuits," 45th ACM/IEEE Design, Automation Conference (DAC), Jun. 8-13, 2008, pp. 668-673.
Brebner, G., "Tooling up for Reconfigurable System Design," IEE Colloquium on Reconfigurable Systems, 1999, Ref. No. 1999/061, pp. 2/1-2/4.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Dong, C., et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," pp. 407-410.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.
Weis, M., et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Gosele, U., et al., "Semiconductor Wafer Bonding," Annual Review of Materials Science, Aug. 1998, pp. 215-241, vol. 28.
Spangler, L.J., et al., "A Technology for High Performance Single-Crystal Silicon-on-Insulator Transistors," IEEE Electron Device Letters, Apr. 1987, pp. 137-139, vol. 8, No. 4.
Luo, Z.S., et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions On Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.

Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology / high-density 3D-integration technology for multifunctional devices", (2009) IEEE International Conference on 3D System Integration, 3DIC 2009.

Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Sellathamby, C.V., et al., "Non-contact wafer probe using wireless probe cards", (2005) Proceedings—International Test Conference, 2005, pp. 447-452.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011 vol. 88, Issue 4, pp. 331-335.

Bobba, S., et al., "CELONCEL: Effective Design Technique for 3-D Monolithic Integration targeting High Performance Integrated Circuits", *Asia pacific DAC 2011*, paper 4A-4.

Choudhury, D., "3D Integration Technologies for Emerging Microsystems", IEEE Proceedings of the IMS 2010, pp. 1-4.

Lee, Y.-J., et. al, "3D 65nm CMOS with 320° C. Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-C6P58.

Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.

Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.

Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.

Joyner, J.W., "Opportunities and Limitations of Three-dimensional Integration for Interconnect Design", PhD Thesis, Georgia Institute of Technology, Jul. 2003.

Choi, S.-J., "A Novel TFT with a Laterally Engineered Bandgap for of 3D Logic and Flash Memory", 2010 Symposium of VLSI Technology Digest, pp. 111-112.

Meindl, J. D., "Beyond Moore's Law: The Interconnect Era", IEEE Computing in Science & Engineering, Jan./Feb. 2003, pp. 20-24.

Radu, I., et al., "Recent Developments of Cu-Cu non-thermo compression bonding for wafer-to-wafer 3D stacking", IEEE 3D Systems Integration Conference (3DIC), Nov. 16-18, 2010.

Gaudin, G., et al., "Low temperature direct wafer to wafer bonding for 3D integration", 3D Systems Integration Conference (3DIC), IEEE, 2010, Munich, Nov. 16-18, 2010, pp. 1-4.

Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.

Souri, S. J., "Interconnect Performance in 3-Dimensional Integrated Circuits", PhD Thesis, Stanford, Jul. 2003.

Uemoto, Y., et al., "A High-Performance Stacked-CMOS SRAM Cell by Solid Phase Growth Technique", Symposium on VLSI Technology, 2010, pp. 21-22.

Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.

Steen, S.E., et al., "Overlay as the key to drive wafer scale 3D integration", Microelectronic Engineering 84 (2007) 1412-1415.

Maeda, N., et al., "Development of Sub 10-µm Ultra-Thinning Technology using Device Wafers for 3D Manufacturing of Terabit Memory", 2010 Symposium on VLSI Technology Digest of Technical Papers, pp. 105-106.

Lin, X., et al., "Local Clustering 3-D Stacked CMOS Technology for Interconnect Loading Reduction", IEEE Transactions on electron Devices, vol. 53, No. 6, Jun. 2006, pp. 1405-1410.

Chan, M., et al., "3-Dimensional Integration for Interconnect Reduction in for Nano-CMOS Technologies", IEEE Tencon, Nov. 23, 2006, Hong Kong.

Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.

Naito, T., et al., "World's first monolithic 3D-FPGA with TFT SRAM over 90nm 9 layer Cu CMOS", 2010 Symposium on VLSI Technology Digest of Technical Papers, pp. 219-220.

Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.

Cong, J., et al., "Quantitative Studies of Impact of 3D IC Design on Repeater Usage", Proceedings of International VLSI/ULSI Multilevel Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

Koyanagi, M, "Different Approaches to 3D Chips", 3D IC Review, Stanford University, May 2005.

Koyanagi, M, "Three-Dimensional Integration Technology and Integrated Systems", ASPDAC 2009 presentation.

Koyanagi, M., et al., "Three-Dimensional Integration Technology and Integrated Systems", ASPDAC 2009, paper 4D-1, pp. 409-415.

Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Rajendran, B., et al., "Thermal Simulation of laser Annealing for 3D Integration", Proceedings VMIC 2003.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation Of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Sadaka, M., et al., "Building Blocks for wafer level 3D integration", www.electroiq.com, Aug. 18, 2010, last accessed Aug. 18, 2010.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Madan, N., et al., "Leveraging 3D Technology for Improved Reliability," Proceedings of the 40th Annual IEEE/ACM International Symposium on Microarchitecture (MICRO 2007), IEEE Computer Society.

Hayashi, Y., et al., "Fabrication of Three Dimensional IC Using "Cumulatively Bonded IC" (CUBIC) Technology", 1990 Symposium on VLSI Technology, pp. 95-96.

Akasaka, Y., "Three Dimensional IC Trends," Proceedings of the IEEE, vol. 24, No. 12, Dec. 1986.

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.

Kunio, T., et al., "Three Dimensional ICs, Having Four Stacked Active Device Layers," IEDM 1989, paper 34.6, pp. 837-840.

Agarwal, A., et al., "Efficient production of silicon-on-insulator films by co-implantation of He+ with H+'" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Gaillardon, P-E., et al., "Can We Go Towards True 3-D Architectures?," DAC 2011, paper 58, pp. 282-283.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.

Goplen, B., et al., "Thermal Via Placement in 3DICs," Proceedings of the International Symposium on Physical Design, Apr. 3-6, 2005, San Francisco.

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Bobba, S., et al., "Performance Analysis of 3-D Monolithic Integrated Circuits," 2010 IEEE International 3D Systems Integration Conference (3DIC), Nov. 2010, Munich, pp. 1-4.

Batude, P., et al., "Demonstration of low temperature 3D sequential FDSOI integration down to 50nm gate length," 2011 Symposium on VLSI Technology Digest of Technical Papers, pp. 158-159.

Batude, P., et al., "Advances, Challenges and Opportunities in 3D CMOS Sequential Integration," 2011 IEEE International Electron Devices Meeting, paper 7.3, Dec. 2011, pp. 151-154.

Miller, D.A.B., "Optical interconnects to electronic chips," Applied Optics, vol. 49, No. 25, Sep. 1, 2010, pp. F59-F70.

Yun, C. H., et al., "Transfer of patterned ion-cut silicon layers", Applied Physics Letters, vol. 73, No. 19, Nov. 1998, pp. 2772-2774.

En, W. G., et al., "The Genesis Process": A New SOI wafer fabrication method, Proceedings 1998 IEEE International SOI Conference, Oct. 1998, pp. 163-164.

Kim, J., et al., "A Stacked Memory Device on Logic 3D Technology for Ultra-high-density Data Storage," Nanotechnology, vol. 22, 254006 (2011).

Yang, M., et al., "High Performance CMOS Fabricated on Hybrid Substrate with Different Crystal Orientation," Proceedings IEDM 2003.

Lee, K. W., et al., "Three-dimensional shared memory fabricated using wafer stacking technology," IEDM Tech. Dig., 2000, pp. 165-168.

Yin, H., et al., "Scalable 3-D finlike poly-Si TFT and its nonvolatile memory application," IEEE Trans. Electron Devices, vol. 55, No. 2, pp. 578-584, Feb. 2008.

Chen, H. Y., et al., "HfOx Based Vertical Resistive Random Access Memory for Cost Effective 3D Cross-Point Architecture without Cell Selector," Proceedings IEDM 2012, pp. 497-499.

* cited by examiner

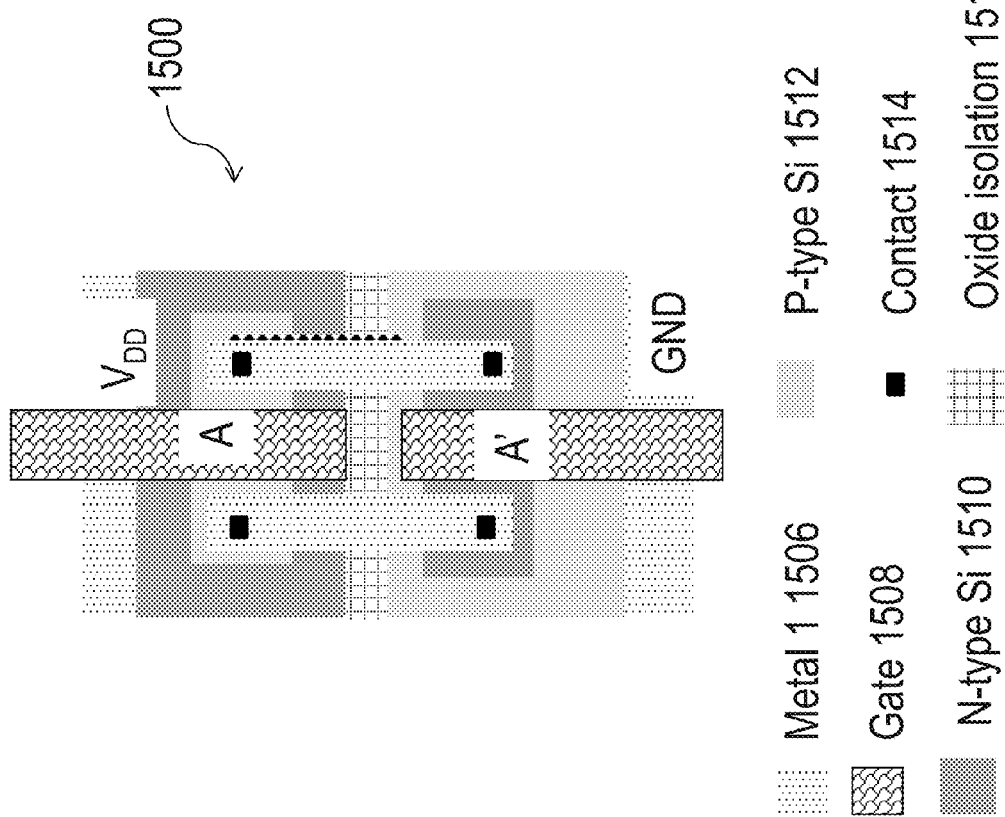

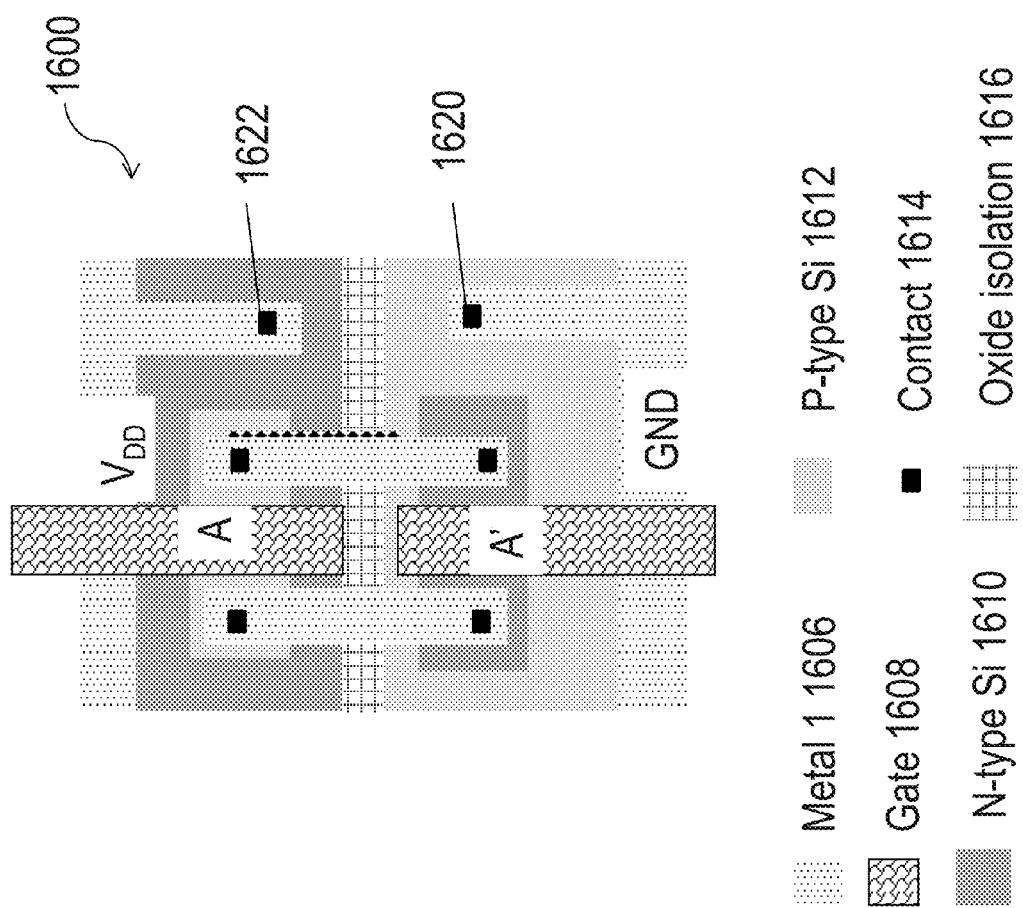

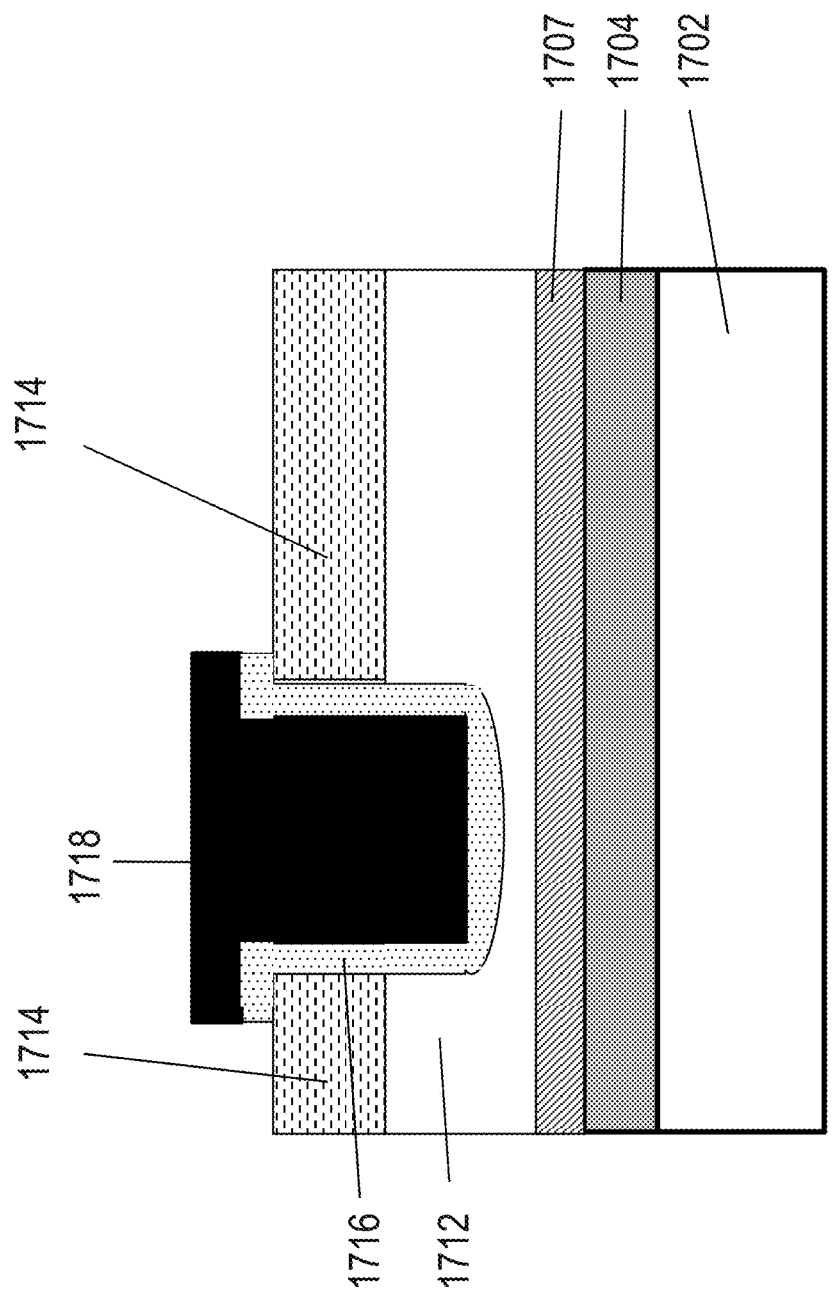

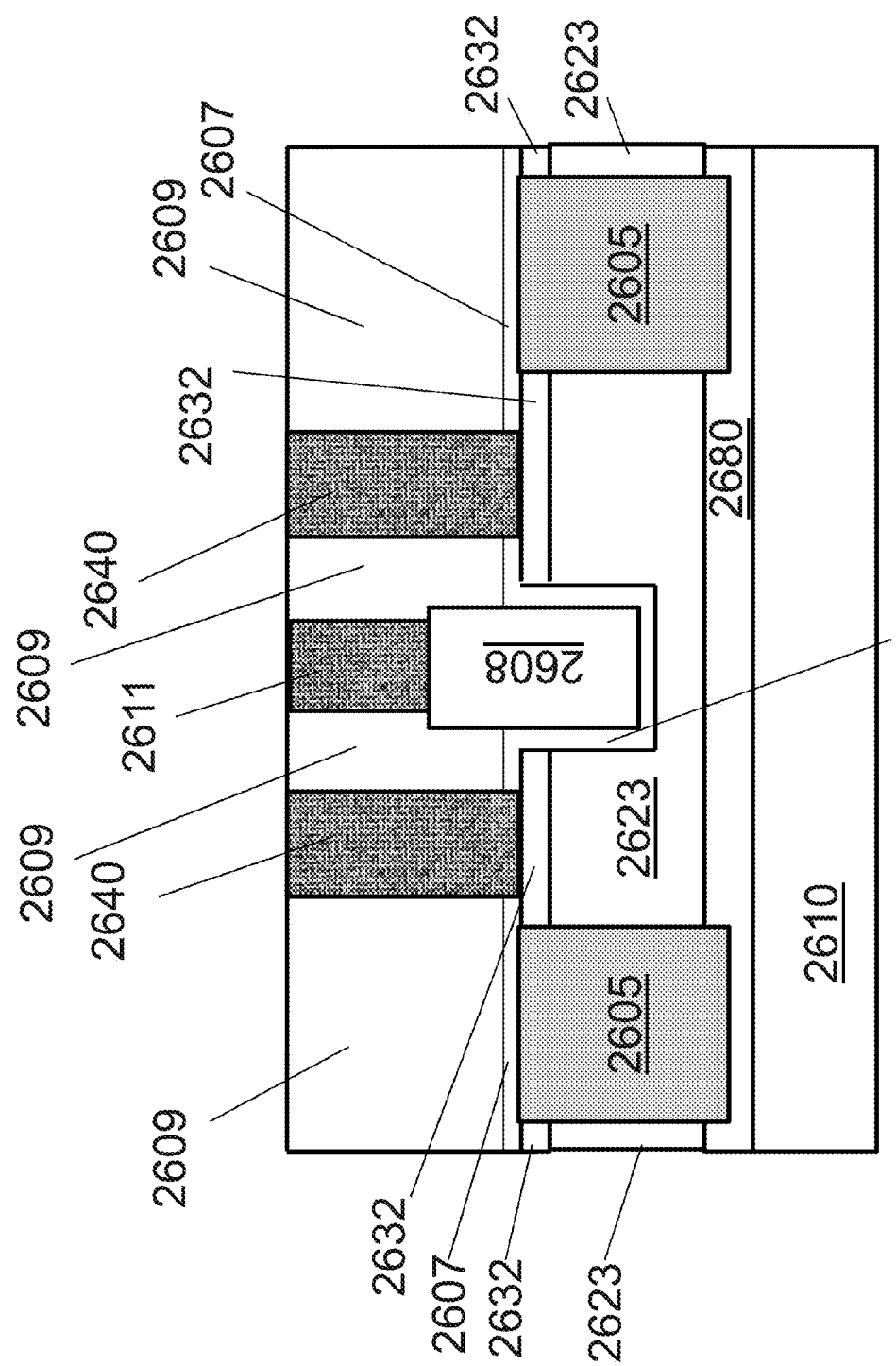

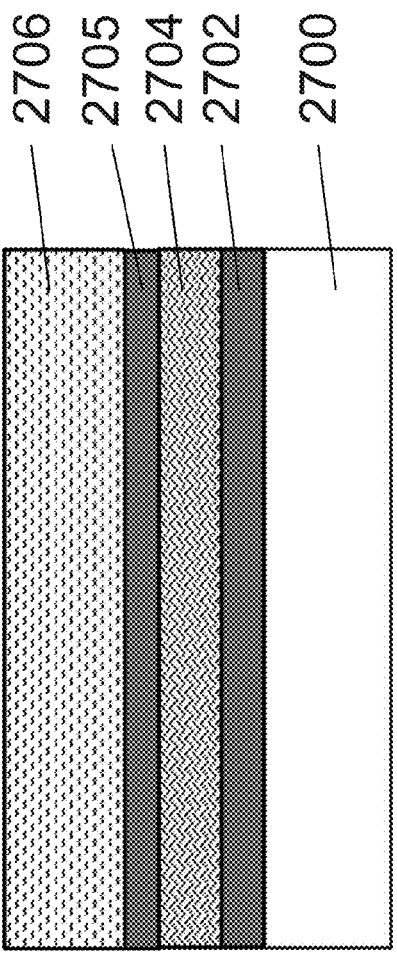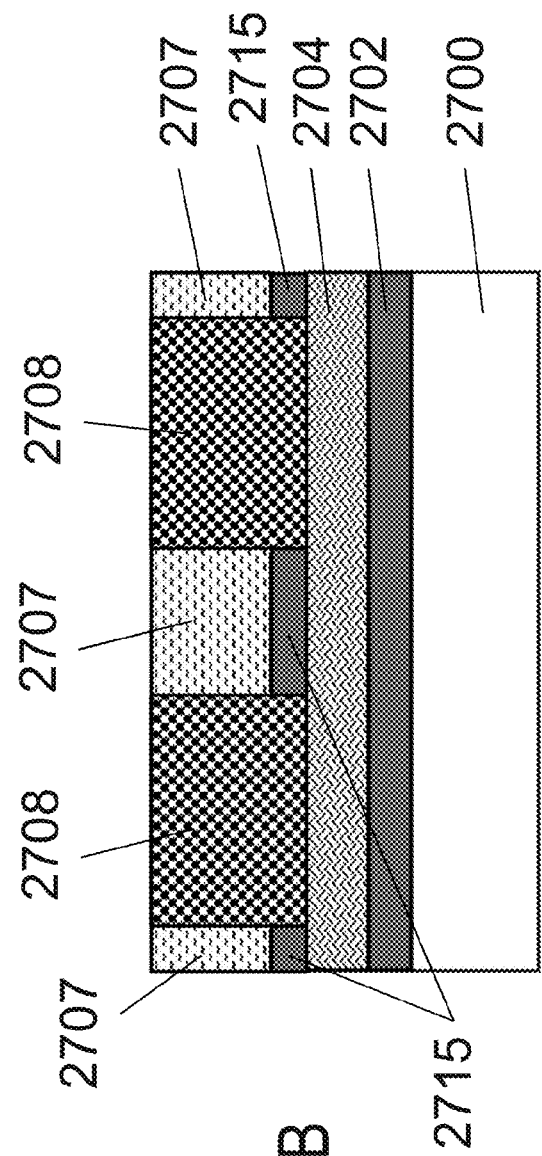

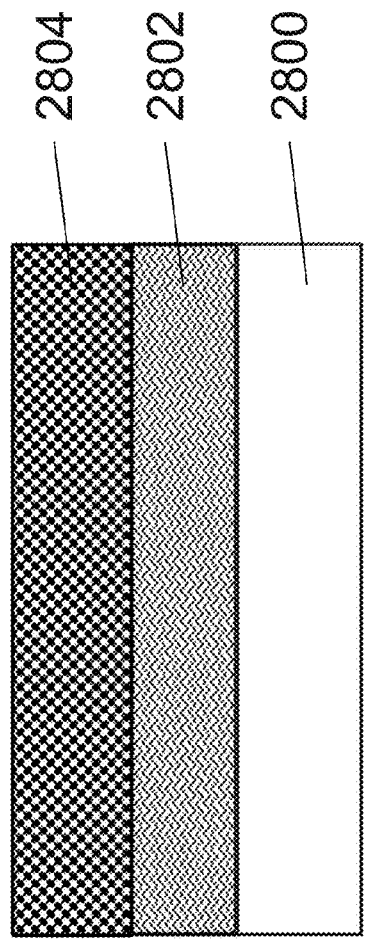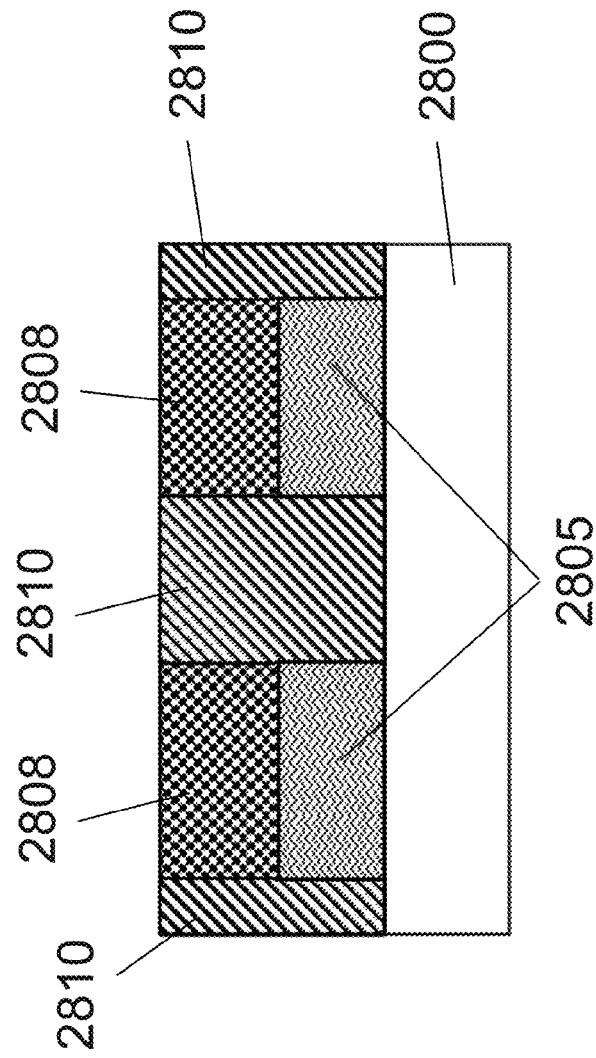

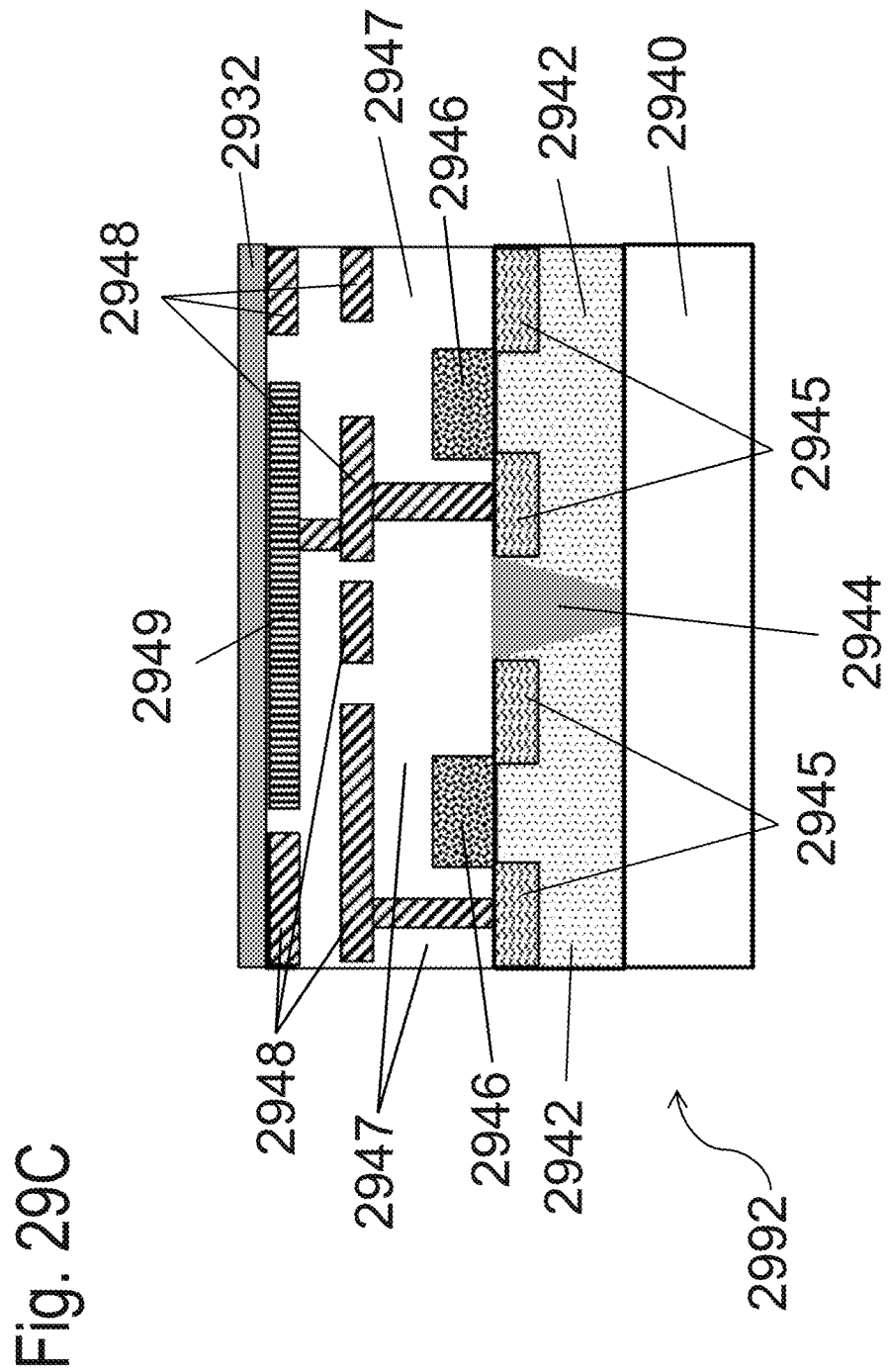

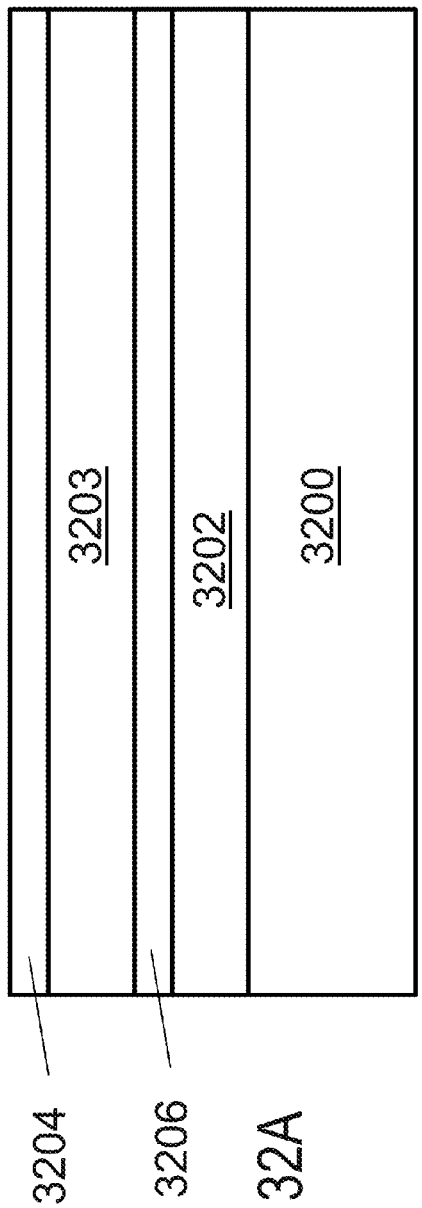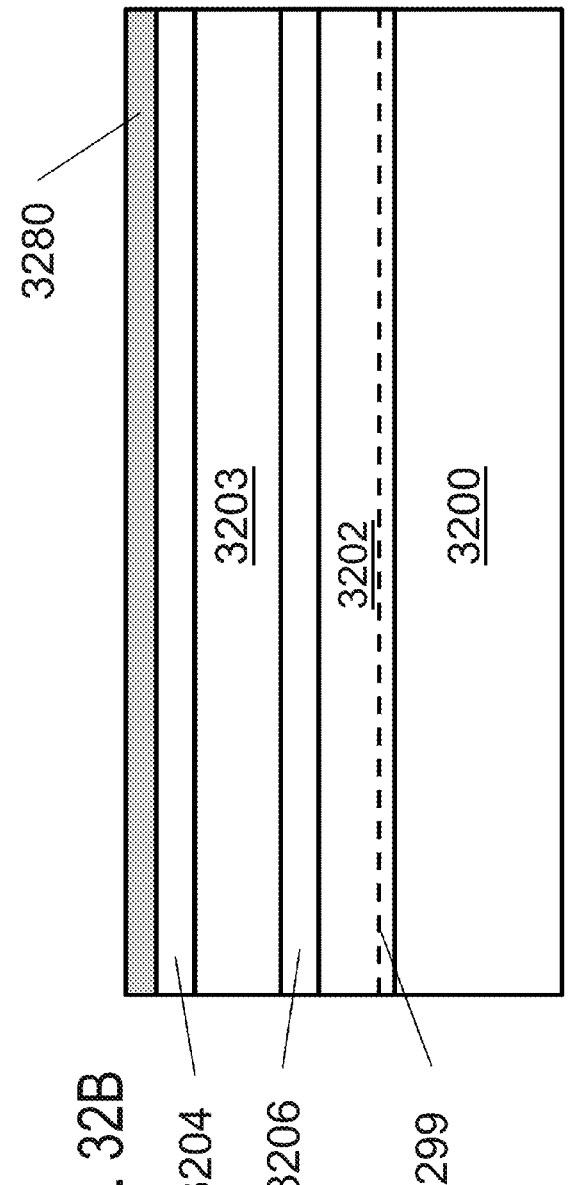

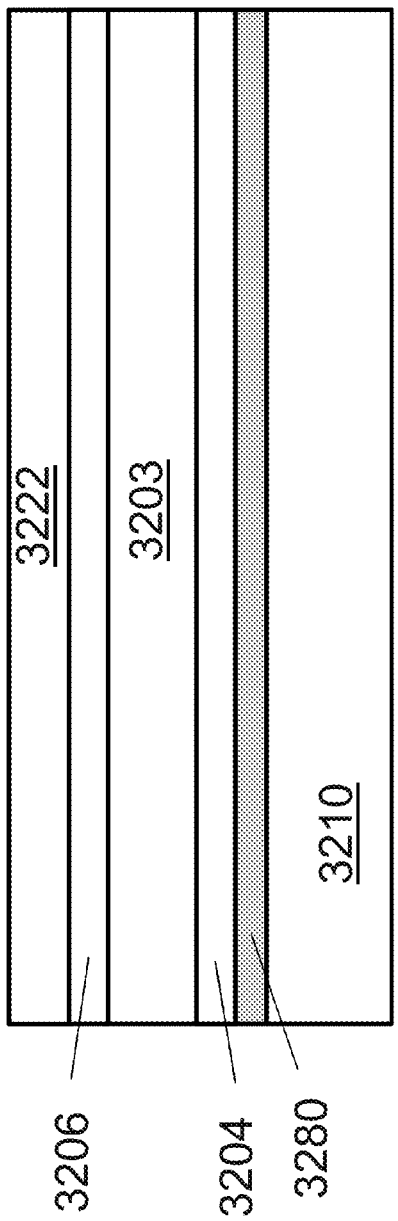
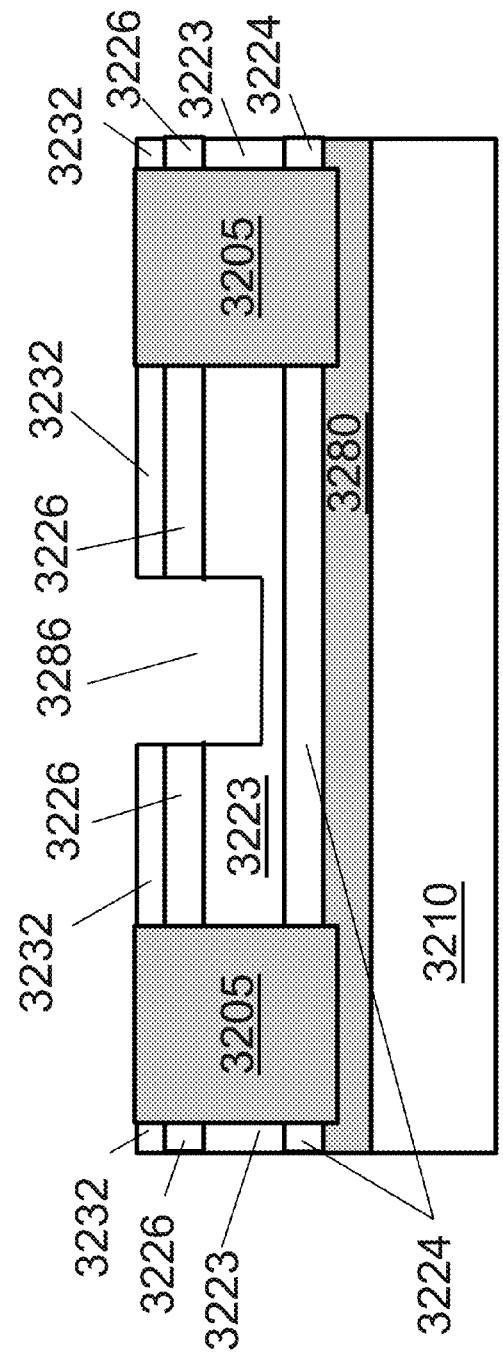

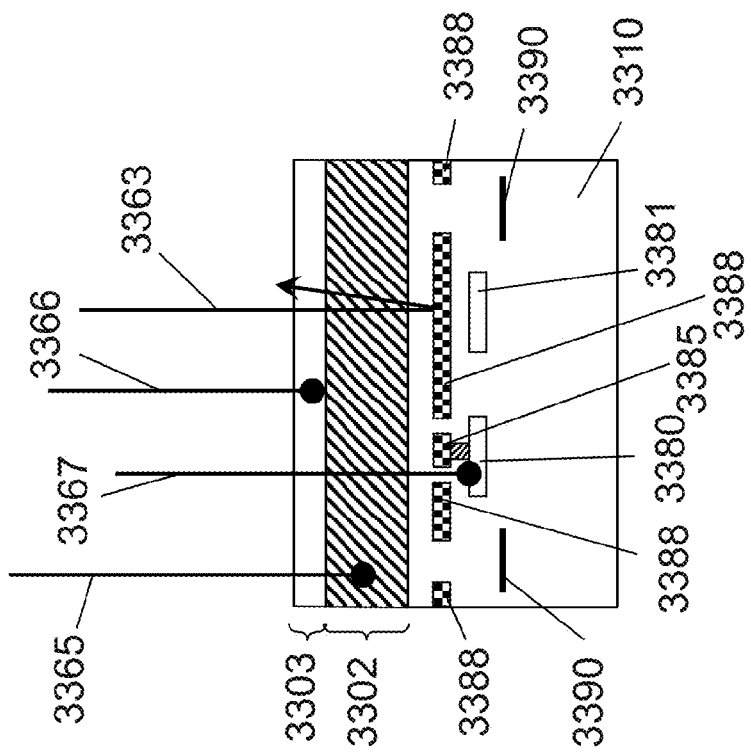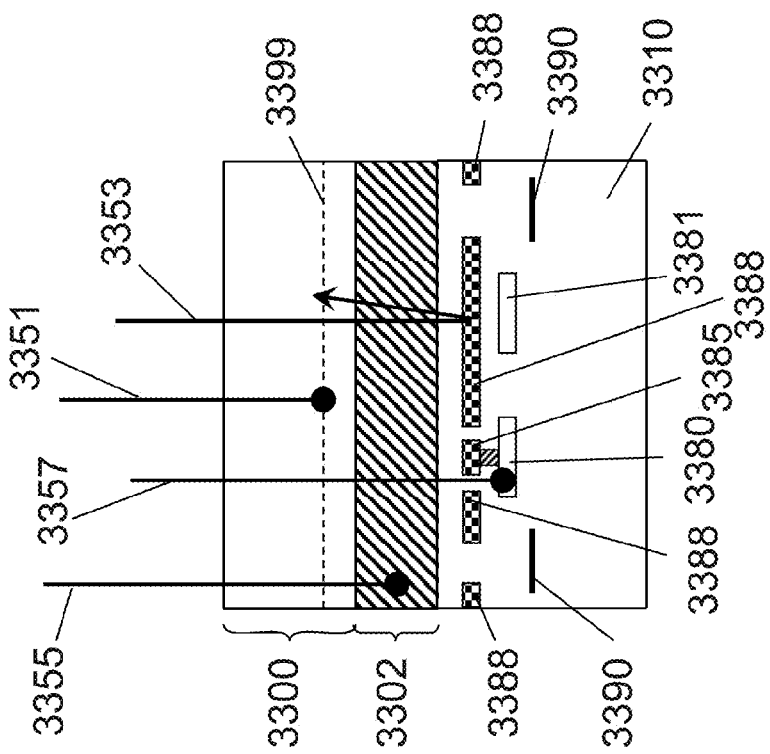
FIG. 33C
FIG. 33D

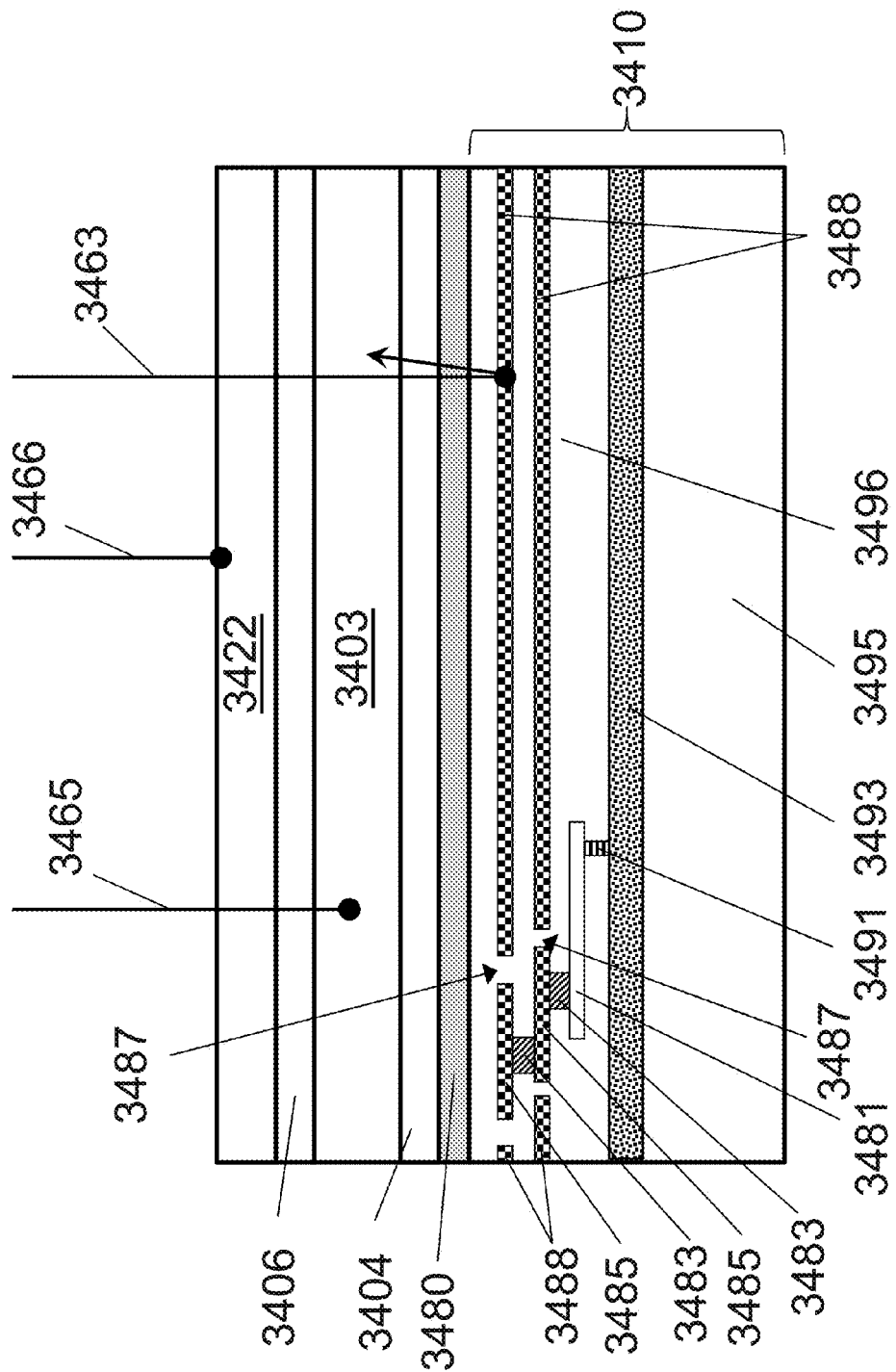

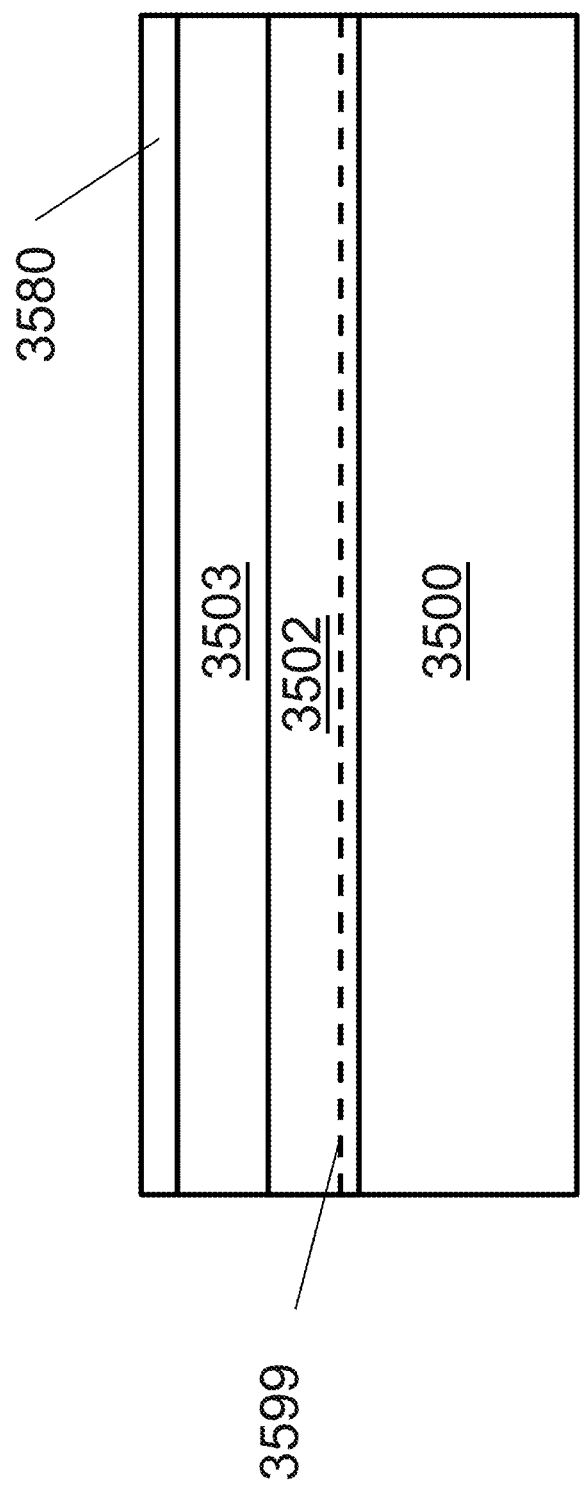

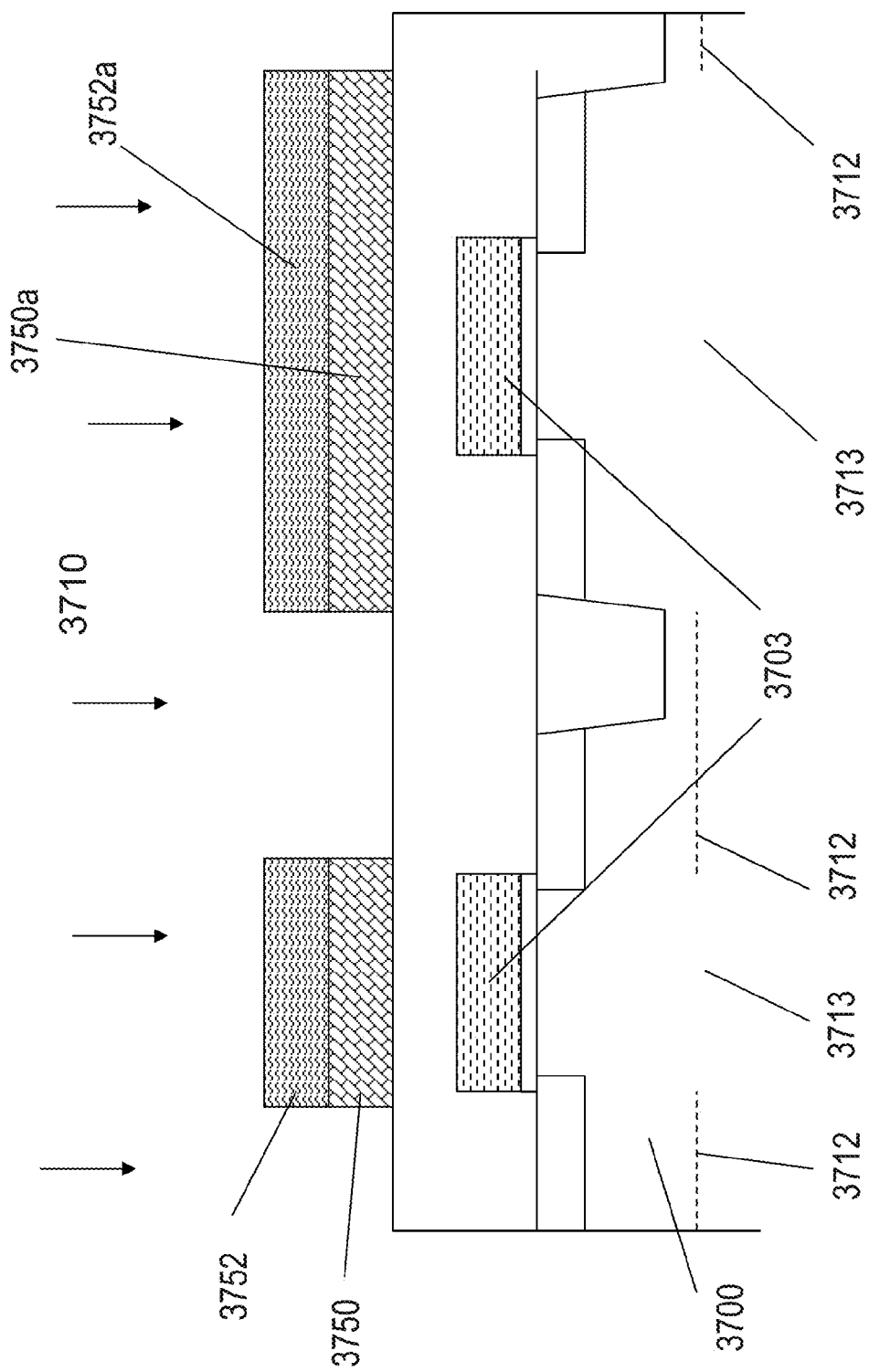

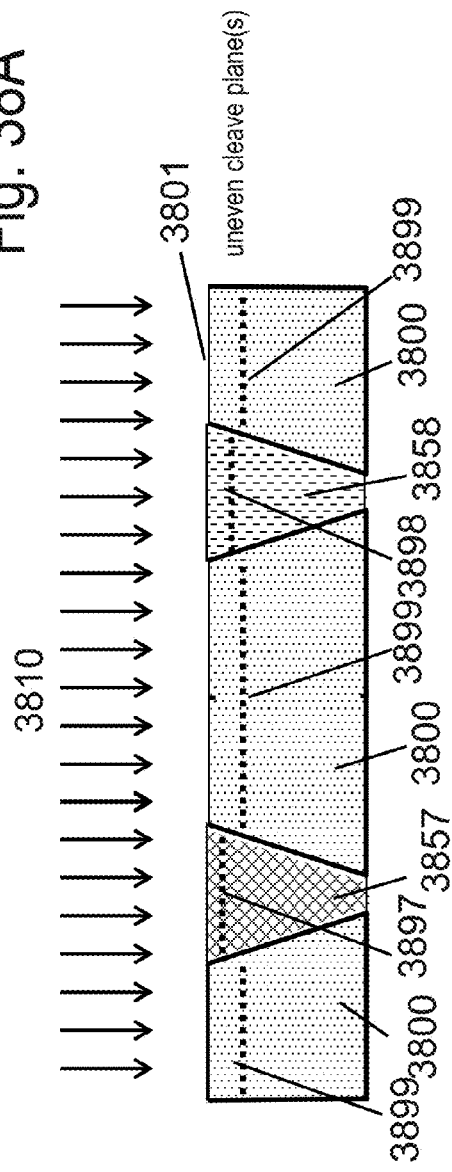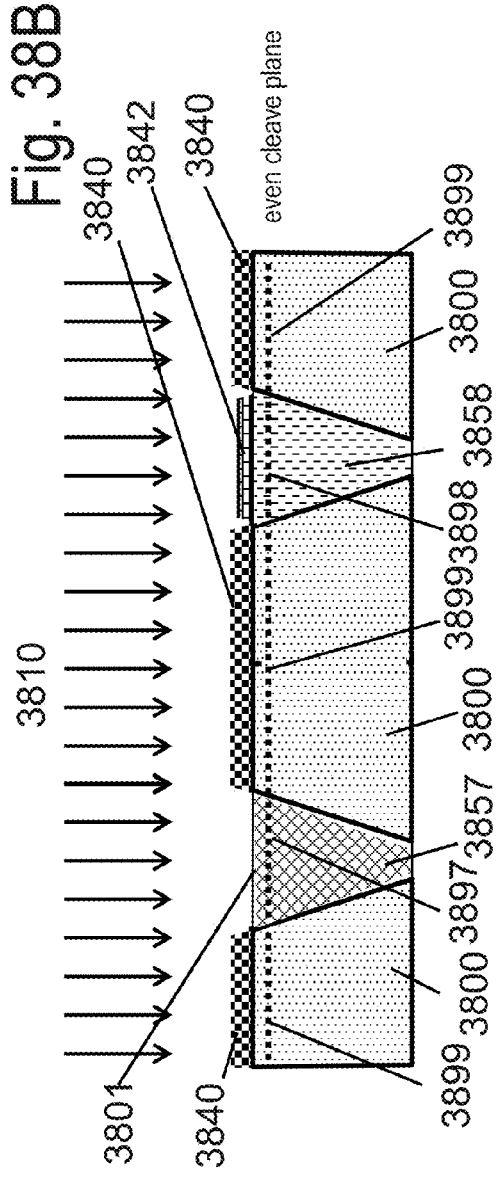

SEMICONDUCTOR DEVICE AND STRUCTURE FOR HEAT REMOVAL

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a device, including: a first layer of first transistors, overlaid by at least one interconnection layer, where the interconnection layer includes copper or aluminum; a second layer including second transistors, the second layer overlaying the interconnection layer, where the second layer is less than about 0.4 micron thick; and a connection path connecting the second transistors to the interconnection layer, where the connection path includes at least one through-layer via, and the through-layer via includes material whose co-efficient of thermal expansion is within about 50 percent of the second layer coefficient of thermal expansion.

In another aspect, a device, including: a first layer of first transistors, overlaid by at least one interconnection layer, where the interconnection layer includes copper or aluminum; and a second layer including second transistors, the second layer overlaying the interconnection layer, where the second layer is less than about 0.4 micron thick, and the interconnection layer includes a power grid to provide power to at least one of the second transistors.

In another aspect, a device, including: a first layer of first transistors, overlaid by at least one interconnection layer, where the interconnection layer includes copper or aluminum; a second layer including second transistors, the second layer overlaying the interconnection layer, where the second layer is less than about 0.4 micron thick; and a thermal connection to at least one of the second transistors, where the thermal connection is electrically isolated from at least one of the second transistors, and the thermal connection provides a thermally conductive path between at least one of the second transistors and the top or bottom surface of the device.

In another aspect, a device, including: a first layer of first transistors, overlaid by at least one interconnection layer, where the interconnection layer includes copper or aluminum; a second layer including second transistors, the second layer overlaying the interconnection layer, where the second layer is less than about 0.4 micron thick; and a plurality of thermally conducting paths from the second transistors to a heat sink, where at least one of the thermally conducting paths has a thermal conductivity of at least 100 W/m-K, and where the power delivery paths to at least one of the second transistors includes the thermally conducting paths.

BRIEF DESCRIPTION OF THE DRAWINGS

Various embodiments of the invention will be understood and appreciated more fully from the following detailed description, taken in conjunction with the drawings in which:

FIG. 15 is an exemplary drawing illustration of a transmission gate;

FIG. 16 is an exemplary drawing illustration of a transmission gate where substantially all parts of the logic cell can be within desirable temperature limits;

FIG. 17A-D is an exemplary process flow for constructing recessed channel transistors with thermal contacts;

FIG. 26A-F are exemplary drawing illustrations of a process flow for manufacturing junction-less recessed channel array transistors;

FIG. 27A-C are exemplary drawing illustrations of Silicon or Oxide—Compound Semiconductor hetero donor or acceptor substrates which may be formed by utilizing an engineered substrate;

FIG. 28A-B are exemplary drawing illustrations of Silicon or Oxide—Compound Semiconductor hetero donor or acceptor substrates which may be formed by epitaxial growth directly on a silicon or SOI substrate;

FIGS. 29A-H are exemplary drawing illustrations of a process flow to form a closely coupled but independently optimized silicon and compound semiconductor device stack;

FIGS. 32A-F are exemplary drawing illustrations of a process flow for manufacturing fully depleted Recessed Channel Array Transistors (FD-RCAT);

FIGS. 33A-F are exemplary drawing illustrations of the integration of a shield/heat sink layer in a 3D-IC;

FIGS. 34A-G are exemplary drawing illustrations of a process flow for manufacturing fully depleted Recessed Channel Array Transistors (FD-RCAT) with an integrated shield/heat sink layer;

FIG. 35 is an exemplary drawing illustration of the co-implantation ion-cut utilized in forming a 3D-IC;

FIG. 37 is an exemplary drawing illustration of an ion implant screen to protect transistor structures such as gate stacks and junctions;

FIGS. 38A-B are exemplary drawing illustrations of techniques to successfully ion-cut a silicon/compound-semiconductor hybrid substrate.

DETAILED DESCRIPTION

Figure 1:
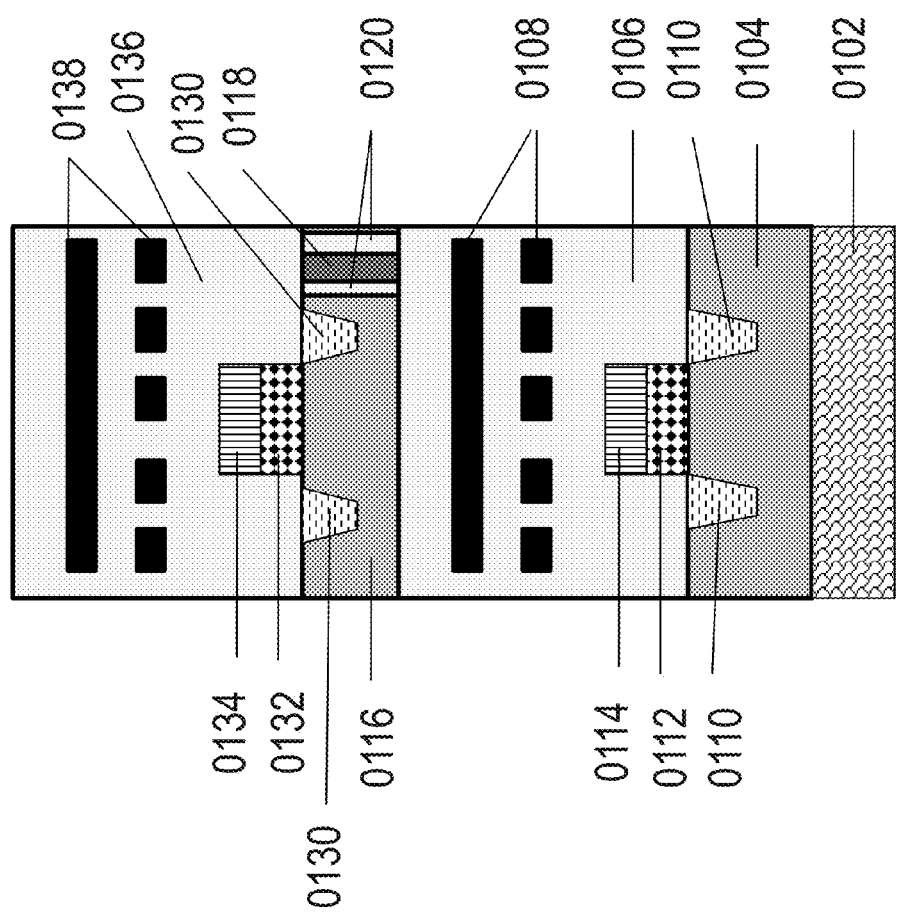
FIG. 1 is an exemplary drawing illustration of a 3D integrated circuit.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

FIG. 1 illustrates a 3D integrated circuit. Two crystalline layers, 0104 and 0116, which may include semiconductor materials such as, for example, mono-crystalline silicon, germanium, GaAs, InP, and graphene, are shown. For this illustration, mono-crystalline (single crystal) silicon may be used. Silicon layer 0116 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0104 may also be of thicknesses greater than 100 um, depending on, for example, the strength of bonding to heat removal apparatus 0102. Silicon layer 0104 may include transistors such as, for example, MOSFETS, FinFets, BJTs, HEMTs, HBTs, which may include gate electrode region 0114, gate dielectric region 0112, source and drain junction regions (not shown), and shallow trench isolation (STI) regions 0110. Silicon layer 0116 may include transistors such as, for example, MOSFETS, FinFets, BJTs, HEMTs, HBTs, which may include gate electrode region 0134, gate dielectric region 0132, source and drain junction regions (not shown), and shallow trench isolation (STI) regions 0130. A through-silicon via (TSV) 0118 could be present and may have an associated surrounding dielectric region 0120. Wiring layers 0108 for silicon layer 0104 and wiring dielectric regions 0106 may be present and may form an associated interconnect layer or layers. Wiring layers 0138 for silicon layer 0116 and wiring dielectric 0136 may be present and may form an associated interconnect layer or layers. Through-silicon via (TSV) 0118 may connect to wiring layers 0108 and wiring layers 0138 (not shown). The heat removal apparatus 0102 may include a heat spreader and/or a heat sink. The heat removal problem for the 3D integrated circuit shown in FIG. 1 is immediately apparent. The silicon layer 0116 is far away from the heat removal apparatus 0102, and it may be difficult to transfer heat among silicon layer 0116 and heat removal apparatus 0102. Furthermore, wiring dielectric regions 0106 may not conduct heat well, and this increases the thermal resistance among silicon layer 0116 and heat removal apparatus 0102. Silicon layer 0104 and silicon layer 0116 may be may be substantially absent of semiconductor dopants to form an undoped silicon region or layer, or doped, such as, for example, with elemental or compound species that form a p+, or p, or p−, or n+, or n, or n− silicon layer or region.

Figure 2:
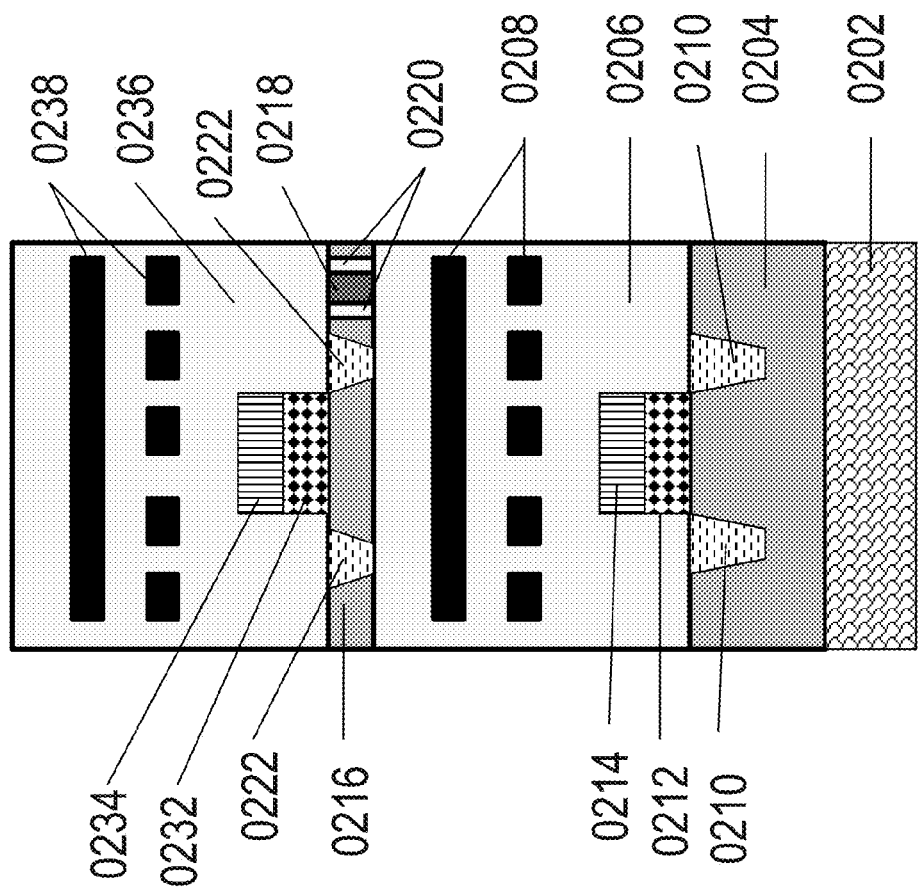
FIG. 2 is an exemplary drawing illustration of another 3D integrated circuit.

FIG. 2 illustrates an exemplary 3D integrated circuit that could be constructed, for example, using techniques described in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference. Two crystalline layers, 0204 and 0216, which may include semiconductor materials such as, for example, mono-crystalline silicon, germanium, GaAs, InP, and graphene, are shown. For this illustration, mono-crystalline (single crystal) silicon may be used. Silicon layer 0216 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0204 may also be of thicknesses greater than 100 um, depending on, for example, the strength of bonding to heat removal apparatus 0202. Silicon layer 0204 may include transistors such as, for example, MOSFETS, FinFets, BJTs, HEMTs, HBTs, which may include gate electrode region 0214, gate dielectric region 0212, source and drain junction regions (not shown for clarity) and shallow trench isolation (STI) regions 0210. Silicon layer 0216 may include transistors such as, for example, MOSFETS, FinFets, BJTs, HEMTs, HBTs, which may include gate electrode region 0234, gate dielectric region 0232, source and drain junction regions (not shown for clarity), and shallow trench isolation (STI) regions 0222. It can be observed that the STI regions 0222 can go right through to the bottom of silicon layer 0216 and provide good electrical isolation. This, however, may cause challenges for heat removal from the STI surrounded transistors since STI regions 0222 are typically composed of insulators that do not conduct heat well. Therefore, the heat spreading capabilities of silicon layer 0216 with STI regions 0222 are low. A through-layer via (TLV) 0218 may be present and may include an associated surrounding dielectric region 0220. Wiring layers 0208 for silicon layer 0204 and wiring dielectric regions 0206 may be present and may form an associated interconnect layer or layers. Wiring layers 0238 for silicon layer 0216 and wiring dielectric 0236 may be present and may form an associated interconnect layer or layers. Through-layer via (TLV) 0218 may connect to wiring layers 0208 and wiring layers 0238 (not shown). The heat removal apparatus 0202 may include a heat spreader and/or a heat sink. The heat removal problem for the 3D integrated circuit shown in FIG. 2 is immediately apparent. The silicon layer 0216 may be far away from the heat removal apparatus 0202, and it may be difficult to transfer heat among silicon layer 0216 and heat removal apparatus 0202. Furthermore, wiring dielectric regions 0206 may not conduct heat well, and this increases the thermal resistance among silicon layer 0216 and heat removal apparatus 0202. The heat removal challenge is further exacerbated by the poor heat spreading properties of silicon layer 0216 with STI regions 0222. Silicon layer 0204 and silicon layer 0216 may be may be substantially absent of semiconductor dopants to form an undoped silicon region or layer, or doped, such as, for example, with elemental or compound species that form a p+, or p, or p−, or n+, or n, or n− silicon layer or region.

Figure 3:
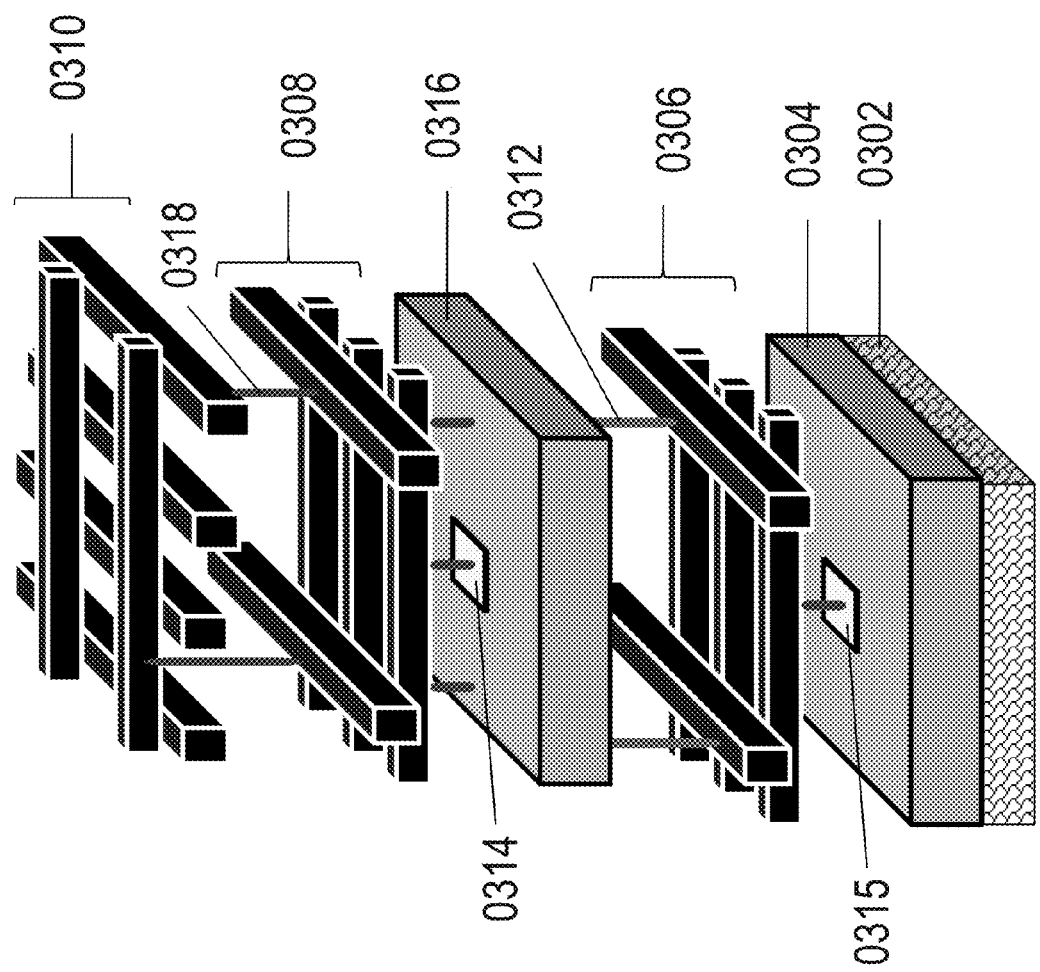
FIG. 3 is an exemplary drawing illustration of the power distribution network of a 3D integrated circuit.
Figure 4:
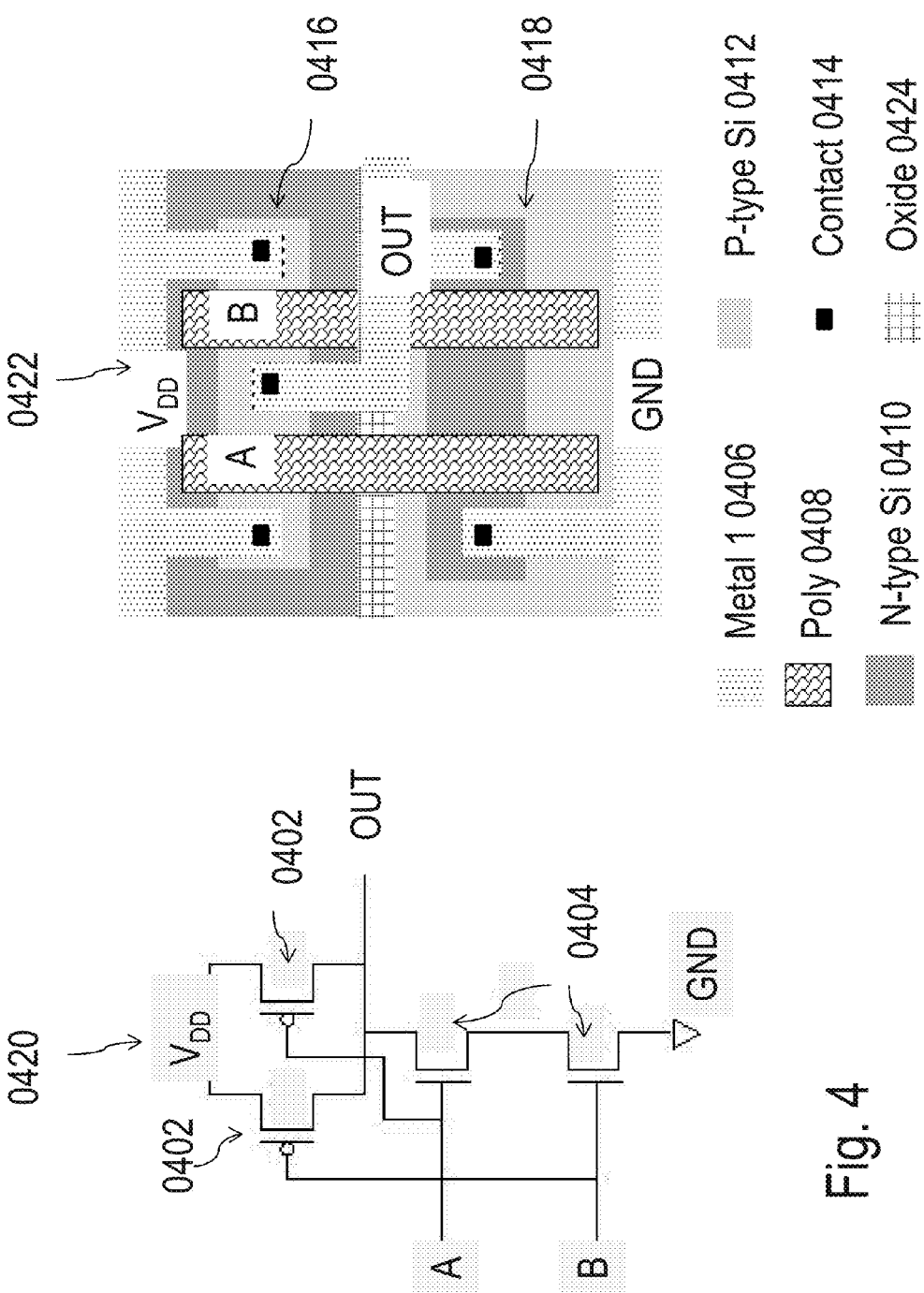
FIG. 4 is an exemplary drawing illustration of a NAND gate.

FIG. 3 and FIG. 4 illustrate how the power or ground distribution network of a 3D integrated circuit could assist heat removal. FIG. 3 illustrates an exemplary power distribution network or structure of the 3D integrated circuit. As shown in FIGS. 1 and 2, a 3D integrated circuit, could, for example, be constructed with two silicon layers, first silicon layer 0304 and second silicon layer 0316. The heat removal apparatus 0302 could include, for example, a heat spreader and/or a heat sink. The power distribution network or structure could consist of a global power grid 0310 that takes the supply voltage (denoted as $V_{DD}$) from the chip/circuit power pads and transfers $V_{DD}$ to second local power grid 0308 and first local power grid 0306, which transfers the supply voltage to logic/memory cells, transistors, and/or gates such as second transistor 0314 and first transistor 0315. Second layer vias 0318 and first layer vias 0312, such as the previously described TSV or TLV, could be used to transfer the supply voltage from the global power grid 0310 to second local power grid 0308 and first local power grid 0306. The global power grid 0310 may also be present among first silicon layer 0304 and second silicon layer 0316. The 3D integrated circuit could have a similarly designed and laid-out distribution networks, such as for ground and other supply voltages, as well. Typically, many contacts may be made among the supply and ground distribution networks and first silicon layer 0304. Due to this, there could exist a low thermal resistance among the power/ground distribution network and the heat removal apparatus 0302. Since power/ground distribution networks may be typically constructed of conductive metals and could have low effective electrical resistance, the power/ground distribution networks could have a low thermal resistance as well. Each logic/memory cell or gate on the 3D integrated circuit (such as, for example, second transistor 0314) is typically connected to $V_{DD}$ and ground, and therefore could have contacts to the power and ground distribution network. The contacts could help transfer heat efficiently (for example, with low thermal resistance) from each logic/memory cell or gate on the 3D integrated circuit (such as, for example, second transistor 0314) to the heat removal apparatus 0302 through the power/ground distribution network and the silicon layer 0304. Silicon layer 0304 and silicon layer 0316 may be may be substantially absent of semiconductor dopants to form an undoped silicon region or layer, or doped, such as, for example, with elemental or compound species that form a p+, or p, or p−, or n+, or n, or n− silicon layer or region.

FIG. 4 illustrates an exemplary NAND logic cell or NAND gate 0420 and how substantially all portions of this logic cell or gate could be designed and laid-out with low thermal resistance to the $V_{DD}$ or ground (GND) contacts. The NAND gate 0420 could include two pMOS transistors 0402 and two nMOS transistors 0404. The layout of the NAND gate 0420 is indicated in exemplary layout 0422. Various regions of the layout may include metal regions 0406, poly regions 0408, n type silicon regions 0410, p type silicon regions 0412, contact regions 0414, and oxide regions 0424. pMOS transistors 0416 and nMOS transistors 0418 may be present in the layout. It can be observed that substantially all parts of the exemplary NAND gate 0420 could have low thermal resistance to $V_{DD}$ or GND contacts since they may be physically very close to them, within a few design rule lambdas, wherein lamda is the basic minimum layout rule distance for a given set of circuit layout design rules. Thus, substantially all transistors in the NAND gate 0420 can be maintained at desirable temperatures, such as, for example, less than 25 or 50 or 70 degrees Centigrade, if the $V_{DD}$ or ground contacts are maintained at desirable temperatures.

While the previous paragraph described how an existing power distribution network or structure can transfer heat efficiently from logic/memory cells or gates in 3D-ICs to their heat sink, many techniques to enhance this heat transfer capability will be described herein. Many embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. The heat transfer capability enhancement techniques may be useful and applied to different methodologies and implementations of 3D-ICs, including monolithic 3D-ICs and TSV-based 3D-ICs.

Figure 5:
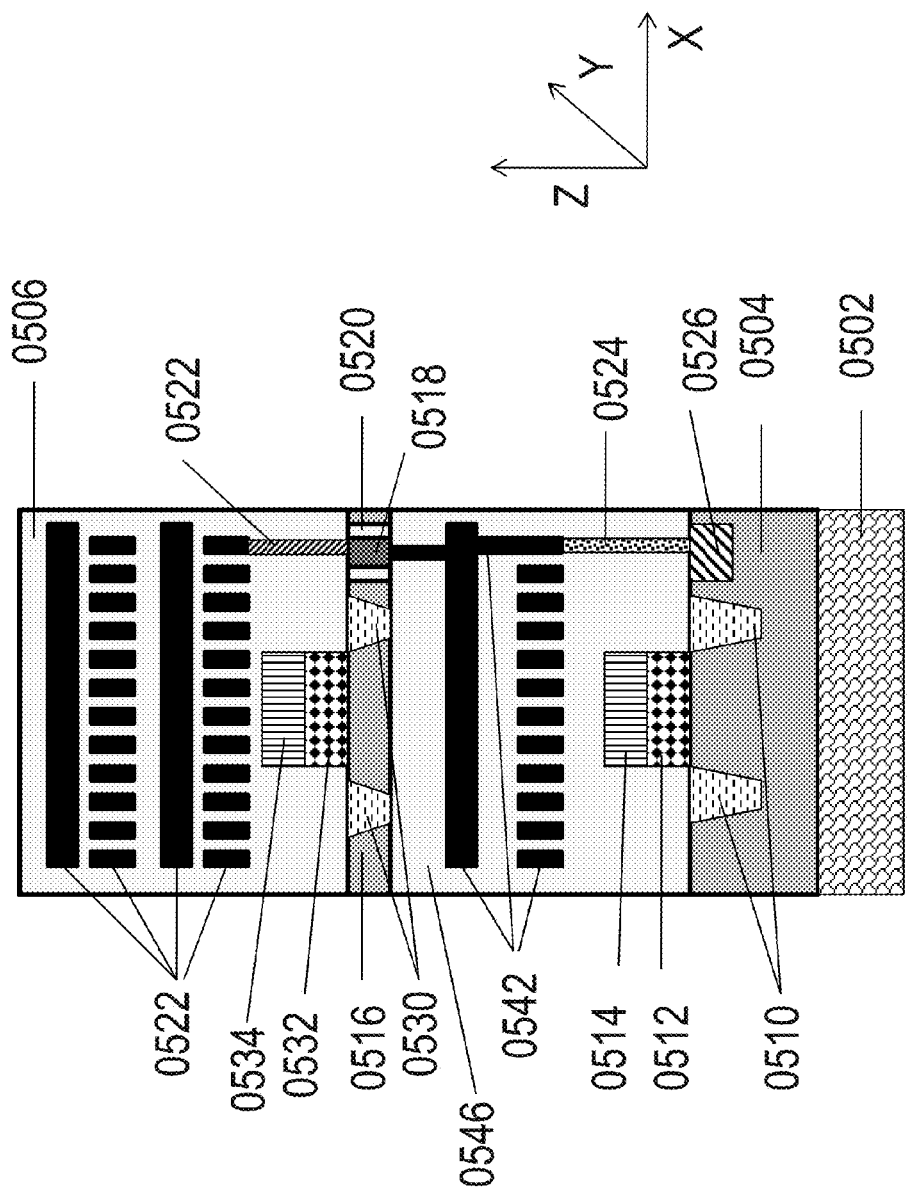
FIG. 5 is an exemplary drawing illustration of a thermal contact concept.

FIG. 5 illustrates an embodiment of the invention, wherein thermal contacts in a 3D-IC is described. The 3D-IC and associated power and ground distribution network may be formed as described in FIGS. 1, 2, 3, and 4 herein. For example, two crystalline layers, 0504 and 0516, which may include semiconductor materials such as, for example, mono-crystalline silicon, germanium, GaAs, InP, and graphene, may have transistors. For this illustration, mono-crystalline (single crystal) silicon may be used. Silicon layer 0516 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0504 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0504 may also be of thicknesses greater than 100 um, depending on, for example, the strength of bonding to heat removal apparatus 0202. Silicon layer 0504 may include transistors such as, for example, MOSFETS, FinFets, BJTs, HEMTs, HBTs, which may include STI regions 0510, gate dielectric regions 0512, gate electrode regions 0514 and several other regions that may be necessary for transistors such as source and drain junction regions (not shown for clarity). Silicon layer 0516 may include transistors such as, for example, MOSFETS, FinFets, BJTs, HEMTs, HBTs, which may include STI regions 0530, gate dielectric regions 0532, gate electrode regions 0534 and several other regions that may be necessary for transistors such as source and drain junction regions (not shown for clarity). Heat removal apparatus 0502 may include, for example, heat spreaders and/or heat sinks. In the example shown in FIG. 5, silicon layer 0504 is closer to the heat removal apparatus 0502 than other silicon layers such as silicon layer 0516. Wiring layers 0542 for silicon layer 0504 and wiring dielectric 0546 may be present and may form an associated interconnect layer or layers. Wiring layers 0522 for silicon layer 0516 and wiring dielectric 0506 may be present and may form an associated interconnect layer or layers. Through-layer vias (TLVs) 0518 for power delivery and interconnect and their associated dielectric regions 0520 are shown. Dielectric regions 0520 may include STI regions, such as STI regions 0530. A thermal contact 0524 may connect the local power distribution network or structure to the silicon layer 0504. The local power distribution network or structure may include wiring layers 0542 used for transistors in the silicon layer 0504. Thermal junction region 0526 can be, for example, a doped or undoped region of silicon, and further details of thermal junction region 0526 will be given in FIG. 6. The thermal contact 0524 can be suitably placed close to the corresponding through-layer via 0518; this helps transfer heat efficiently as a thermal conduction path from the through-layer via 0518 to thermal junction region 0526 and silicon layer 0504 and ultimately to the heat removal apparatus 0502. For example, the thermal contact 0524 could be located within approximately 2 um distance of the through-layer via 0518 in the X-Y plane (the through-layer via 0518 vertical length direction is considered the Z plane in FIG. 5). While the thermal contact 0524 is described above as being between the power distribution network or structure and the silicon layer closest to the heat removal apparatus, it could also be between the ground distribution network and the silicon layer closest to the heat sink. Furthermore, more than one thermal contact 0524 can be placed close to the through-layer via 0518. The thermal contacts can improve heat transfer from transistors located in higher layers of silicon such as silicon layer 0516 to the heat removal apparatus 0502. While mono-crystalline silicon has been mentioned as the transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may not be stacked in a vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. Silicon layer 0504 and silicon layer 0516 may be may be substantially absent of semiconductor dopants to form an undoped silicon region or layer, or doped, such as, for example, with elemental or compound species that form a p+, or p, or p−, or n+, or n, or n− silicon layer or region.

Figure 6:
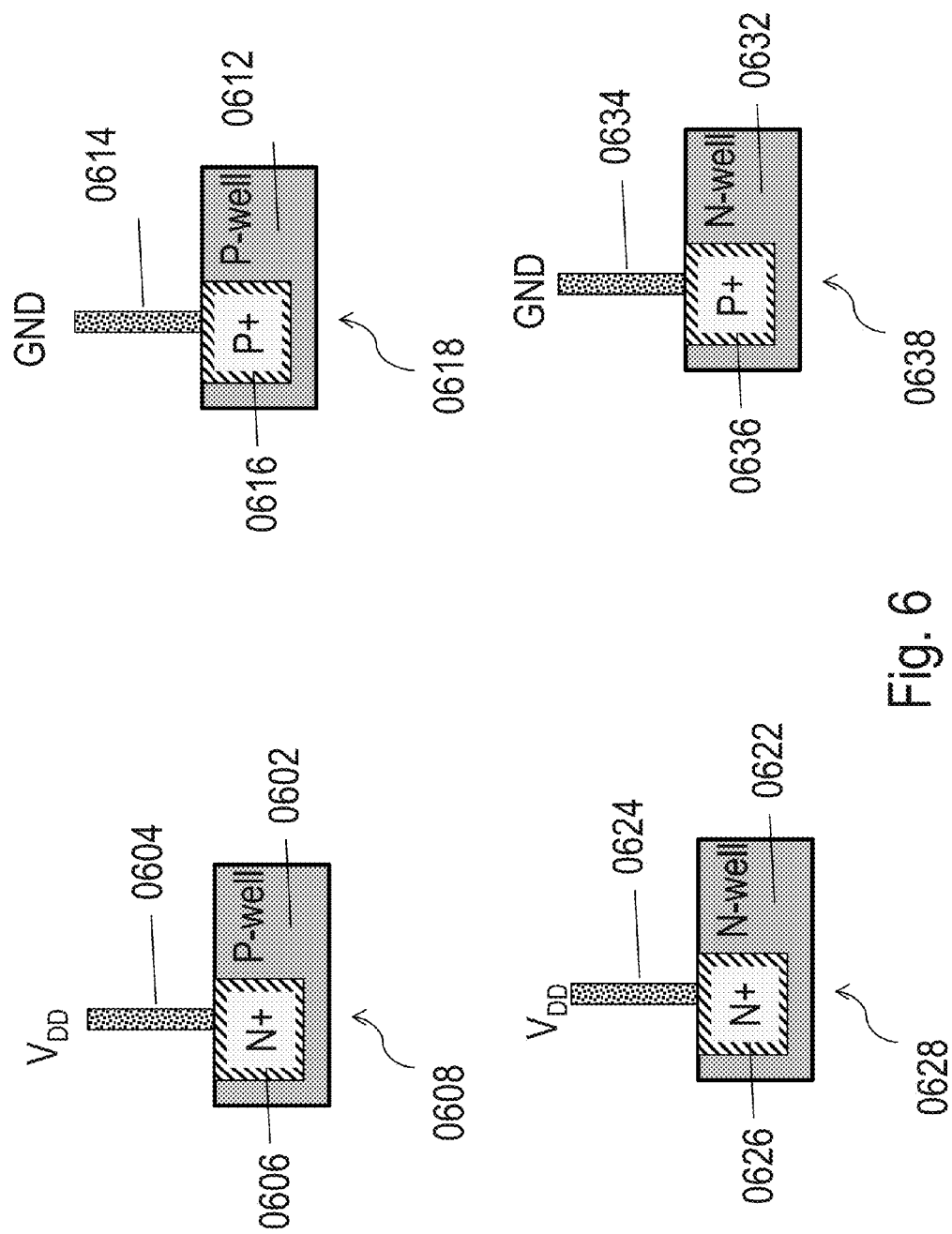
FIG. 6 is an exemplary drawing illustration of various types of thermal contacts.

FIG. 6 describes an embodiment of the invention, wherein various implementations of thermal junctions and associated thermal contacts are illustrated. P− wells in CMOS integrated circuits may be typically biased to ground and N-wells may be typically biased to the supply voltage $V_{DD}$. A thermal contact 0604 between the power ($V_{DD}$) distribution network and a P-well 0602 can be implemented as shown in N+ in P-well thermal junction and contact example 0608, where an n+ doped region thermal junction 0606 may be formed in the P-well region at the base of the thermal contact 0604. The n+ doped region thermal junction 0606 ensures a reverse biased p-n junction can be formed in N+ in P-well thermal junction and contact example 0608 and makes the thermal contact viable (for example, not highly conductive) from an electrical perspective. The thermal contact 0604 could be formed of a conductive material such as copper, aluminum or some other material with a thermal conductivity of at least 100 W/m-K. A thermal contact 0614 between the ground (GND) distribution network and a P-well 0612 can be implemented as shown in P+ in P-well thermal junction and contact example 0618, where a p+ doped region thermal junction 0616 may be formed in the P- well region at the base of the thermal contact 0614. The p+ doped region thermal junction 0616 makes the thermal contact viable (for example, not highly conductive) from an electrical perspective. The p+ doped region thermal junction 0616 and the P-well 0612 may typically be biased at ground potential. The thermal contact 0614 could be formed of a conductive material such as copper, aluminum or some other material with a thermal conductivity of at least 100 W/m-K. A thermal contact 0624 between the power ($V_{DD}$) distribution network and an N-well 0622 can be implemented as shown in N+ in N-well thermal junction and contact example 0628, wherein an n+ doped region thermal junction 0626 may be formed in the N-well region at the base of the thermal contact 0624. The n+ doped region thermal junction 0626 makes the thermal contact viable (for example, not highly conductive) from an electrical perspective. The n+ doped region thermal junction 0626 and the N-well 0622 may typically be biased at $V_{DD}$ potential. The thermal contact 0624 could be formed of a conductive material such as copper, aluminum or some other material with a thermal conductivity of at least 100 W/m-K. A thermal contact 0634 between the ground (GND) distribution network and an N-well 0632 can be implemented as shown in P+ in N-well thermal junction and contact example 0638, where a p+ doped region thermal junction 0636 may be formed in the N-well region at the base of the thermal contact 0634. The p+ doped region thermal junction 0636 makes the thermal contact viable (for example, not highly conductive) from an electrical perspective due to the reverse biased p-n junction formed in P+ in N-well thermal junction and contact example 0638. The thermal contact 0634 could be formed of a conductive material such as copper, aluminum or some other material with a thermal conductivity of at least 100 W/m-K. Note that the thermal contacts are designed to conduct negligible electricity, and the current flowing through them is several orders of magnitude lower than the current flowing through a transistor when it is switching. Therefore, the thermal contacts can be considered to be designed to conduct heat and conduct negligible (or no) electricity.

Figure 7:
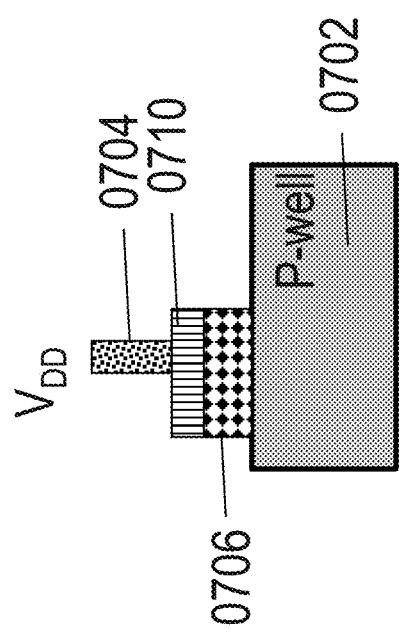
FIG. 7 is an exemplary drawing illustration of another type of thermal contact.

FIG. 7 describes an embodiment of the invention, wherein an additional type of thermal contact structure is illustrated. The embodiment shown in FIG. 7 could also function as a decoupling capacitor to mitigate power supply noise. It could consist of a thermal contact 0704, an electrode 0710, a dielectric 0706 and P-well 0702. The dielectric 0706 may be electrically insulating, and could be optimized to have high thermal conductivity. Dielectric 0706 could be formed of materials, such as, for example, hafnium oxide, silicon dioxide, other high k dielectrics, carbon, carbon based material, or various other dielectric materials with electrical conductivity below 1 nano-amp per square micron.

A thermal connection may be defined as the combination of a thermal contact and a thermal junction. The thermal connections illustrated in FIG. 6, FIG. 7 and other figures in this document are designed into a chip to remove heat, and are designed to not conduct electricity. Essentially, a semiconductor device comprising power distribution wires is described wherein some of said wires have a thermal connection designed to conduct heat to the semiconductor layer and the wires do not substantially conduct electricity through the thermal connection to the semiconductor layer.

Thermal contacts similar to those illustrated in FIG. 6 and FIG. 7 can be used in the white spaces of a design, for example, locations of a design where logic gates or other useful functionality may not be present. The thermal contacts may connect white-space silicon regions to power and/or ground distribution networks. Thermal resistance to the heat removal apparatus can be reduced with this approach. Connections among silicon regions and power/ground distribution networks can be used for various device layers in the 3D stack, and may not be restricted to the device layer closest to the heat removal apparatus. A Schottky contact or diode may also be utilized for a thermal contact and thermal junction. Moreover, thermal contacts and vias may not have to be stacked in a vertical line through multiple stacks, layers, strata of circuits.

Figure 8:
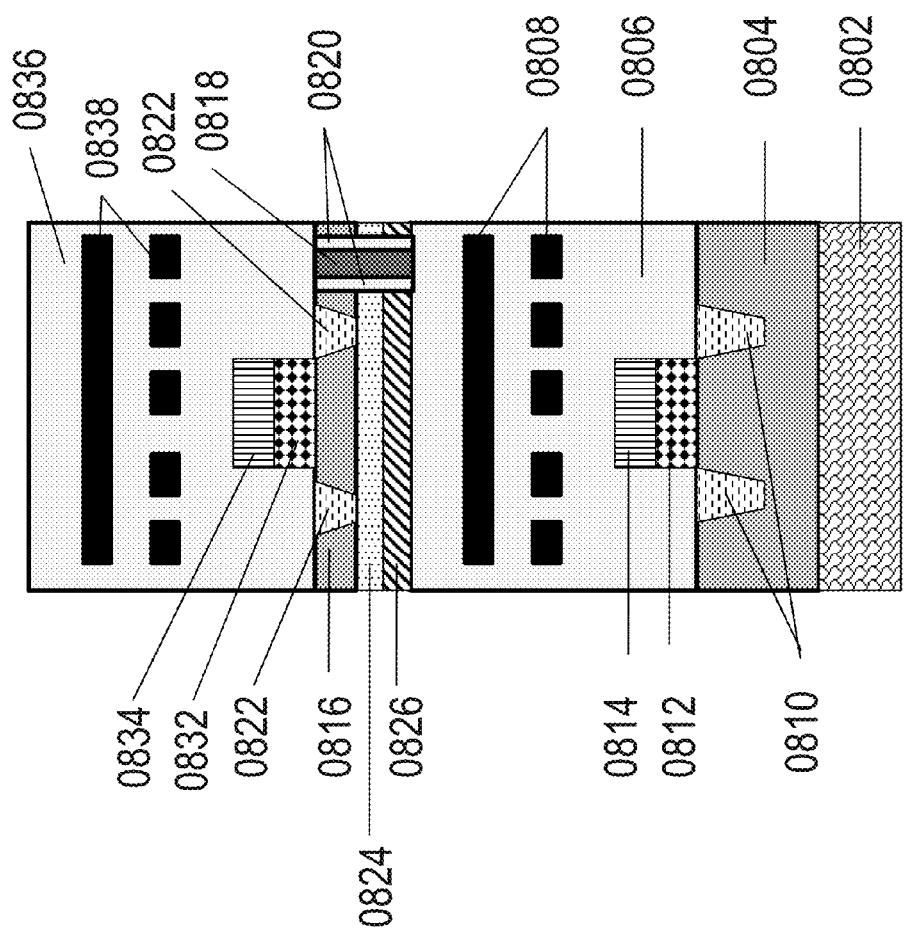
FIG. 8 is an exemplary drawing illustration of the use of heat spreaders in 3D stacked device layers.

FIG. 8 illustrates an embodiment of the invention, which can provide enhanced heat removal from 3D-ICs by integrating heat spreader regions in stacked device layers. The 3D-IC and associated power and ground distribution network may be formed as described in FIGS. 1, 2, 3, 4, and 5 herein. For example, two crystalline layers, 0804 and 0816, which may include semiconductor materials such as, for example, mono-crystalline silicon, germanium, GaAs, InP, and graphene, are shown. For this illustration, mono-crystalline (single crystal) silicon may be used. Silicon layer 0816 could be thinned from its original thickness, and its final thickness could be in the range of about 0.01 um to about 50 um, for example, 10 nm, 100 nm, 200 nm, 0.4 um, 1 um, 2 um or 5 um. Silicon layer 0804 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0804 may also be of thicknesses greater than 100 um, depending on, for example, the strength of bonding to heat removal apparatus 0802. Silicon layer 0804 may include transistors such as, for example, MOSFETS, FinFets, BJTs, HEMTs, HBTs, which may include gate electrode region 0814, gate dielectric region 0812, shallow trench isolation (STI) regions 0810 and several other regions that may be necessary for transistors such as source and drain junction regions (not shown for clarity). Silicon layer 0816 may include transistors such as, for example, MOSFETS, FinFets, BJTs, HEMTs, HBTs, which may include gate electrode region 0834, gate dielectric region 0832, shallow trench isolation (STI) regions 0822 and several other regions that may be necessary for transistors such as source and drain junction regions (not shown for clarity). A through-layer via (TLV) 0818 may be present and may include an associated surrounding dielectric region 0820. Wiring layers 0808 for silicon layer 0804 and wiring dielectric 0806 may be present and may form an associated interconnect layer or layers. Wiring layers 0838 for silicon layer 0816 and wiring dielectric 0836 may be present and may form an associated interconnect layer or layers. Through-layer via (TLV) 0818 may connect to wiring layers 0808 and wiring layers 0838 (not shown). The heat removal apparatus 0802 may include, for example, a heat spreader and/or a heat sink. It can be observed that the STI regions 0822 can go right through to the bottom of silicon layer 0816 and provide good electrical isolation. This, however, may cause challenges for heat removal from the STI surrounded transistors since STI regions 0822 are typically composed of insulators that do not conduct heat well. The buried oxide layer 0824 typically does not conduct heat well. To tackle heat removal issues with the structure shown in FIG. 8, a heat spreader 0826 may be integrated into the 3D stack. The heat spreader 0826 material may include, for example, copper, aluminum, graphene, diamond, carbon or any other material with a high thermal conductivity (defined as greater than 100 W/m-K). While the heat spreader concept for 3D-ICs is described with an architecture similar to FIG. 2, similar heat spreader concepts could be used for architectures similar to FIG. 1, and also for other 3D IC architectures. Silicon layer 0804 and silicon layer 0816 may be may be substantially absent of semiconductor dopants to form an undoped silicon region or layer, or doped, such as, for example, with elemental or compound species that form a p+, or p, or p−, or n+, or n, or n− silicon layer or region.

Figure 9:
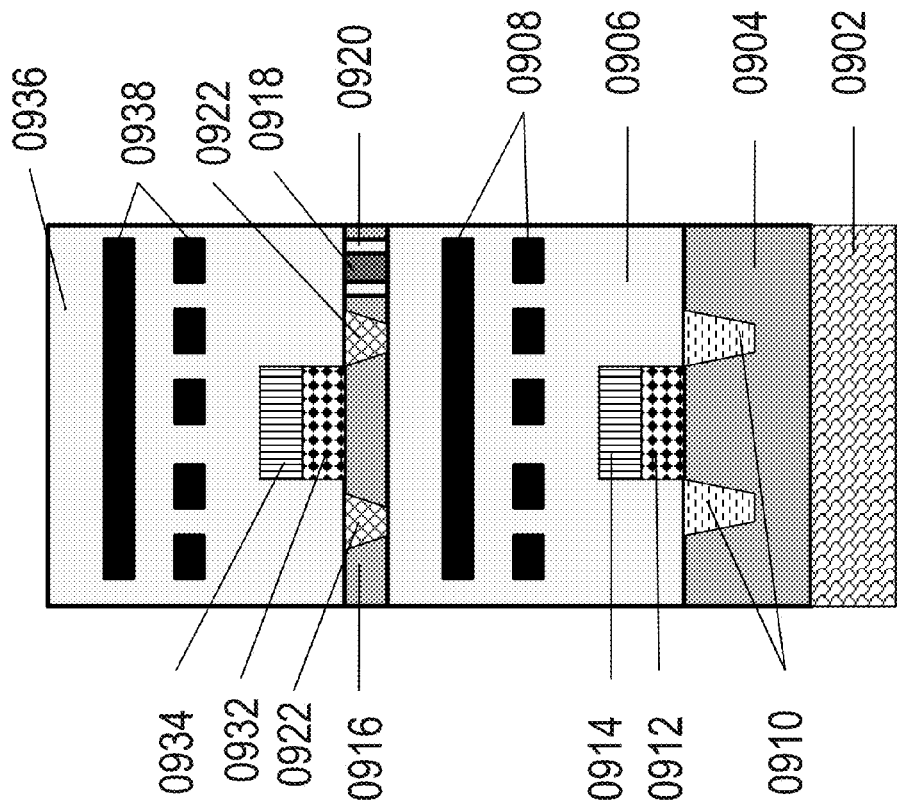
FIG. 9 is an exemplary drawing illustration of the use of thermally conductive shallow trench isolation (STI) in 3D stacked device layers.

FIG. 9 illustrates an embodiment of the invention, which can provide enhanced heat removal from 3D-ICs by using thermally conductive shallow trench isolation (STI) regions in stacked device layers. The 3D-IC and associated power and ground distribution network may be formed as described in FIGS. 1, 2, 3, 4, 5 and 8 herein. For example, two crystalline layers, 0904 and 0916, which may include semiconductor materials such as, for example, mono-crystalline silicon, germanium, GaAs, InP, and graphene, are shown. For this illustration, mono-crystalline (single crystal) silicon may be used. Silicon layer 0916 could be thinned from its original thickness, and its final thickness could be in the range of about 0.01 um to about 50 um, for example, 10 nm, 100 nm, 200 nm, 0.4 um, 1 um, 2 um or 5 um. Silicon layer 0904 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0904 may also be of thicknesses greater than 100 um, depending on, for example, the strength of bonding to heat removal apparatus 0802. Silicon layer 0904 may include transistors such as, for example, MOSFETS, FinFets, BJTs, HEMTs, HBTs, which may include gate electrode region 0914, gate dielectric region 0912, shallow trench isolation (STI) regions 0910 and several other regions that may be necessary for transistors such as source and drain junction regions (not shown for clarity). Silicon layer 0916 may include transistors such as, for example, MOSFETS, FinFets, BJTs, HEMTs, HBTs, which may include gate electrode region 0934, gate dielectric region 0932, shallow trench isolation (STI) regions 0922 and several other regions that may be necessary for transistors such as source and drain junction regions (not shown for clarity). A through-layer via (TLV) 0918 may be present and may include an associated surrounding dielectric region 0920. Dielectric region 0920 may include a shallow trench isolation region. Wiring layers 0908 for silicon layer 0904 and wiring dielectric 0906 may be present and may form an associated interconnect layer or layers. Wiring layers 0938 for silicon layer 0916 and wiring dielectric 0936 may be present and may form an associated interconnect layer or layers. Through-layer via (TLV) 0918 may connect to wiring layers 0908 and wiring layers 0938 (not shown). The heat removal apparatus 0902 may include a heat spreader and/or a heat sink. It can be observed that the STI regions 0922 can go right through to the bottom of silicon layer 0916 and provide good electrical isolation. This, however, may cause challenges for heat removal from the STI surrounded transistors since STI regions 0922 are typically composed of insulators such as silicon dioxide that do not conduct heat well. To tackle possible heat removal issues with the structure shown in FIG. 9, the STI regions 0922 in stacked silicon layers such as silicon layer 0916 could be formed substantially of thermally conductive dielectrics including, for example, diamond, carbon, or other dielectrics that have a thermal conductivity higher than silicon dioxide and/or have a thermal conductivity higher than 0.6 W/m-K. This structure can provide enhanced heat spreading in stacked device layers. Thermally conductive STI dielectric regions could be used in the vicinity of the transistors in stacked 3D device layers and may also be utilized as the dielectric that surrounds TLV 0918, such as dielectric region 0920. While the thermally conductive shallow trench isolation (STI) regions concept for 3D-ICs is described with an architecture similar to FIG. 2, similar thermally conductive shallow trench isolation (STI) regions concepts could be used for architectures similar to FIG. 1, and also for other 3D IC architectures and 2D IC as well. Silicon layer 0904 and silicon layer 0916 may be may be substantially absent of semiconductor dopants to form an undoped silicon region or layer, or doped, such as, for example, with elemental or compound species that form a p+, or p, or p−, or n+, or n, or n− silicon layer or region.

Figure 10:
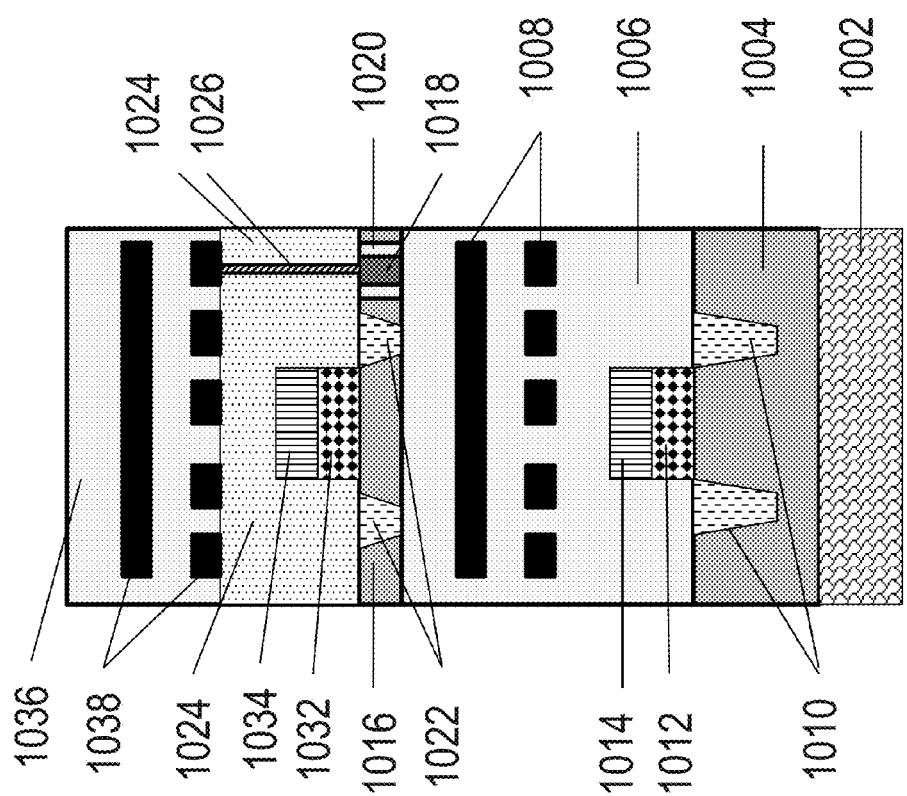
FIG. 10 is an exemplary drawing illustration of the use of thermally conductive pre-metal dielectric regions in 3D stacked device layers.

FIG. 10 illustrates an embodiment of the invention, which can provide enhanced heat removal from 3D-ICs using thermally conductive pre-metal dielectric regions in stacked device layers. The 3D-IC and associated power and ground distribution network may be formed as described in FIGS. 1, 2, 3, 4, 5, 8 and 9 herein. For example, two crystalline layers, 1004 and 1016, which may include semiconductor materials such as, for example, mono-crystalline silicon, germanium, GaAs, InP, and graphene, are shown. For this illustration, mono-crystalline (single crystal) silicon may be used. Silicon layer 1016 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1004 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1004 may also be of thicknesses greater than 100 um, depending on, for example, the strength of bonding to heat removal apparatus 1002. Silicon layer 1004 may include transistors such as, for example, MOSFETS, FinFets, BJTs, HEMTs, HBTs, which may include gate electrode region 1014, gate dielectric region 1012, shallow trench isolation (STI) regions 1010 and several other regions that may be necessary for transistors such as source and drain junction regions (not shown for clarity). Silicon layer 1016 may include transistors such as, for example, MOSFETS, FinFets, BJTs, HEMTs, HBTs, which may include gate electrode region 1034, gate dielectric region 1032, shallow trench isolation (STI) regions 1022 and several other regions that may be necessary for transistors such as source and drain junction regions (not shown for clarity). A through-layer via (TLV) 1018 may be present and may include an associated surrounding dielectric region 1020, which may include an STI region. Wiring layers 1008 for silicon layer 1004 and wiring dielectric 1006 may be present and may form an associated interconnect layer or layers. Wiring layers 1038 for silicon layer 1016 and wiring dielectric 1036 may be present and may form an associated interconnect layer or layers. Through-layer via (TLV) 1018 may connect to wiring layers 1008 (not shown). The heat removal apparatus 1002 may include, for example, a heat spreader and/or a heat sink. It can be observed that the STI regions 1022 can go right through to the bottom of silicon layer 1016 and provide good electrical isolation. This, however, can cause challenges for heat removal from the STI surrounded transistors since STI regions 1022 are typically filled with insulators such as silicon dioxide that do not conduct heat well. To tackle this issue, the inter-layer dielectrics (ILD) 1024 for contact region 1026 could be constructed substantially with a thermally conductive material, such as, for example, insulating carbon, diamond, diamond like carbon (DLC), and various other materials that provide better thermal conductivity than silicon dioxide or have a thermal conductivity higher than 0.6 W/m-K. Thermally conductive pre-metal dielectric regions could be used around some of the transistors in stacked 3D device layers. While the thermally conductive pre-metal dielectric regions concept for 3D-ICs is described with an architecture similar to FIG. 2, similar thermally conductive pre-metal dielectric region concepts could be used for architectures similar to FIG. 1, and also for other 3D IC architectures and 2D IC as well. Silicon layer 1004 and silicon layer 1016 may be may be substantially absent of semiconductor dopants to form an undoped silicon region or layer, or doped, such as, for example, with elemental or compound species that form a p+, or p, or p−, or n+, or n, or n− silicon layer or region.

Figure 11:
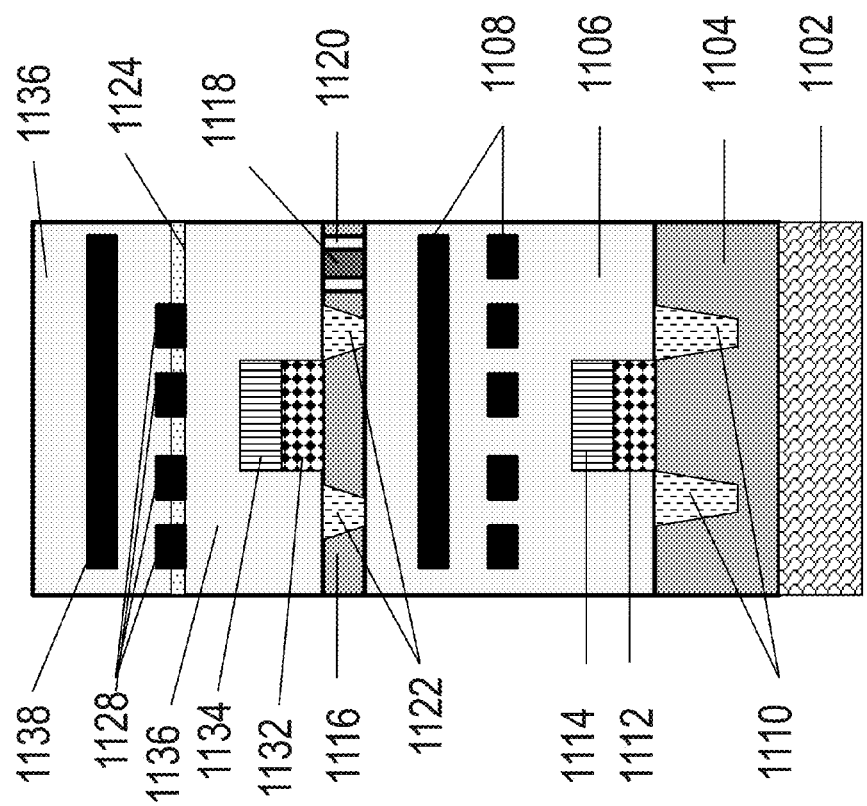
FIG. 11 is an exemplary drawing illustration of the use of thermally conductive etch stop layers for the first metal layer of 3D stacked device layers.

FIG. 11 describes an embodiment of the invention, which can provide enhanced heat removal from 3D-ICs using thermally conductive etch stop layers or regions for the first metal level of stacked device layers. The 3D-IC and associated power and ground distribution network may be formed as described in FIGS. 1, 2, 3, 4, 5, 8, 9 and 10 herein. For example, two crystalline layers, 1104 and 1116, which may include semiconductor materials such as, for example, mono-crystalline silicon, germanium, GaAs, InP, and graphene, are shown. For this illustration, mono-crystalline (single crystal) silicon may be used. Silicon layer 1116 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1104 may also be of thicknesses greater than 100 um, depending on, for example, the strength of bonding to heat removal apparatus 1102. Silicon layer 1104 may include transistors such as, for example, MOSFETS, FinFets, BJTs, HEMTs, HBTs, which may include gate electrode region 1114, gate dielectric region 1112, shallow trench isolation (STI) regions 1110 and several other regions that may be necessary for transistors such as source and drain junction regions (not shown for clarity). Silicon layer 1116 may include transistors such as, for example, MOSFETS, FinFets, BJTs, HEMTs, HBTs, which may include gate electrode region 1134, gate dielectric region 1132, shallow trench isolation (STI) regions 1122 and several other regions that may be necessary for transistors such as source and drain junction regions (not shown for clarity). A through-layer via (TLV) 1118 may be present and may include an associated surrounding dielectric region 1120. Wiring layers 1108 for silicon layer 1104 and wiring dielectric 1106 may be present and may form an associated interconnect layer or layers. Wiring layers for silicon layer 1116 may include first metal layer 1128 and other metal layers 1138 and wiring dielectric 1136 and may form an associated interconnect layer or layers. The heat removal apparatus 1102 may include, for example, a heat spreader and/or a heat sink. It can be observed that the STI regions 1122 can go right through to the bottom of silicon layer 1116 and provide good electrical isolation. This, however, can cause challenges for heat removal from the STI surrounded transistors since STI regions 1122 are typically filled with insulators such as silicon dioxide that do not conduct heat well. To tackle this issue, etch stop layer 1124 as part of the process of constructing the first metal layer 1128 of silicon layer 1116 can be substantially constructed out of a thermally conductive but electrically isolative material. Examples of such thermally conductive materials could include insulating carbon, diamond, diamond like carbon (DLC), and various other materials that provide better thermal conductivity than silicon dioxide and silicon nitride, and/or have thermal conductivity higher than 0.6 W/m-K. Thermally conductive etch-stop layer dielectric regions could be used for the first metal layer above transistors in stacked 3D device layers. While the thermally conductive etch stop layers or regions concept for 3D-ICs is described with an architecture similar to FIG. 2, similar thermally conductive etch stop layers or regions concepts could be used for architectures similar to FIG. 1, and also for other 3D IC architectures and 2D IC as well. Silicon layer 1104 and silicon layer 1116 may be may be substantially absent of semiconductor dopants to form an undoped silicon region or layer, or doped, such as, for example, with elemental or compound species that form a p+, or p, or p−, or n+, or n, or n− silicon layer or region.

Figure 12A:
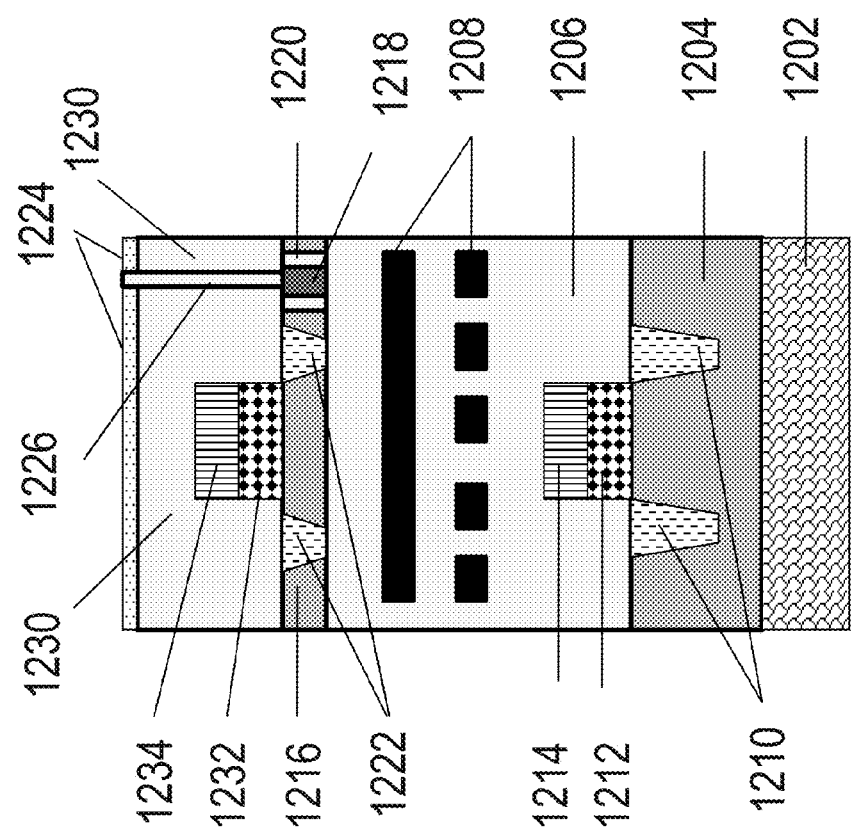
FIG. 12A-B are exemplary drawing illustrations of the use and retention of thermally conductive hard mask layers for patterning contact layers of 3D stacked device layers.
Figure 12B:
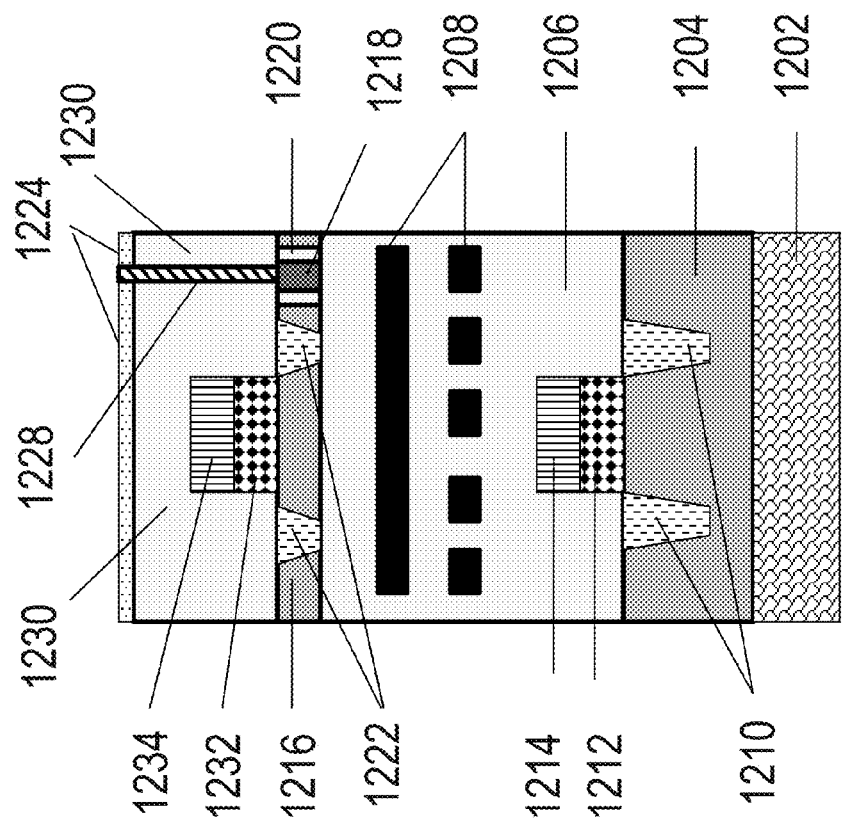

FIG. 12A-B describes an embodiment of the invention, which can provide enhanced heat removal from 3D-ICs using thermally conductive layers or regions as part of pre-metal dielectrics for stacked device layers. The 3D-IC and associated power and ground distribution network may be formed as described in FIGS. 1, 2, 3, 4, 5, 8, 9, 10 and 11 herein. For example, two crystalline layers, 1204 and 1216, are shown and may have transistors. For this illustration, mono-crystalline (single crystal) silicon may be used. Silicon layer 1216 could be thinned from its original thickness, and its final thickness could be in the range of about 0.01 um to about 50 um, for example, 10 nm, 100 nm, 200 nm, 0.4 um, 1 um, 2 um or 5 um. Silicon layer 1204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 1204 may also be of thicknesses greater than 100 um, depending on, for example, the strength of bonding to heat removal apparatus 1202. Silicon layer 1204 may include transistors such as, for example, MOSFETS, FinFets, BJTs, HEMTs, HBTs, which may include gate electrode region 1214, gate dielectric region 1212, shallow trench isolation (STI) regions 1210 and several other regions that may be necessary for transistors such as source and drain junction regions (not shown for clarity). Silicon layer 1216 may include transistors such as, for example, MOSFETS, FinFets, BJTs, HEMTs, HBTs, which may include gate electrode region 1234, gate dielectric region 1232, shallow trench isolation (STI) regions 1222 and several other regions that may be necessary for transistors such as source and drain junction regions (not shown for clarity). A through-layer via (TLV) 1218 may be present and may include an associated surrounding dielectric region 1220. Wiring layers 1208 for silicon layer 1204 and wiring dielectric 1206 may be present and may form an associated interconnect layer or layers. Through-layer via (TLV) 1218 may connect to wiring layers 1208 and future wiring layers such as those for interconnection of silicon layer 1216 transistors (not shown). The heat removal apparatus 1202 may include a heat spreader and/or a heat sink. It can be observed that the STI regions 1222 can go right through to the bottom of silicon layer 1216 and provide good electrical isolation. This, however, can cause challenges for heat removal from the STI surrounded transistors since STI regions 1222 are typically filled with insulators such as silicon dioxide that do not conduct heat well. To tackle this issue, a technique is described in FIG. 12A-B. FIG. 12A illustrates the formation of openings for making contacts to the transistors of silicon layer 1216. A hard mask layer 1224 or region is typically used during the lithography step for contact formation and hard mask layer 1224 or region may be utilized to define contact opening regions 1226 of the pre-metal dielectric 1230 that is etched away. FIG. 12B illustrates the contact 1228 formed after metal is filled into the contact opening regions 1226 shown in FIG. 12A, and after a chemical mechanical polish (CMP) process. The hard mask layer 1224 or region used for the process shown in FIG. 12A-B may include a thermally conductive but electrically isolative material. Examples of such thermally conductive materials could include insulating carbon, diamond, diamond like carbon (DLC), and various other materials that provide better thermal conductivity than silicon dioxide and silicon nitride, and/or have thermal conductivity higher than 0.6 W/m-K and can be left behind after the process step shown in FIG. 12B (hence, electrically non-conductive). Further steps for forming the 3D-IC (such as forming additional metal layers) may be performed (not shown). While the thermally conductive materials for hard mask concept for 3D-ICs is described with an architecture similar to FIG. 2, similar thermally conductive materials for hard mask concepts could be used for architectures similar to FIG. 1, and also for other 3D IC architectures and 2D IC as well. Silicon layer 1204 and silicon layer 1216 may be may be substantially absent of semiconductor dopants to form an undoped silicon region or layer, or doped, such as, for example, with elemental or compound species that form a p+, or p, or p−, or n+, or n, or n− silicon layer or region.

Figure 13:
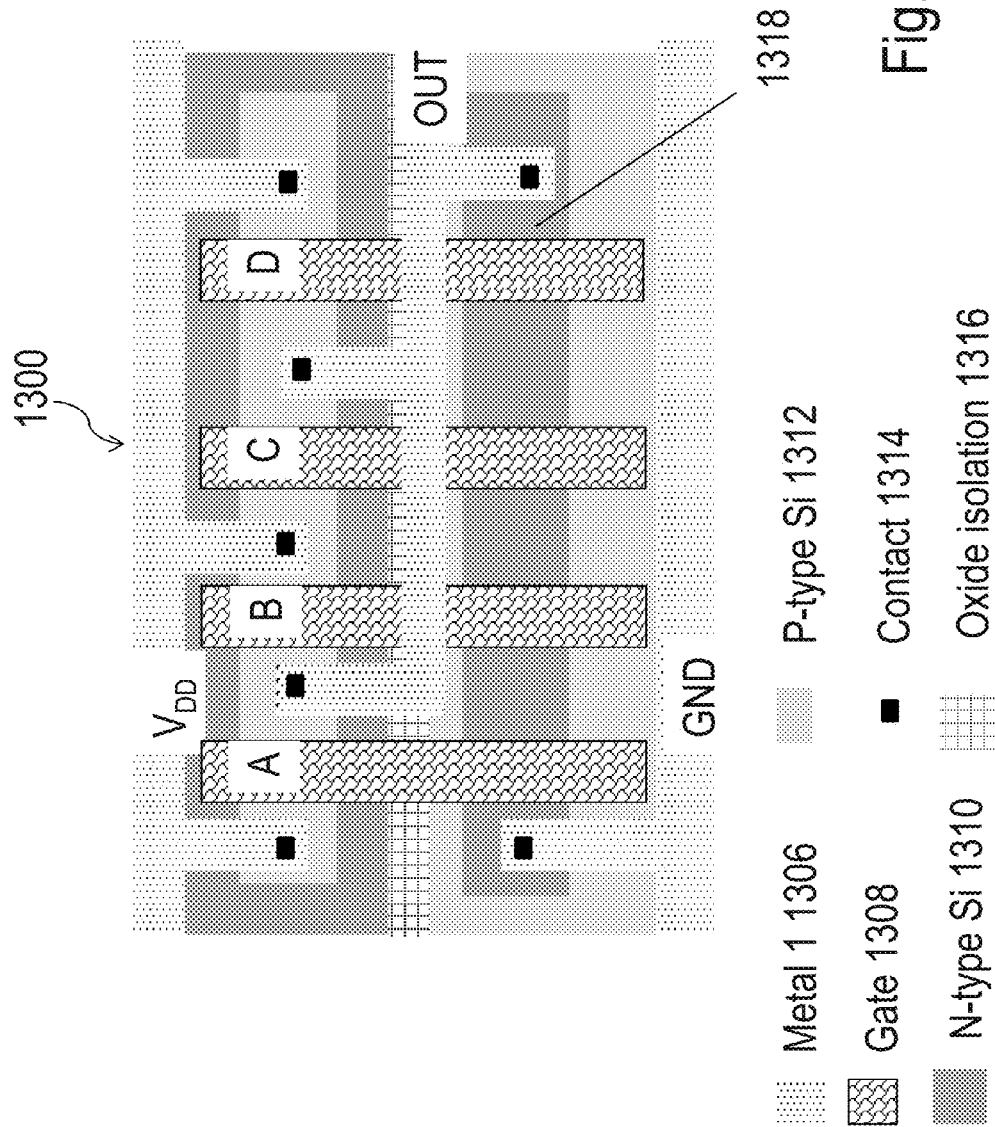
FIG. 13 is an exemplary drawing illustration of a 4 input NAND gate.

FIG. 13 illustrates the layout of an exemplary 4-input NAND gate 1300, where the output OUT is a function of inputs A, B, C and D. 4-input NAND gate 1300 may include metal 1 regions 1306, gate regions 1308, N-type silicon regions 1310, P-type silicon regions 1312, contact regions 1314, and oxide isolation regions 1316. If the 4-input NAND gate 1300 is used in 3D IC stacked device layers, some regions of the NAND gate (such as, for example, sub-region 1318 of N-type silicon regions 1310) are far away from $V_{DD}$ and GND contacts of 4-input NAND gate 1300. The regions, such as sub-region 1318, could have a high thermal resistance to $V_{DD}$ and GND contacts, and could heat up to undesired temperatures. This is because the regions of the NAND gate far away from $V_{DD}$ and GND contacts cannot effectively use the low-thermal resistance power delivery network to transfer heat to the heat removal apparatus.

Figure 14:
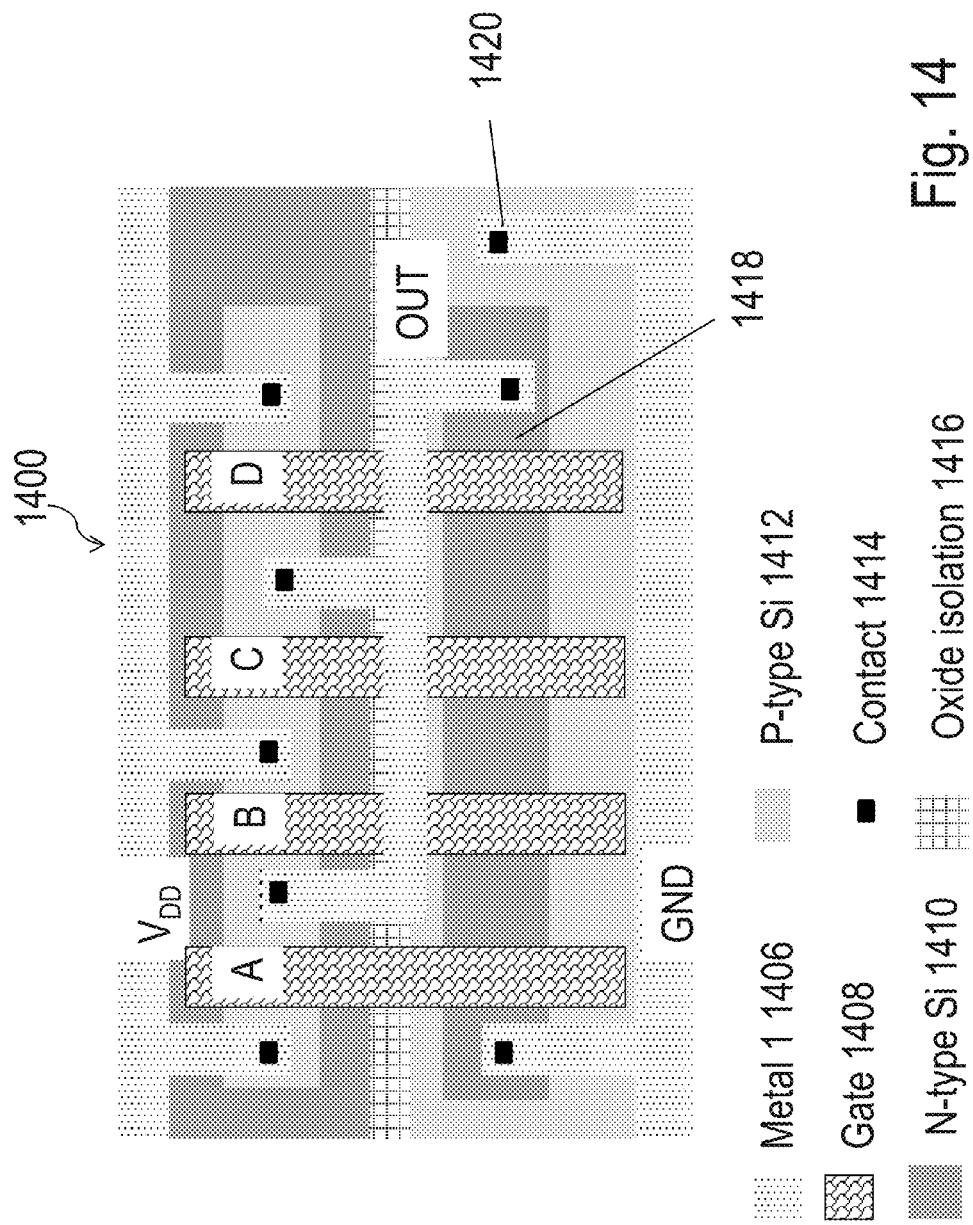
FIG. 14 is an exemplary drawing illustration of a 4 input NAND gate where substantially all parts of the logic cell can be within desirable temperature limits.

FIG. 14 illustrates an embodiment of the invention wherein the layout of exemplary 3D stackable 4-input NAND gate 1400 can be modified so that substantially all parts of the gate are at desirable temperatures during chip operation. Desirable temperatures during chip operation may depend on the type of transistors, circuits, and product application & use, and may be, for example, sub-150° C., sub-100° C., sub-75° C., sub-50° C. or sub-25° C. Inputs to the 3D stackable 4-input NAND gate 1400 are denoted as A, B, C and D, and the output is denoted as OUT. The 4-input NAND gate 1400 may include metal 1 regions 1406, gate regions 1408, N-type silicon regions 1410, P-type silicon regions 1412, contact regions 1414, and oxide isolation regions 1416. As discussed above, sub-region 1418 could have a high thermal resistance to $V_{DD}$ and GND contacts and could heat up to undesired temperatures. Thermal contact 1420 (whose implementation can be similar to those described in FIG. 6 and FIG. 7) may be added to the layout, for example as shown in FIG. 13, to keep the temperature of sub-region 1418 within desirable limits by reducing the thermal resistance from sub-region 1418 to the GND distribution network. Several other implementations of adding and placement of thermal contacts that would be appreciated by persons of ordinary skill in the art can be used to make the exemplary layout shown in FIG. 14 more desirable from a thermal perspective.

FIG. 15 illustrates the layout of an exemplary transmission gate 1500 with inputs A and A'. Transmission gate 1500 may include metal 1 regions 1506, gate regions 1508, N-type silicon regions 1510, P-type silicon regions 1512, contact regions 1514, and oxide isolation regions 1516. If transmission gate 1500 is used in 3D IC stacked device layers, many regions of the transmission gate could heat up to undesired temperatures since there are no $V_{DD}$ and GND contacts. There could be a high thermal resistance to $V_{DD}$ and GND distribution networks. Thus, the transmission gate cannot effectively use the low-thermal resistance power delivery network to transfer heat to the heat removal apparatus.

FIG. 16 illustrates an embodiment of the invention wherein the layout of exemplary 3D stackable transmission gate 1600 can be modified so that substantially all parts of the gate are at desirable temperatures during chip operation. Desirable temperatures during chip operation may depend on the type of transistors, circuits, and product application & use, and may be, for example, sub-150° C., sub-100° C., sub-75° C., sub-50° C. or sub-25° C. Inputs to the 3D stackable transmission gate 1600 are denoted as A and A'. 3D stackable transmission gate 1600 may include metal 1 regions 1606, gate regions 1608, N-type silicon regions 1610, P-type silicon regions 1612, contact regions 1614, and oxide isolation regions 1616. Thermal contacts, such as, for example thermal contact 1620 and second thermal contact 1622 (whose implementation can be similar to those described in FIG. 6 and FIG. 7) may be added to the layout shown in FIG. 15 to keep the temperature of 3D stackable transmission gate 1600 within desirable limits (by reducing the thermal resistance to the $V_{DD}$ and GND distribution networks). Several other implementations of adding and placement of thermal contacts that would be appreciated by persons of ordinary skill in the art can be used to make the exemplary layout shown in FIG. 16 more desirable from a thermal perspective.

The techniques illustrated with FIG. 14 and FIG. 16 are not restricted to cells such as transmission gates and NAND gates, and can be applied to a number of cells such as, for example, SRAMs, CAMs, multiplexers and many others. Furthermore, the techniques illustrated with at least FIG. 14 and FIG. 16 can be applied and adapted to various techniques of constructing 3D integrated circuits and chips, including those described in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference. Furthermore, techniques illustrated with FIG. 14 and FIG. 16 (and other similar techniques) need not be applied to all such gates on the chip, but could be applied to a portion of gates of that type, such as, for example, gates with higher activity factor, lower threshold voltage or higher drive current. Moreover, thermal contacts and vias may not have to be stacked in a vertical line through multiple stacks, layers, strata of circuits.

When a chip is typically designed a cell library consisting of various logic cells such as NAND gates, NOR gates and other gates is created, and the chip design flow proceeds using this cell library. It will be clear to one skilled in the art that a cell library may be created wherein each cell's layout can be optimized from a thermal perspective and based on heat removal criteria such as maximum allowable transistor channel temperature (for example, where each cell's layout can be optimized such that substantially all portions of the cell have low thermal resistance to the $V_{DD}$ and GND contacts, and therefore, to the power bus and the ground bus).

Figure 24:
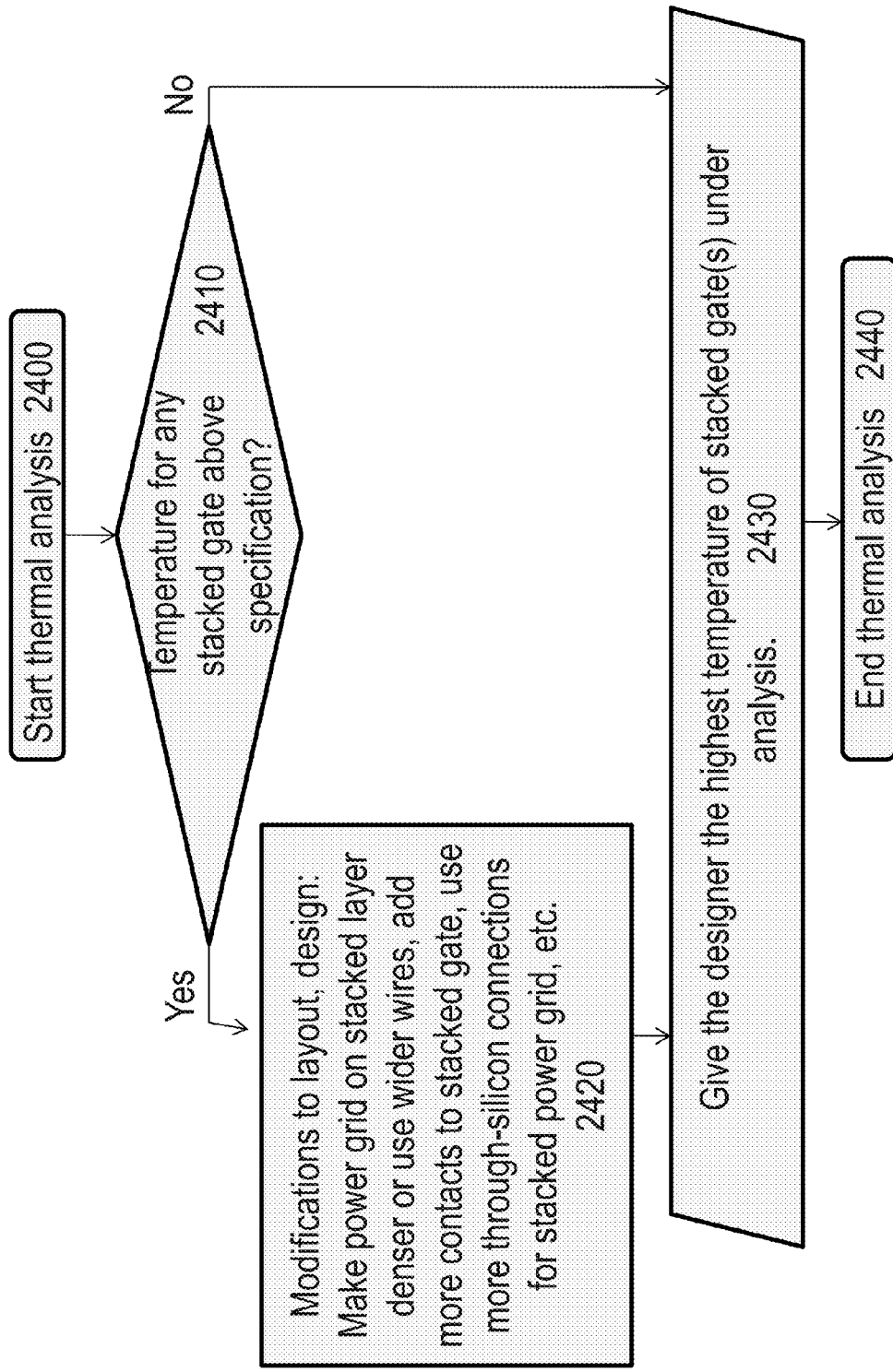
FIG. 24 is an exemplary procedure for a chip designer to ensure a good thermal profile for a design.

FIG. 24 illustrates a procedure for a chip designer to ensure a good thermal profile for his or her design. After a first pass or a portion of the first pass of the desired chip layout process is complete, a thermal analysis may be conducted to determine temperature profiles for active or passive elements, such as gates, on the 3D chip. The thermal analysis may be started (2400). The temperature of any stacked gate, or region of gates, may be calculated, for example, by simulation such as a multi-physics solver, and compared to a desired specification value (2410). If the gate, or region of gates, temperature is higher than the specification, which may, for example, be in the range of 65° C.-150° C., modifications (2420) may be made to the layout or design, such as, for example, power grids for stacked layers may be made denser or wider, additional contacts to the gate may be added, more through-silicon (TLV and/or TSV) connections may be made for connecting the power grid in stacked layers to the layer closest to the heat sink, or any other method to reduce stacked layer temperature that may be described herein or in referenced documents, which may be used alone or in combination. The output (2430) may give the designer the temperature of the modified stacked gate ('Yes' tree), or region of gates, or an unmodified one ('No' tree), and may include the original un-modified gate temperature that was above the desired specification. The thermal analysis may end (2440) or may be iterated. Alternatively, the power grid may be designed (based on heat removal criteria) simultaneously with the logic gates and layout of the design, or for various regions of any layer of the 3D integrated circuit stack. The density of TLVs may be greater than $10^4$ per $cm^2$, and may be 10×, 100×, 1000×, denser than TSVs.

Figure 22:
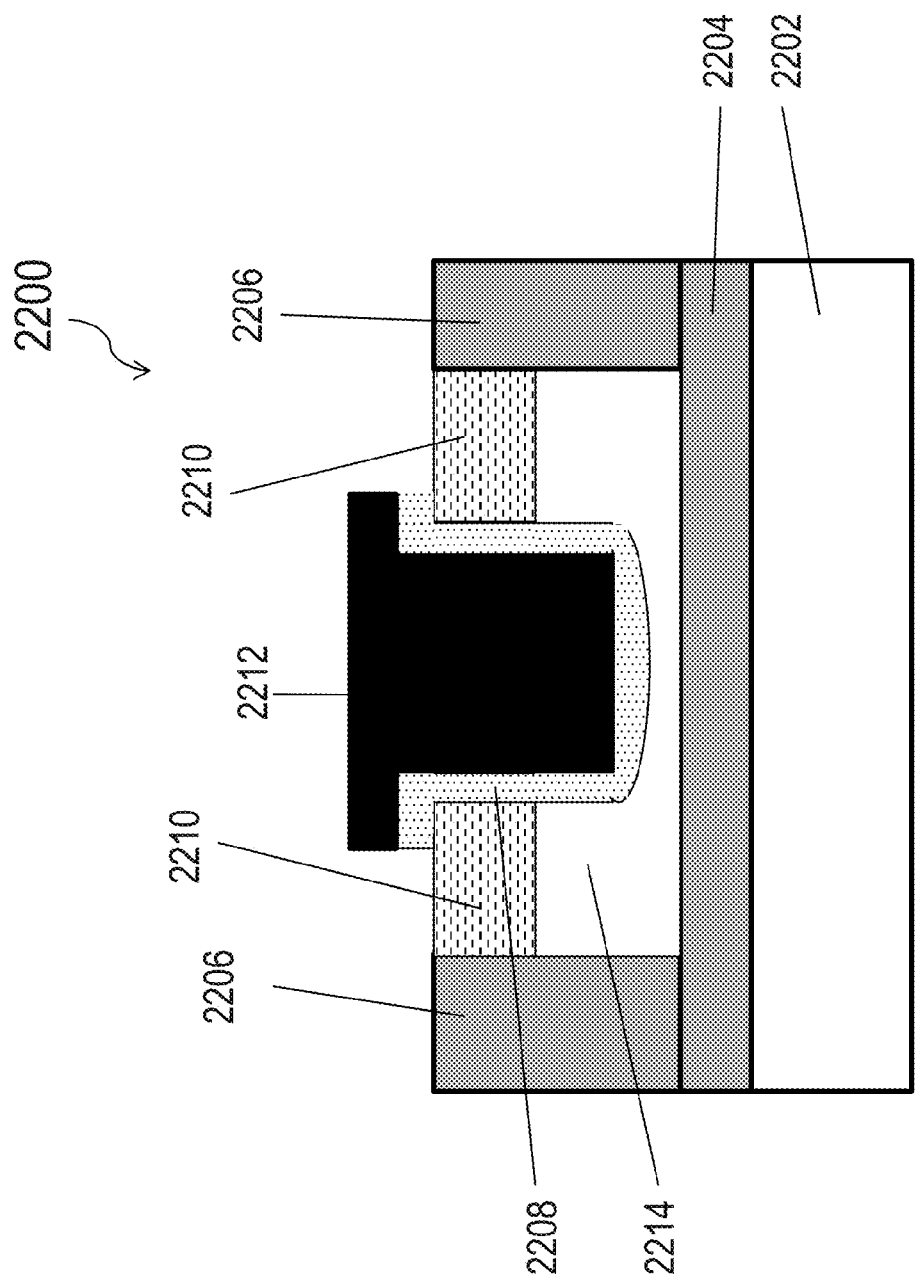
FIG. 22 is an exemplary drawing illustration of a recessed channel transistor (RCAT)

Recessed channel transistors form a transistor family that can be stacked in 3D. FIG. 22 illustrates an exemplary Recessed Channel Transistor 2200 which may be constructed in a 3D stacked layer using procedures outlined in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference. Recessed Channel Transistor 2200 may include 2202 a bottom layer of transistors and wires 2202, oxide layer 2204, oxide regions 2206, gate dielectric 2208, n+ silicon regions 2210, gate electrode 2212 and region of p− silicon region 2214. The recessed channel transistor is surrounded on substantially all sides by thermally insulating oxide layers oxide layer 2204 and oxide regions 2206, and heat removal may be a serious issue. Furthermore, to contact the p− silicon region 2214, a p+ region may be needed to obtain low contact resistance, which may not be easy to construct at temperatures lower than approximately 400° C.

Figure 17A:
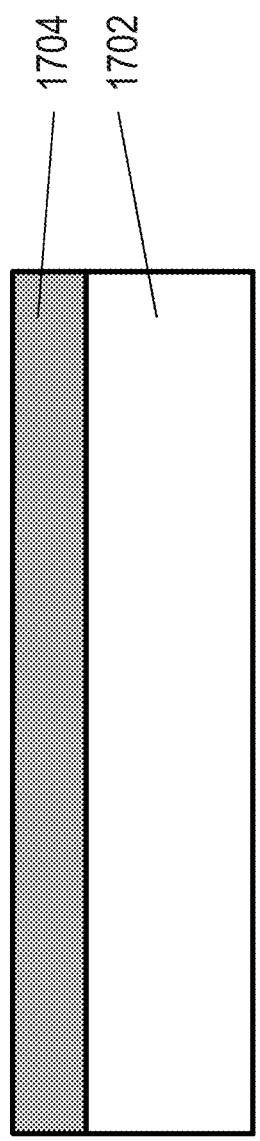
Figure 17B:
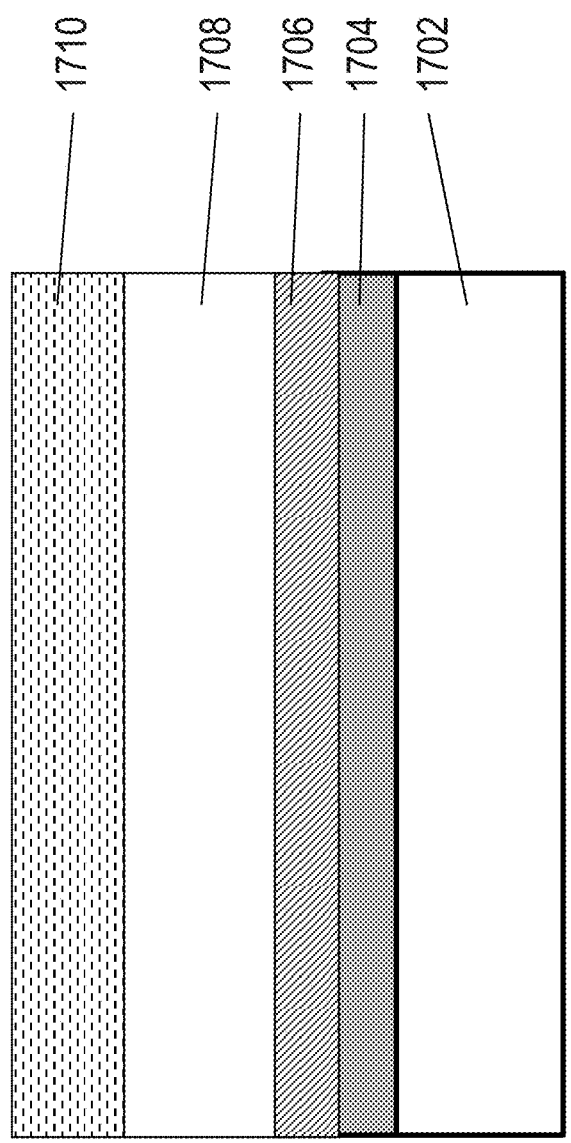
Figure 17D:
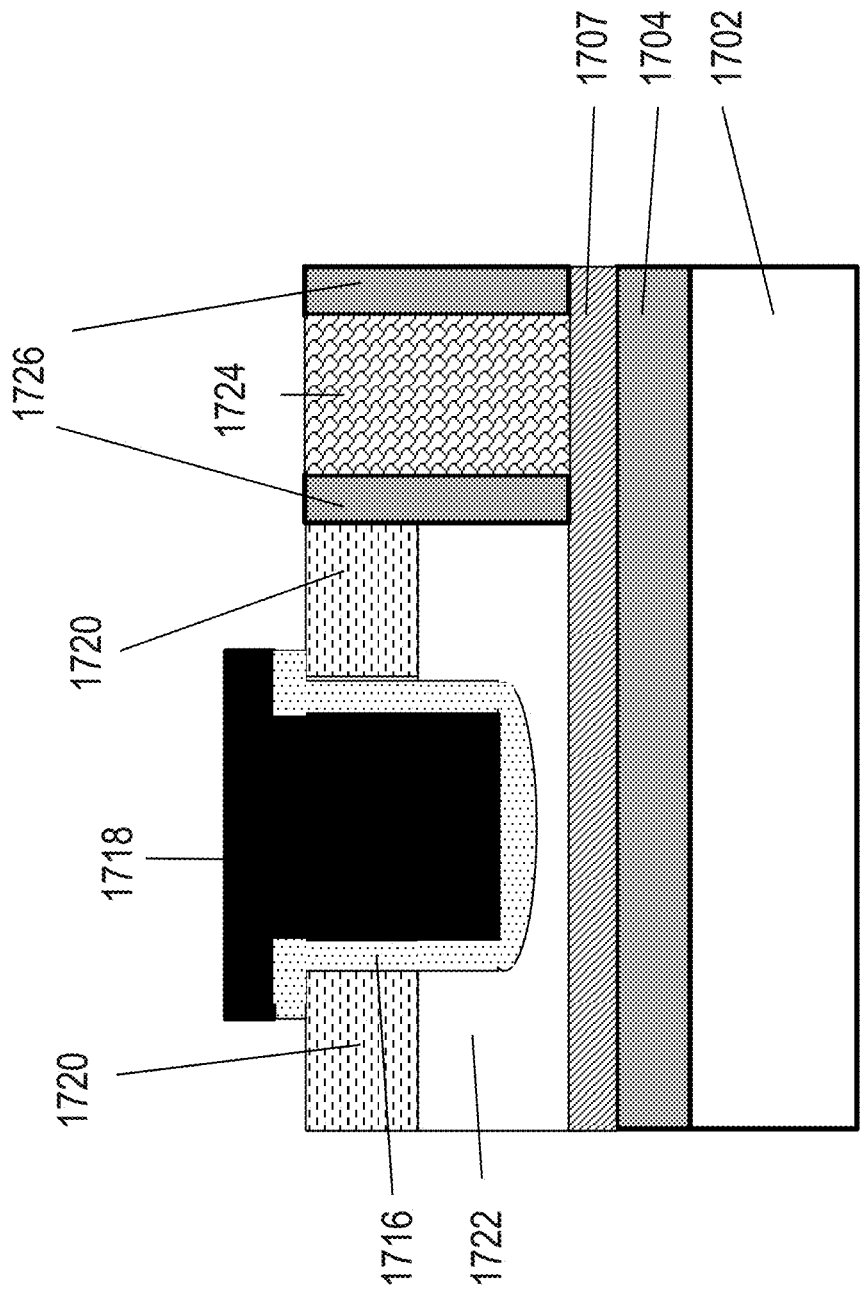

FIG. 17A-D illustrates an embodiment of the invention wherein thermal contacts can be constructed to a recessed channel transistor. Note that numbers used in FIG. 17A-D are inter-related. For example, if a certain number is used in FIG. 17A, it has the same meaning if present in FIG. 17B. The process flow may begin as illustrated in FIG. 17A with a bottom layer or layers of transistors and copper interconnects 1702 being constructed with a silicon dioxide layer 1704 atop it. Layer transfer approaches similar to those described in U.S. Patent Application Publication 2012/0129301 (allowed U.S. patent application Ser. No. 13/273,712) and pending U.S. patent application Ser. Nos. 13/441,923 and 13/099,010 may be utilized. The contents of the foregoing applications are incorporated herein by reference. An activated layer of p+ silicon 1706, an activated layer of p− silicon 1708 and an activated layer of n+ silicon 1710 can be transferred atop the structure illustrated in FIG. 17A to form the structure illustrated in FIG. 17B. FIG. 17C illustrates a next step in the process flow. After forming isolation regions such as, for example, STI-Shallow Trench Isolation (not shown in FIG. 17C for simplicity) and thus forming p+ regions 1707, gate dielectric regions 1716 and gate electrode regions 1718 could be formed, for example, by etch and deposition processes, using procedures similar to those described in U.S. Patent Application Publication 2012/0129301 (allowed U.S. patent application Ser. No. 13/273,712) and pending U.S. patent application Ser. Nos. 13/441,923 and 13/099,010. Thus, p− silicon region 1712 and n+ silicon regions 1714 may be formed. FIG. 17C thus illustrates an RCAT (recessed channel transistor) formed with a p+ silicon region atop copper interconnect regions where the copper interconnect regions are not exposed to temperatures higher than approximately 400° C. FIG. 17D illustrates a next step of the process where thermal contacts could be made to the p+ silicon region 1707. FIG. 17D may include final p− silicon region 1722 and final n+ silicon regions 1720. Via 1724 may be etched and constructed, for example, of metals (such as Cu, Al, W, degenerately doped Si), metal silicides ($WSi_2$) or a combination of the two, and may include oxide isolation regions 1726. Via 1724 can connect p+ region 1707 to the ground (GND) distribution network. Via 1724 could alternatively be connected to a body bias distribution network. Via 1724 and final n+ silicon regions 1720 may be electrically coupled, such as by removal of a portion of an oxide isolation regions 1726, if desired for circuit reasons (not shown). The nRCAT could have its body region connected to GND potential (or body bias circuit) and operate correctly or as desired, and the heat produced in the device layer can be removed through the low-thermal resistance GND distribution network to the heat removal apparatus (not shown for clarity).

Figure 18:
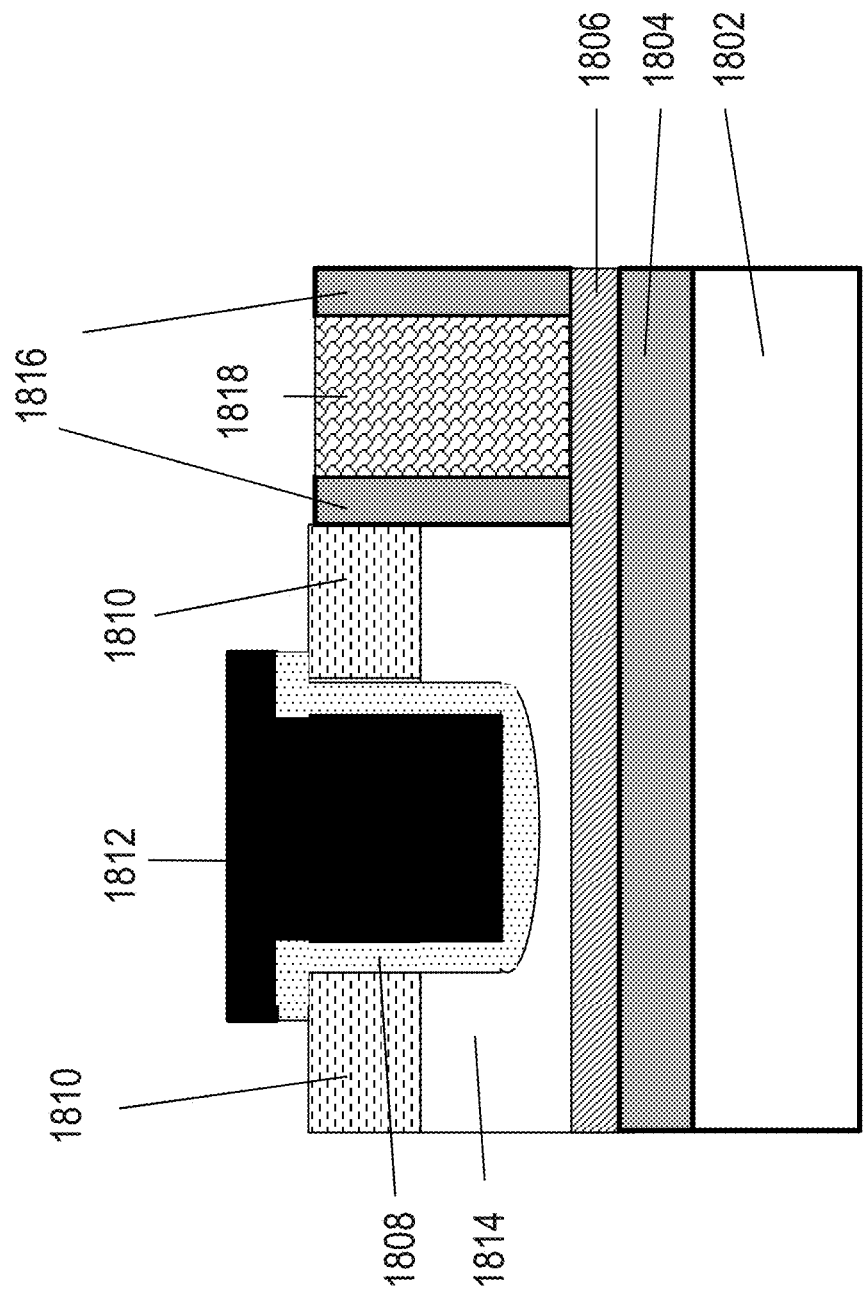
FIG. 18 is an exemplary drawing illustration of a pMOS recessed channel transistor with thermal contacts.

FIG. 18 illustrates an embodiment the invention, which illustrates the application of thermal contacts to remove heat from a pRCAT device layer that is stacked above a bottom layer of transistors and wires 1802. The p-RCAT layer may include 1804 buried oxide region 1804, n+ silicon region 1806, n− silicon region 1814, p+ silicon region 1810, gate dielectric 1808 and gate electrode 1812. The structure shown in FIG. 18 can be constructed using methods similar to those described in respect to FIG. 17A-D above. The thermal contact 1818 could be constructed of, for example, metals (such as Cu, Al, W, degenerately doped Si), metal silicides ($WSi_2$) or a combination of two or more types of materials, and may include oxide isolation regions 1816. Thermal contact 1818 may connect n+ region 1806 to the power ($V_{DD}$) distribution network. The pRCAT could have its body region connected to the supply voltage ($V_{DD}$) potential (or body bias circuit) and operate correctly or as desired, and the heat produced in the device layer can be removed through the low-thermal resistance $V_{DD}$ distribution network to the heat removal apparatus. Thermal contact 1818 could alternatively be connected to a body bias distribution network (not shown for clarity). Thermal contact 1818 and p+ silicon region 1810 may be electrically coupled, such as by removal of a portion of an oxide isolation regions 1816, if desired for circuit reasons (not shown).

Figure 19:
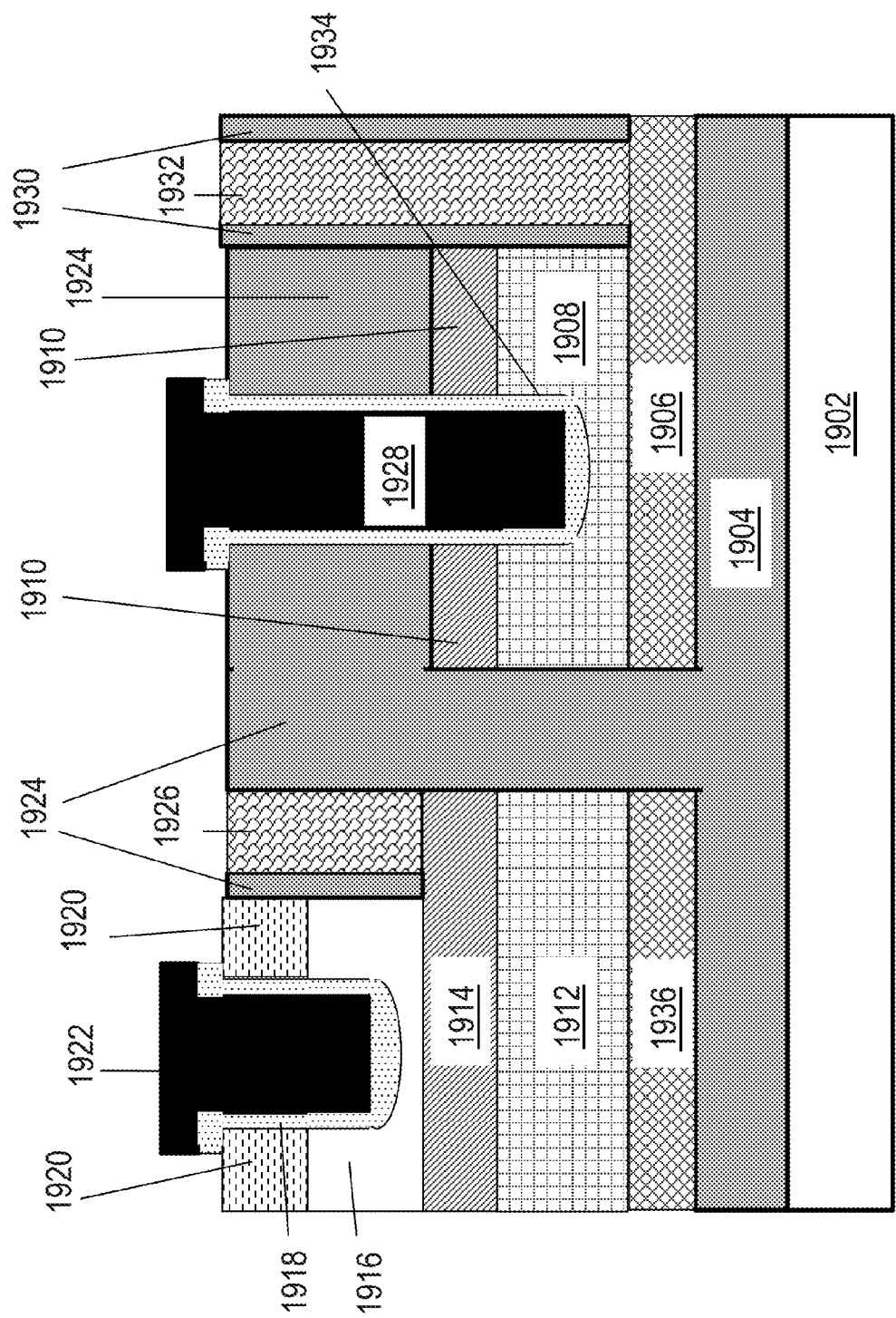
FIG. 19 is an exemplary drawing illustration of a CMOS circuit with recessed channel transistors and thermal contacts.

FIG. 19 illustrates an embodiment of the invention that describes the application of thermal contacts to remove heat from a CMOS device layer that could be stacked atop a bottom layer of transistors and wires 1902. The CMOS device layer may include insulator regions 1904, sidewall insulator regions 1924, thermal via insulator regions 1930, such as silicon dioxide. The CMOS device layer may include nMOS p+ silicon region 1906, pMOS p+ silicon region 1936, nMOS p− silicon region 1908, pMOS buried p− silicon region 1912, nMOS n+ silicon regions 1910, pMOS n+ silicon 1914, pMOS n− silicon region 1916, p+ silicon regions 1920, pMOS gate dielectric region 1918, pMOS gate electrode region 1922, nMOS gate dielectric region 1934 and nMOS gate electrode region. A nMOS transistor could therefore be formed of regions 1934, 1928, 1910, 1908 and 1906. A pMOS transistor could therefore be formed of regions 1914, 1916, 1918, 1920 and 1922. This stacked CMOS device layer could be formed with procedures similar to those described in U.S. Patent Application Publication 2012/0129301 (allowed U.S. patent application Ser. No. 13/273,712) and pending U.S. patent application Ser. Nos. 13/441,923 and 13/099,010 and at least FIG. 17A-D herein. The thermal contact 1926 may be connected between n+ silicon region 1914 and the power ($V_{DD}$) distribution network and helps remove heat from the pMOS transistor. This is because the pMOSFET could have its body region connected to the supply voltage ($V_{DD}$) potential or body bias distribution network and operate correctly or as desired, and the heat produced in the device layer can be removed through the low-thermal resistance $V_{DD}$ distribution network to the heat removal apparatus as previously described. The thermal contact 1932 may be connected between p+ silicon region 1906 and the ground (GND) distribution network and helps remove heat from the nMOS transistor. This is because the nMOSFET could have its body region connected to GND potential or body bias distribution network and operate correctly or as desired, and the heat produced in the device layer can be removed through the low-thermal resistance GND distribution network to the heat removal apparatus as previously described.

Figure 20:
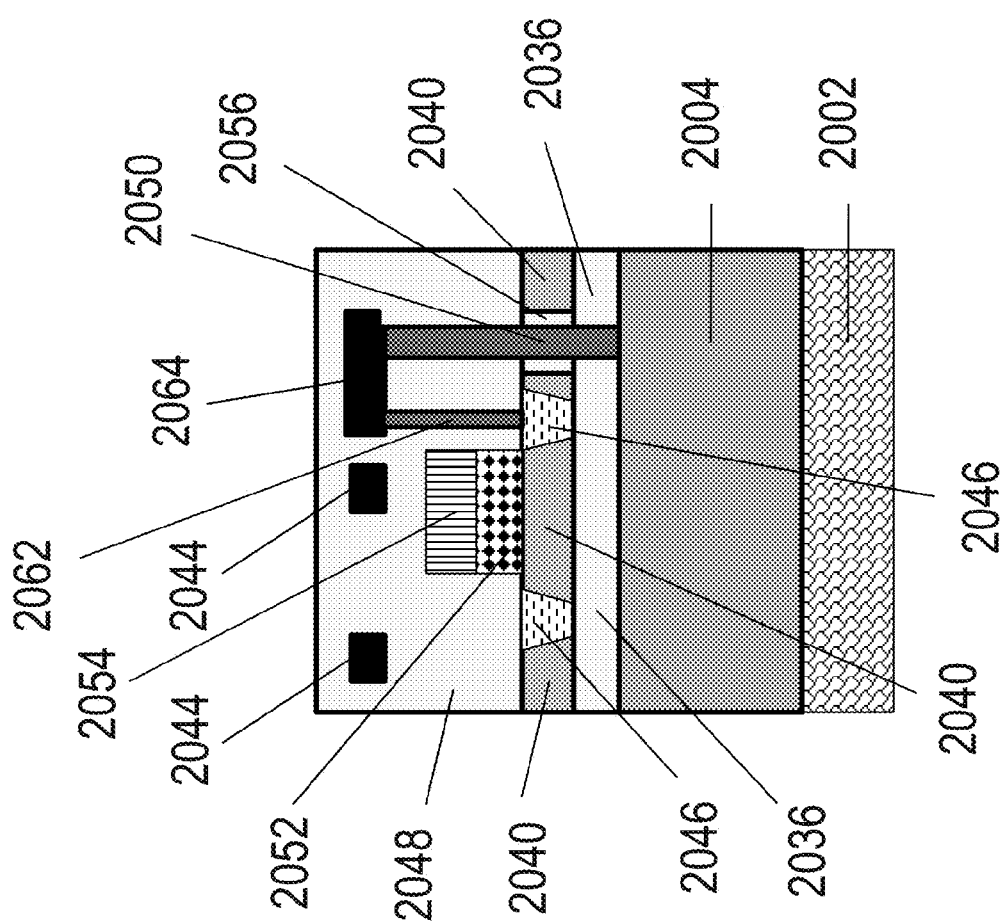
FIG. 20 is an exemplary drawing illustration of a technique to remove heat more effectively from silicon-on-insulator (SOI) circuits.

FIG. 20 illustrates an embodiment of the invention that describes a technique that could reduce heat-up of transistors fabricated on silicon-on-insulator (SOI) substrates. SOI substrates have a buried oxide (BOX) or other insulator between the silicon transistor regions and the heat sink. This BOX region may have a high thermal resistance, and makes heat transfer from the transistor regions to the heat sink difficult. The nMOS transistor in SOI may include buried oxide regions 2036, BEOL metal insulator regions 2048, and STI insulator regions 2056, such as silicon dioxide. The nMOS transistor in SOI may include n+ silicon regions 2046, p− silicon regions 2040, gate dielectric region 2052, gate electrode region 2054, interconnect wiring regions 2044, and highly doped silicon substrate 2004. Use of silicon-on-insulator (SOI) substrates may lead to low heat transfer from the transistor regions to the heat removal apparatus 2002 through the buried oxide regions 2036 (generally a layer) that may have low thermal conductivity. The ground contact 2062 of the nMOS transistor shown in FIG. 20 can be connected to the ground distribution network wiring 2064 which in turn can be connected with a low thermal resistance connection 2050 to highly doped silicon substrate 2004. This enables low thermal conductivity, a thermal conduction path, between the transistor shown in FIG. 20 and the heat removal apparatus 2002. While FIG. 20 described how heat could be transferred among an nMOS transistor and the heat removal apparatus, similar approaches can also be used for pMOS transistors, and many other transistors, for example, FinFets, BJTs, HEMTs, and HBTs. Many of the aforementioned transistors may be constructed as fully depleted channel devices.

Figure 21:
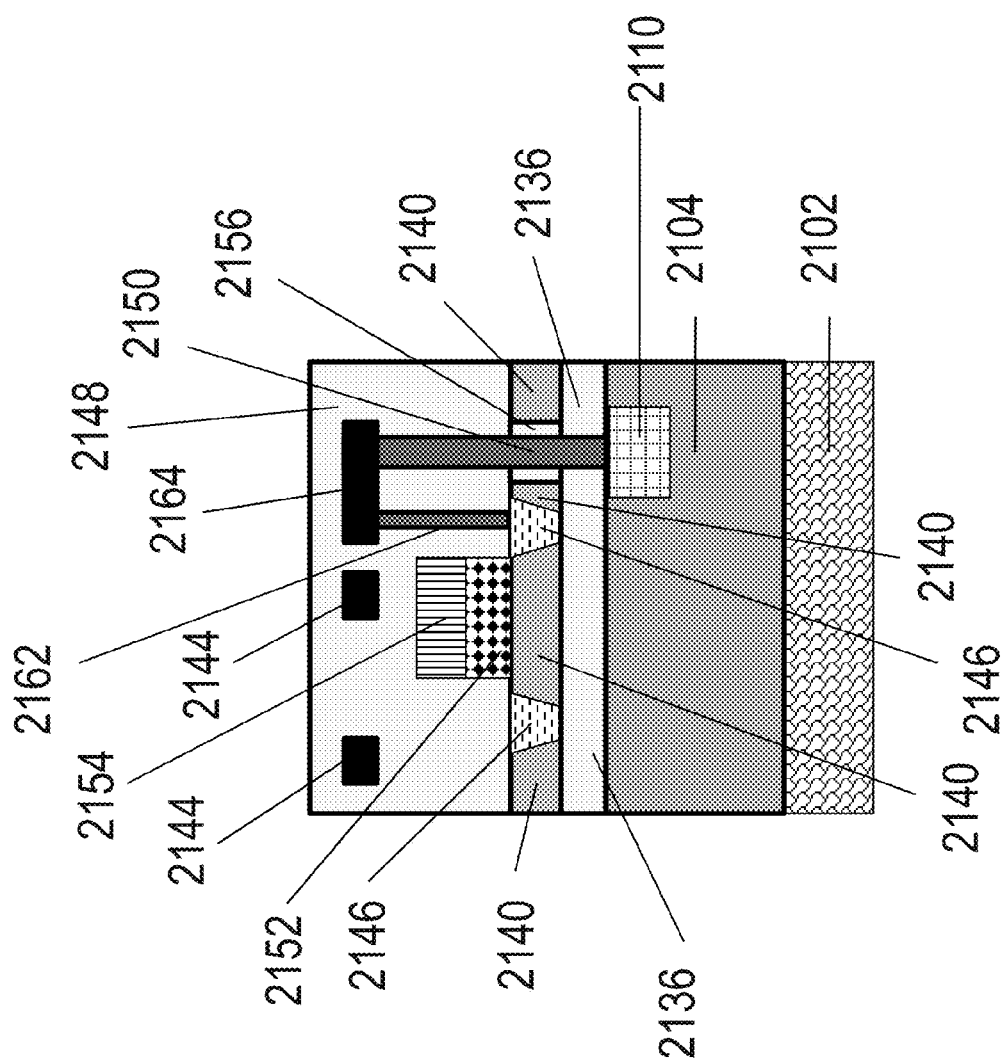
FIG. 21 is an exemplary drawing illustration of an alternative technique to remove heat more effectively from silicon-on-insulator (SOI) circuits.

FIG. 21 illustrates an embodiment of the invention which describes a technique that could reduce heat-up of transistors fabricated on silicon-on-insulator (SOI) substrates. The nMOS transistor in SOI may include buried oxide 2136, BEOL metal insulator regions 2148, and STI insulator regions 2156, such as silicon dioxide. The nMOS transistor in SOI may include n+ silicon regions 2146, p− silicon regions 2140, gate dielectric region 2152, gate electrode region 2154, interconnect wiring regions 2144, and highly doped silicon substrate 2104. Use of silicon-on-insulator (SOI) substrates may lead to low heat transfer from the transistor regions to the heat removal apparatus 2102 through the buried oxide regions 2136 (generally a layer) that may have low thermal conductivity. The ground contact 2162 of the nMOS transistor shown in FIG. 21 can be connected to the ground distribution network 2164 which in turn can be connected with a low thermal resistance connection 2150 to highly doped silicon substrate 2104 through an implanted and activated region 2110. The implanted and activated region 2110 could be such that thermal contacts similar to those in FIG. 6 can be formed. This may enable low thermal conductivity, a thermal conduction path, between the transistor shown in FIG. 21 and the heat removal apparatus 2102. This thermal conduction path, whilst thermally conductive, may not be electrically conductive (due to the reverse biased junctions that could be constructed in the path), and thus, not disturb the circuit operation. While FIG. 21 described how heat could be transferred among the nMOS transistor and the heat removal apparatus, similar approaches can also be used for pMOS transistors, and other transistors, for example, FinFets, BJTs, HEMTs, and HBTs.

Figure 23:
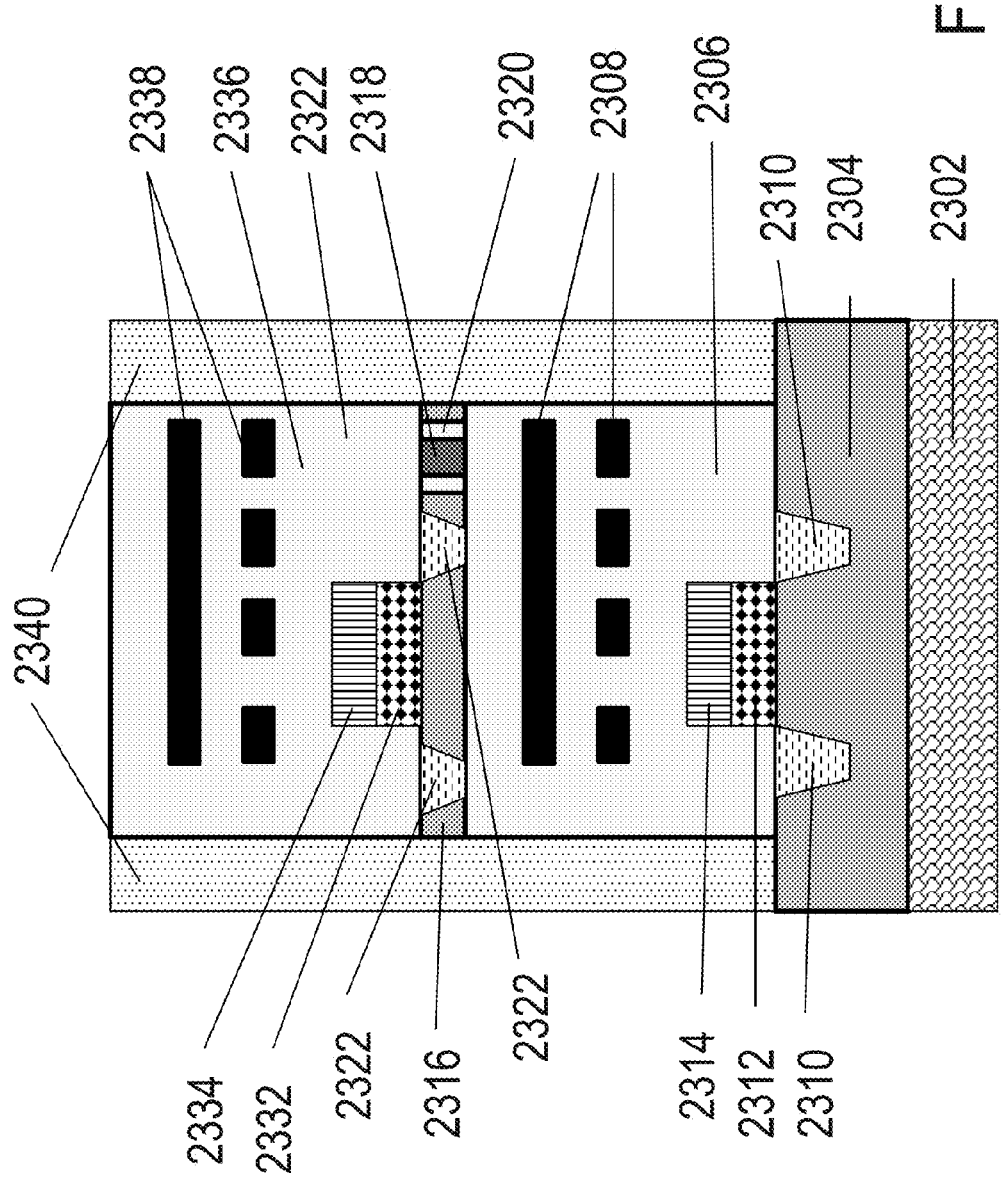
FIG. 23 is an exemplary drawing illustration of a 3D-IC with thermally conductive material on the sides.

FIG. 23 illustrates an embodiment of the invention wherein heat spreading regions may be located on the sides of 3D-ICs. The 3D integrated circuit shown in FIG. 23 could be potentially constructed using techniques described in U.S. Patent Application Publication 2012/0129301 (allowed U.S. patent application Ser. No. 13/273,712) and pending U.S. patent application Ser. Nos. 13/441,923 and 13/099,010. For example, two crystalline layers, 2304 and 2316, which may include semiconductor materials such as, for example, mono-crystalline silicon, germanium, GaAs, InP, and graphene, are shown. For this illustration, mono-crystalline (single crystal) silicon may be used. Silicon layer 2316 could be thinned from its original thickness, and its final thickness could be in the range of about 0.01 um to about 50 um, for example, 10 nm, 100 nm, 200 nm, 0.4 um, 1 um, 2 um or 5 um. Silicon layer 2304 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 2304 may also be of thicknesses greater than 100 um, depending on, for example, the strength of bonding to heat removal apparatus 2302. Silicon layer 2304 may include transistors such as, for example, MOSFETS, FinFets, BJTs, HEMTs, HBTs, which may include gate electrode region 2314, gate dielectric region 2312, and shallow trench isolation (STI) regions 2310 and several other regions that may be necessary for transistors such as source and drain junction regions (not shown for clarity). Silicon layer 2316 may include transistors such as, for example, MOSFETS, FinFets, BJTs, HEMTs, HBTs, which may include gate electrode region 2334, gate dielectric region 2332, and shallow trench isolation (STI) regions 2322 and several other regions that may be necessary for transistors such as source and drain junction regions (not shown for clarity). It can be observed that the STI regions 2322 can go right through to the bottom of silicon layer 2316 and provide good electrical isolation. A through-layer via (TLV) 2318 may be present and may include an associated surrounding dielectric region 2320. Dielectric region 2320 may include a shallow trench isolation region. Wiring layers 2308 for silicon layer 2304 and wiring dielectric 2306 may be present and may form an associated interconnect layer or layers. Wiring layers 2338 for silicon layer 2316 and wiring dielectric 2336 may be present and may form an associated interconnect layer or layers. Through-layer via (TLV) 2318 may connect to wiring layers 2308 and wiring layers 2338 (not shown). The heat removal apparatus 2302 may include a heat spreader and/or a heat sink. Thermally conductive material regions 2340 could be present at the sides of the 3D-IC shown in FIG. 23. Thermally conductive material regions 2340 may be formed by sequential layer by layer etch and fill, or by an end of process etch and fill. Thus, a thermally conductive heat spreading region could be located on the sidewalls of a 3D-IC. The thermally conductive material regions 2340 could include dielectrics such as, for example, insulating carbon, diamond, diamond like carbon (DLC), and other dielectrics that have a thermal conductivity higher than silicon dioxide and/or have a thermal conductivity higher than 0.6 W/m-K. Another method that could be used for forming thermally conductive material regions 2340 could involve depositing and planarizing the thermally conductive material at locations on or close to the dicing regions, such as potential dicing scribe lines (described in U.S. Patent Application Publication 2012/0129301) of a 3D-IC after an etch process. The wafer could be diced. Those of ordinary skill in the art will appreciate that one could combine the concept of having thermally conductive material regions on the sidewalls of 3D-ICs with concepts shown in other figures of this patent application, such as, for example, the concept of having lateral heat spreaders shown in FIG. 8. Silicon layer 2304 and silicon layer 2316 may be may be substantially absent of semiconductor dopants to form an undoped silicon region or layer, or doped, such as, for example, with elemental or compound species that form a p+, or p, or p−, or n+, or n, or n− silicon layer or region.

Figure 25:
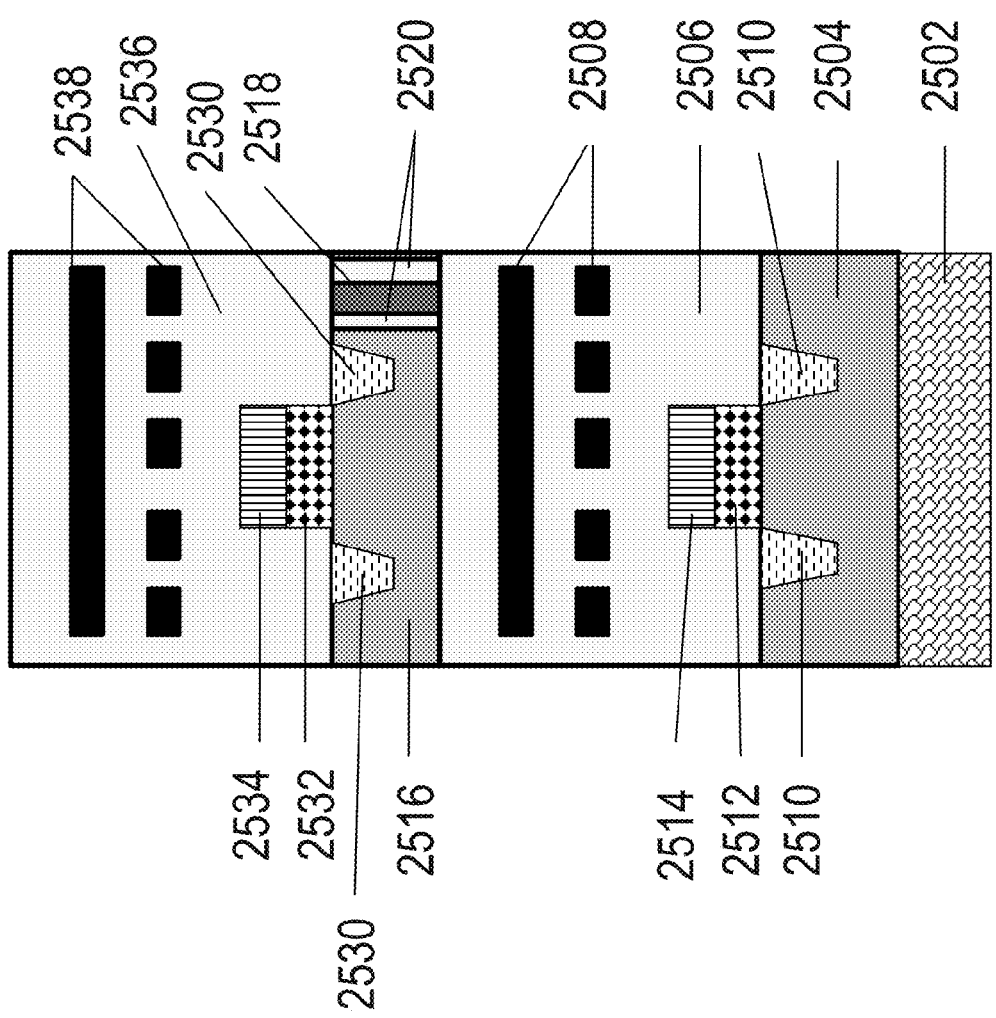
FIG. 25 is an exemplary drawing illustration of a monolithic 3D-IC structure with CTE adjusted through layer connections.

FIG. 25 illustrates an exemplary monolithic 3D integrated circuit. The 3D integrated circuit shown in FIG. 25 could be potentially constructed using techniques described in U.S. Patent Application Publication 2012/0129301 (allowed U.S. patent application Ser. No. 13/273,712) and pending U.S. patent application Ser. Nos. 13/441,923 and 13/099,010. For example, two crystalline layers, 2504 and 2516, which may include semiconductor materials such as, for example, mono-crystalline silicon, germanium, GaAs, InP, and graphene, are shown. For this illustration, mono-crystalline (single crystal) silicon may be used. Silicon layer 2516 could be thinned from its original thickness, and its final thickness could be in the range of about 0.01 um to about 50 um, for example, 10 nm, 100 nm, 200 nm, 0.4 um, 1 um, 2 um or 5 um. Silicon layer 2504 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 2504 may also be of thicknesses greater than 100 um, depending on, for example, the strength of bonding to heat removal apparatus 2502. Silicon layer 2504, or silicon substrate, may include transistors such as, for example, MOSFETS, FinFets, BJTs, HEMTs, HBTs, which may include gate electrode region 2514, gate dielectric region 2512, transistor junction regions 2510 and several other regions that may be necessary for transistors such as source and drain junction regions (not shown for clarity). Silicon layer 2516 may include transistors such as, for example, MOSFETS, FinFets, BJTs, HEMTs, HBTs, which may include gate electrode region 2534, gate dielectric region 2532, transistor junction regions 2530 and several other regions that may be necessary for transistors such as source and drain junction regions (not shown for clarity). A through-silicon connection 2518, or TLV (through-silicon via) could be present and may have a surrounding dielectric region 2520. Surrounding dielectric region 2520 may include a shallow trench isolation (STI) region, such as one of the shallow trench isolation (STI) regions typically in a 3D integrated circuit stack (not shown). Silicon layer 2504 may have wiring layers 2508 and wiring dielectric 2506. Wiring layers 2508 and wiring dielectric 2506 may form an associated interconnect layer or layers. Silicon layer 2516 may have wiring layers 2538 and wiring dielectric 2536. Wiring layers 2538 and wiring dielectric 2536 may form an associated interconnect layer or layers. Wiring layers 2538 and wiring layers 2508 may be constructed of copper, aluminum or other materials with bulk resistivity lower than 2.8 uohm-cm. The choice of materials for through-silicon connection 2518 may be challenging. If copper is chosen as the material for through-silicon connection 2518, the co-efficient of thermal expansion (CTE) mismatch between copper and the surrounding mono-crystalline silicon layer 2516 may become an issue. Copper has a CTE of approximately 16.7 ppm/K while silicon has a CTE of approximately 3.2 ppm/K. This large CTE mismatch may cause reliability issues and the need for large keep-out zones around the through-silicon connection 2518 wherein transistors cannot be placed. If transistors are placed within the keep-out zone of the through-silicon connection 2518, their current-voltage characteristics may be different from those placed in other areas of the chip. Similarly, if Aluminum (CTE=23 ppm/K) is used as the material for through-silicon connection 2518, its CTE mismatch with the surrounding mono-crystalline silicon layer 2516 could cause large keep-out zones and reliability issues. Silicon layer 2504 and silicon layer 2516 may be may be substantially absent of semiconductor dopants to form an undoped silicon region or layer, or doped, such as, for example, with elemental or compound species that form a p+, or p, or p−, or n+, or n, or n− silicon layer or region.

An embodiment of the invention utilizes a material for the through-silicon connection 2518 (TSV or TLV) that may have a CTE closer to silicon than, for example, copper or aluminum. The through-silicon connection 2518 may include materials such as, for example, tungsten (CTE approximately 4.5 ppm/K), highly doped polysilicon or amorphous silicon or single crystal silicon (CTE approximately 3 ppm/K), conductive carbon, or some other material with CTE less than 15 ppm/K. Wiring layers 2538 and wiring layers 2508 may have materials with CTE greater than 15 ppm/K, such as, for example, copper or aluminum.

Persons of ordinary skill in the art will appreciate that the illustrations in FIG. 25 are exemplary only and are not drawn to scale. Such skilled persons will further appreciate that many variations are possible such as, for example, the through-silicon connection 2518 may include materials in addition to those (such as Tungsten, conductive carbon) described above, for example, liners and barrier metals such as TiN, TaN, and other materials known in the art for via, contact, and through silicon via formation. Moreover, the transistors in silicon layer 2504 may be formed in a manner similar to silicon layer 2516. Furthermore, through-silicon connection 2518 may be physically and electrically connected (not shown) to wiring layers 2508 and wiring layers 2538 by the same material as the wiring layers 2508/2538, or by the same materials as the through-silicon connection 2518 composition, or by other electrically and/or thermally conductive materials not found in the wiring layers 2508/2538 or the through-silicon connection 2518. Many other modifications within the scope of the invention will suggest themselves to such skilled persons after reading this specification. Thus the invention is to be limited only by the appended claims.

A planar n-channel Junction-Less Recessed Channel Array Transistor (JL-RCAT) suitable for a monolithic 3D IC may be constructed as follows. The JL-RCAT may provide an improved source and drain contact resistance, thereby allowing for lower channel doping, and the recessed channel may provide for more flexibility in the engineering of channel lengths and transistor characteristics, and increased immunity from process variations. FIG. 26A-F illustrates an exemplary n-channel JL-RCAT which may be constructed in a 3D stacked layer using procedures outlined below and in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference.

Figure 26A:
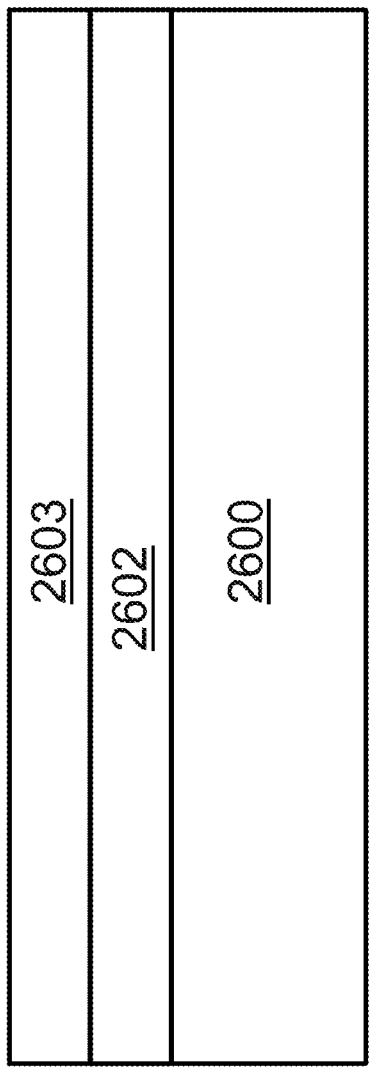

As illustrated in FIG. 26A, a N– substrate donor wafer 2600 may be processed to include wafer sized layers of N+ doping 2602, and N– doping 2603 across the wafer. The N+ doped layer 2602 may be formed by ion implantation and thermal anneal. N– doped layer 2603 may have additional ion implantation and anneal processing to provide a different dopant level than N– substrate donor wafer 2600. N– doped layer 2603 may have graded or various layers of N– doping to mitigate transistor performance issues, such as, for example, short channel effects, after the JL-RCAT is formed. The layer stack may alternatively be formed by successive epitaxially deposited doped silicon layers of N+ 2602 and N– 2603, or by a combination of epitaxy and implantation Annealing of implants and doping may include, for example, conductive/inductive thermal, optical annealing techniques or types of Rapid Thermal Anneal (RTA or spike). The N+ doped layer 2602 may have a doping concentration that may be more than 10× the doping concentration of N– doped layer 2603. N– doped layer 2603 may have a thickness that may allow fully-depleted channel operation when the JL-RCAT transistor is substantially completely formed, such as, for example, less than 5 nm, less than 10 nm, or less than 20 nm.

Figure 26B:
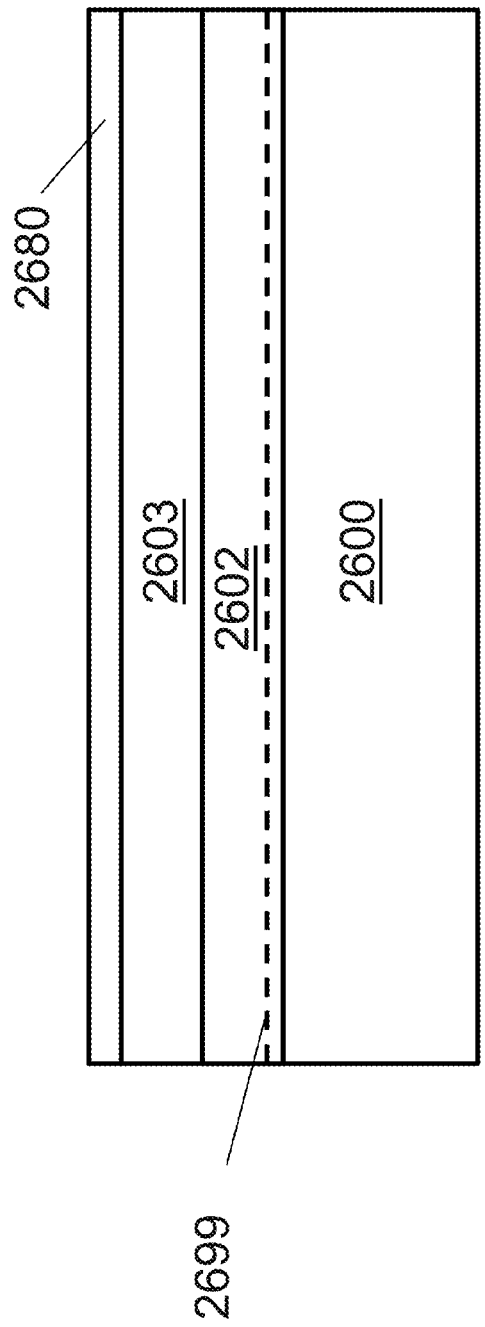

As illustrated in FIG. 26B, the top surface of N– substrate donor wafer 2600 may be prepared for oxide wafer bonding with a deposition of an oxide or by thermal oxidation of N– doped layer 2603 to form oxide layer 2680. A layer transfer demarcation plane (shown as dashed line) 2699 may be formed by hydrogen implantation or other methods as described in the incorporated references. The N– substrate donor wafer 2600 and acceptor wafer 2610 may be prepared for wafer bonding as previously described and low temperature (less than approximately 400° C.) bonded. Acceptor wafer 2610, as described in the incorporated references, may include, for example, transistors, circuitry, and metal, such as, for example, aluminum or copper, interconnect wiring, and thru layer via metal interconnect strips or pads. The portion of the N+ doped layer 2602 and the N-substrate donor wafer 2600 that may be above the layer transfer demarcation plane 2699 may be removed by cleaving or other low temperature processes as described in the incorporated references, such as, for example, ion-cut or other layer transfer methods.

Figure 26C:
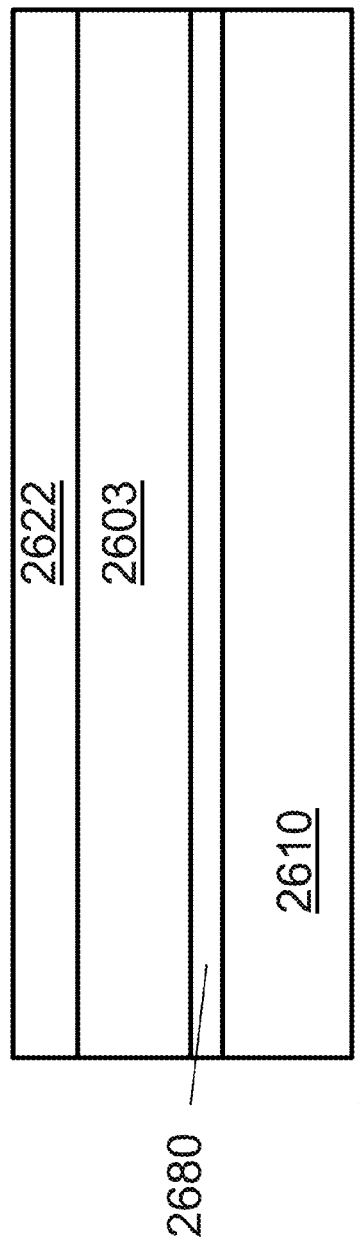

As illustrated in FIG. 26C, oxide layer 2680, N– doped layer 2603, and remaining N+ layer 2622 have been layer transferred to acceptor wafer 2610. The top surface of N+ layer 2622 may be chemically or mechanically polished. Now transistors may be formed with low temperature (less than approximately 400° C.) processing and aligned to the acceptor wafer alignment marks (not shown) as described in the incorporated references.

Figure 26D:
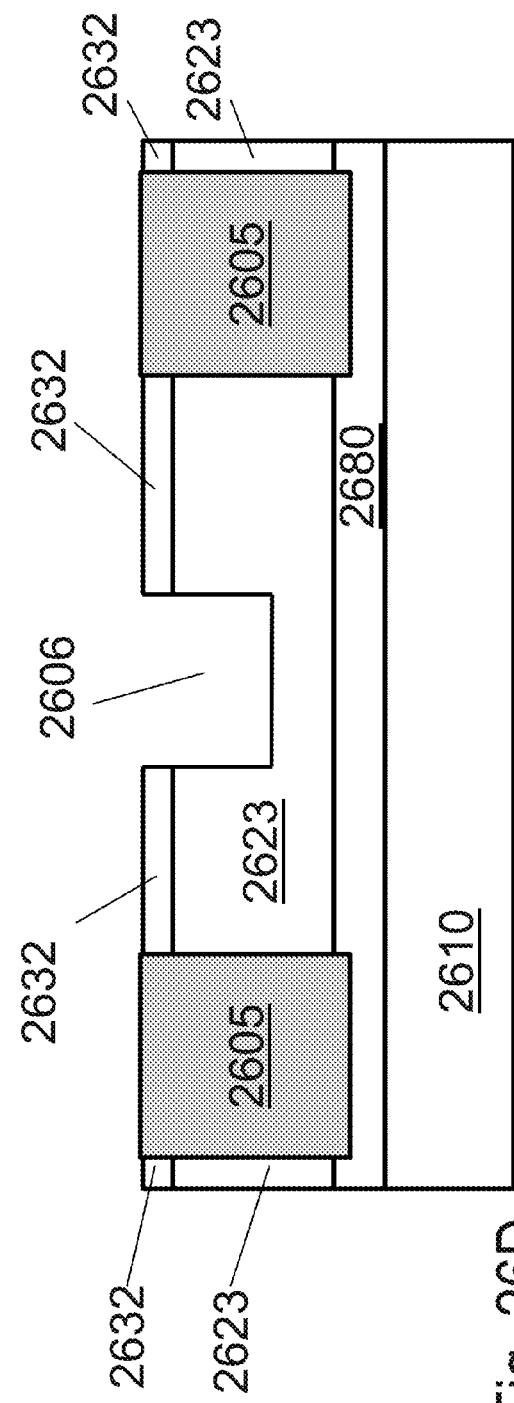

As illustrated in FIG. 26D, the transistor isolation regions 2605 may be formed by mask defining and plasma/RIE etching N+ layer 2622 and N– doped layer 2603 substantially to the top of oxide layer 2680 (not shown), substantially into oxide layer 2680, or into a portion of the upper oxide layer of acceptor wafer 2610 (not shown). A low-temperature gap fill oxide may be deposited and chemically mechanically polished, the oxide remaining in isolation regions 2605. The recessed channel 2606 may be mask defined and etched thru N+ doped layer 2622 and partially into N– doped layer 2603. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 2632 and N– channel region 2623 may be formed, which may substantially form the transistor body. The doping concentration of N+ source and drain regions 2632 may be more than 10× the concentration of N– channel region 2623. The doping concentration of the N– channel region 2623 may include gradients of concentration or layers of differing doping concentrations. The etch formation of recessed channel 2606 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of N– channel region 2623 in the region below recessed channel 2606 may be of a thickness that allows fully-depleted channel operation. The thickness of N– channel region 2623 in the region below N+ source and drain regions 2632 may be of a thickness that allows fully-depleted transistor operation.

Figure 26E:
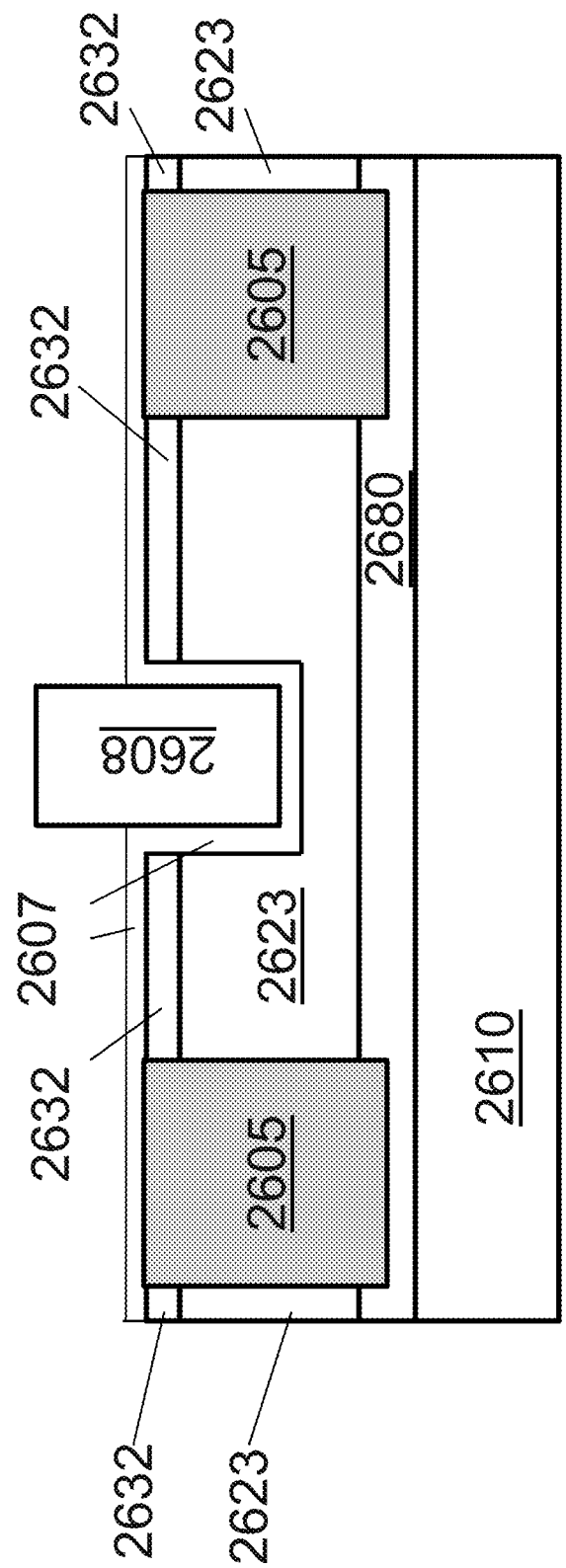

As illustrated in FIG. 26E, a gate dielectric 2607 may be formed and a gate metal material may be deposited. The gate dielectric 2607 may be an atomic layer deposited (ALD) gate dielectric that may be paired with a work function specific gate metal in the industry standard high k metal gate process schemes described in the incorporated references. Alternatively, the gate dielectric 2607 may be formed with a low temperature processes including, for example, oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 2608.

As illustrated in FIG. 26F, a low temperature thick oxide 2609 may be deposited and planarized, and source, gate, and drain contacts, and thru layer via (not shown) openings may be masked and etched preparing the transistors to be connected via metallization. Thus gate contact 2611 connects to gate electrode 2608, and source & drain contacts 2640 connect to N+ source and drain regions 2632. The thru layer via (not shown) provides electrical coupling among the donor wafer transistors and the acceptor wafer metal connect pads or strips (not shown) as described in the incorporated references.

The formation procedures of and use of the N+ source and drain regions 2632 that may have more than 10× the concentration of N− channel region 2623 may enable low contact resistance in a FinFet type transistor, wherein the thickness of the transistor channel is greater than the width of the channel, the transistor channel width being perpendicular to a line formed between the source and drain.

Persons of ordinary skill in the art will appreciate that the illustrations in FIGS. 26A through 26F are exemplary only and are not drawn to scale. Such skilled persons will further appreciate that many variations are possible such as, for example, a p-channel JL-RCAT may be formed with changing the types of dopings appropriately. Moreover, the N− substrate donor wafer 2600 may be p type. Further, N− doped layer 2603 may include multiple layers of different doping concentrations and gradients to fine tune the eventual JL-RCAT channel for electrical performance and reliability characteristics, such as, for example, off-state leakage current and on-state current. Furthermore, isolation regions 2605 may be formed by a hard mask defined process flow, wherein a hard mask stack, such as, for example, silicon oxide and silicon nitride layers, or silicon oxide and amorphous carbon layers, may be utilized. Moreover, CMOS JL-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, a back-gate or double gate structure may be formed for the JL-RCAT and may utilize techniques described in the incorporated references. Further, efficient heat removal and transistor body biasing may be accomplished on a JL-RCAT by adding an appropriately doped buried layer (P− in the case of a n-JL-RCAT), forming a buried layer region underneath the N− channel region 2623 for junction isolation, and connecting that buried region to a thermal and electrical contact, similar to what is described for layer 1606 and region 1646 in FIGS. 16A-G in the incorporated reference pending U.S. patent application Ser. No. 13/441,923. Many other modifications within the scope of the invention will suggest themselves to such skilled persons after reading this specification. Thus the invention is to be limited only by the appended claims.

When formation of a 3D-IC is discussed herein, crystalline layers, for example, two crystalline layers, 2504 and 2516, are utilized to form the monolithic 3D-IC, generally utilizing layer transfer techniques. Similarly, donor layers and acceptor layers of crystalline materials which are referred to and utilized in the referenced US patent documents including U.S. Patent Application Publication 2012/0129301 (allowed U.S. patent application Ser. No. 13/273,712) and pending U.S. patent application Ser. Nos. 13/441,923 and 13/099,010 may be utilized to form a monolithic 3D-IC, generally utilizing layer transfer techniques. The crystalline layers, whether donor or acceptor layer, may include regions of compound semiconductors, such as, for example, InP, GaAs, and/or GaN, and regions of mono-crystalline silicon and/or silicon dioxide. Heterogeneous integration with short interconnects between the compound semiconductor transistors and the silicon based transistors (such as CMOS) could be enabled by placing or constructing Si—CS hetero-layers into a monolithic 3D-IC structure.

As illustrated in FIG. 27, an exemplary Si—CS hetero donor or acceptor substrate may be formed by utilizing an engineered substrate, for example, SOLES as manufactured and offered for sale by SOITEC S.A. As illustrated in FIG. 27A, engineered substrate may include silicon substrate 2700, buried oxide layer 2702, compound semiconductor template layer 2704, for example, Germanium, oxide layer 2705, and silicon layer 2706, for example, mono-crystalline silicon.

As illustrated in FIG. 27B, regions of silicon layer 2706 may be mask defined and etched away, exposing regions of the top surface of compound semiconductor template layer 2704 and thus forming silicon regions 2707 and oxide regions 2715. High quality compound semiconductor regions 2708 may be epitaxially grown in the exposed regions of compound semiconductor template layer 2704. One example of compound semiconductor growth on an engineered substrate may be found in "Liu, W. K., et al., "Monolithic integration of InP-based transistors on Si substrates using MBE," J. Crystal Growth 311 (2009), pp. 1979-1983." Alternatively, an engineered substrate as described in FIG. 27A but without silicon layer 2706 may be utilized to eliminate the silicon layer removal etch.

Figure 27C:
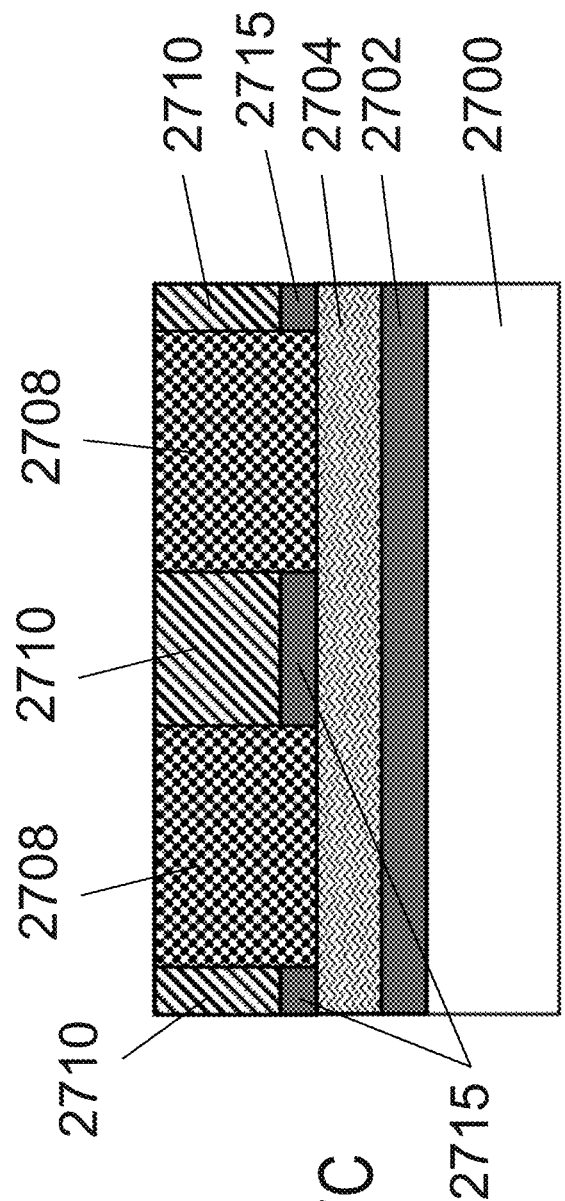

As illustrated in FIG. 27C, silicon regions 2707 may be mask defined and etched partially or fully away and oxide isolation regions 2710 may be formed by, for example, deposition, densification and etchback/planarization of an SACVD oxide such as in a typical STI (Shallow Trench Isolation) process. Alternatively, compound semiconductor template layer 2704 regions that may be below silicon regions 2707 may also be etched away and the oxide fill may proceed.

As illustrated in FIG. 28, alternatively, an exemplary Si—CS hetero donor or acceptor substrate may be formed by epitaxial growth directly on a silicon or SOI substrate. As illustrated in FIG. 28A, buffer layers 2802 may be formed on mono-crystalline silicon substrate 2800 and high quality compound semiconductor layers 2804 may be epitaxially grown on top of the surface of buffer layers 2802. Buffer layers 2802 may include, for example, MBE grown materials and layers that help match the lattice between the mono-crystalline silicon substrate 2800 and compound semiconductor layers 2804. For an InP HEMT, buffer layers 2802 may include an AlAs initiation layer, GaAs lattice matching layers, and a graded $In_xAl_{1-x}As$ buffer, 0<x<0.6. Compound semiconductor layers 2804 may include, for example, barrier, channel, and cap layers. One example of compound semiconductor growth directly on a mono-crystalline silicon substrate may be found in "Hoke, W. E., et al., "AlGaN/GaN high electron mobility transistors on 100 mm silicon substrates by plasma molecular beam epitaxy," Journal of Vacuum Science & Technology B: Microelectronics and Nanometer Structures, (29) 3, May 2011, pp. 03C107-03C107-5."

As illustrated in FIG. 28B, compound semiconductor layers 2804 and buffer layers 2802 may be mask defined and etched substantially away and oxide isolation regions 2810 may be formed by, for example, deposition, densification and etchback/planarization of an SACVD oxide such as in a typical STI (Shallow Trench Isolation) process. Thus, compound semiconductor regions 2808 and buffer regions 2805 may be formed.

The substrates formed and described in FIGS. 27 and 28 may be utilized in forming 3D-ICs, for example, as donor layers and/or acceptor layers of crystalline materials, as described in the referenced US patent documents including U.S. Patent Application Publication 2012/0129301 (allowed U.S. patent application Ser. No. 13/273,712) and pending U.S. patent application Ser. Nos. 13/441,923 and 13/099,010 generally by layer transfer techniques, such as, for example, ion-cut. For example, repetitive preformed transistor structures such as illustrated in at least FIGS. 32, 33, 73-80 and related specification sections in U.S. Patent Application Publication 2012/0129301 (allowed U.S. patent application Ser. No. 13/273,712) may be utilized on Si—CS substrates such as FIGS. 27B, 27C, and/or 28B to form stacked 3D-ICs wherein at least one layer may have compound semiconductor transistors. For example, non-repetitive transistor structures such as illustrated in at least FIGS. 57, 58, 65-68, 151, 152, 157, 158 and 160-161 and related specification sections in U.S. Patent Application Publication 2012/0129301 (allowed U.S. patent application Ser. No. 13/273,712) may be utilized on Si—CS substrates such as FIGS. 27A and/or 28A to form stacked 3D-ICs wherein at least one layer may have compound semiconductor transistors. Defect anneal techniques, such as those illustrated in at least FIGS. 184-189 and related specification sections in U.S. Patent Application Publication 2012/0129301 (allowed U.S. patent application Ser. No. 13/273,712) may be utilized to anneal and repair defects in the layer transferred, generally ion-cut, substrates of FIGS. 27 and 28 herein this document.

FIGS. 29A-H illustrate via cross section drawings the use of the Oxide-CS substrate of FIG. 27C to form a closely coupled but independently optimized silicon and compound semiconductor device stack by using layer transfer techniques. The oxide-CS substrate of FIG. 28B may also be utilized.

Figure 29A:
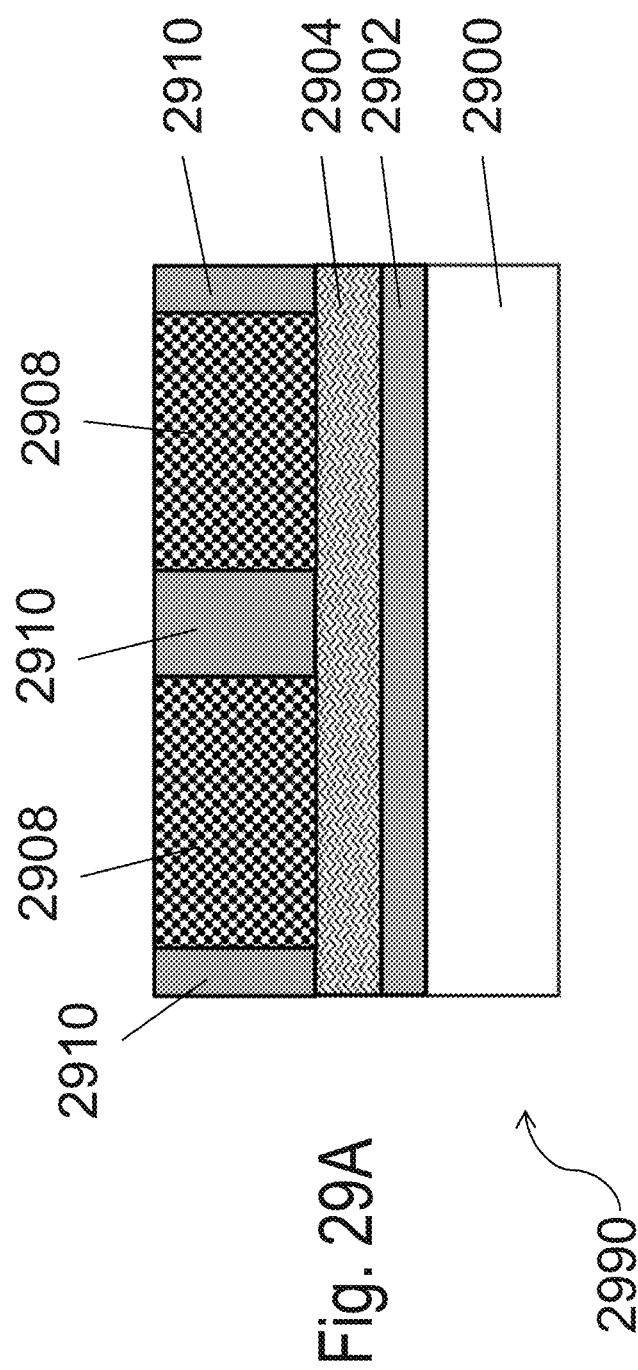

As illustrated in FIG. 29A, Oxide-CS engineered substrate 2990 may include silicon substrate 2900, buried oxide layer 2902, compound semiconductor template layer 2904, for example, Germanium, compound semiconductor regions 2908, and oxide isolation regions 2910. Oxide regions 2715 such as shown in FIG. 27C are omitted for clarity. Oxide-CS engineered substrate 2990 may include alignment marks (not shown).

Figure 29B:
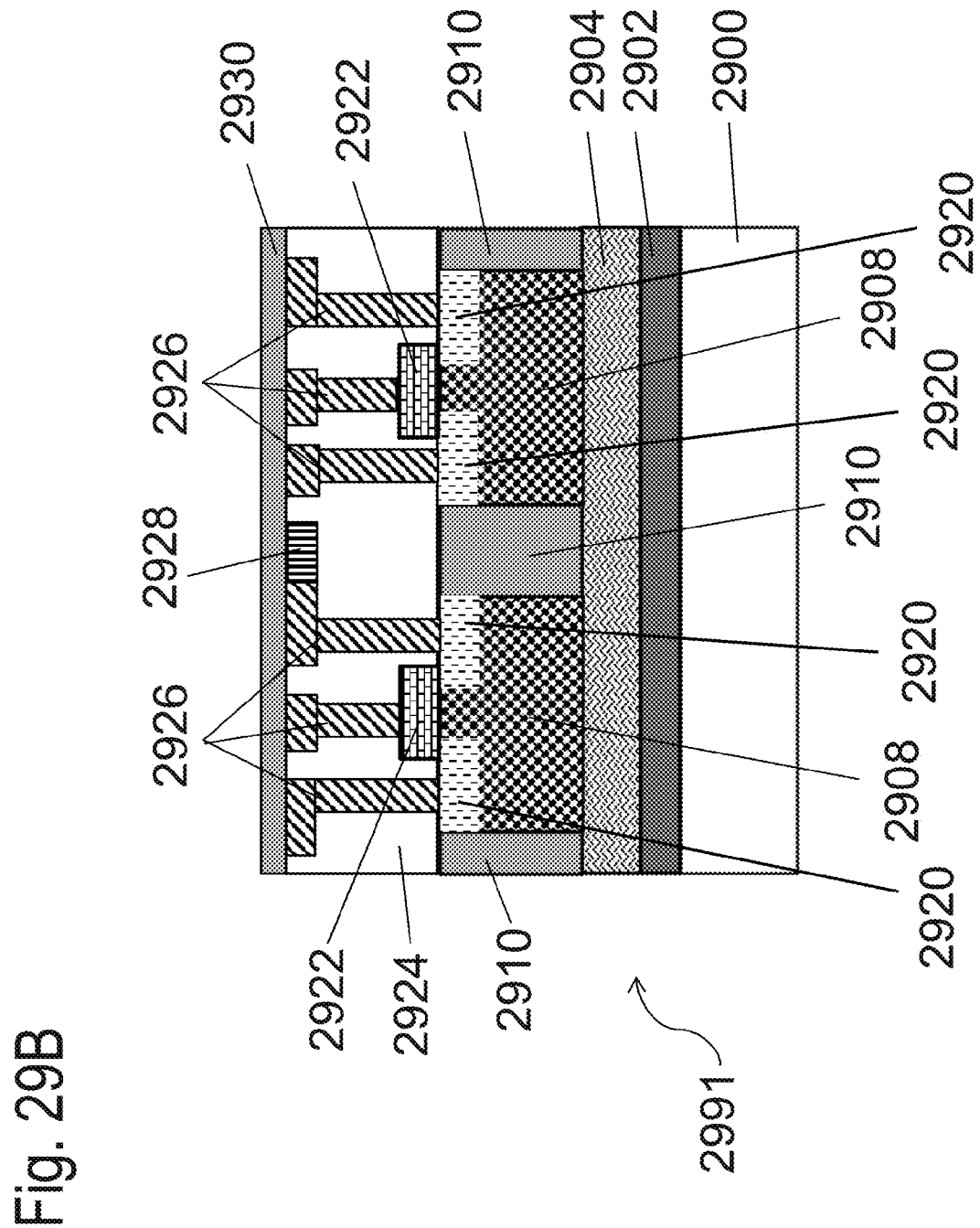

As illustrated in FIG. 29B, Oxide-CS engineered substrate 2990 may be processed to form compound semiconductor transistor, such as, for example, InP, GaAs, SiGe, GaN HEMTs and HBTs, and a metal interconnect layer or layers wherein the top metal interconnect layer may include a CS donor wafer orthogonal connect strip 2928. The details of the orthogonal connect strip methodology may be found as illustrated in at least FIGS. 30-33, 73-80, and 94 and related specification sections of U.S. Patent Application Publication 2012/0129301 (allowed U.S. patent application Ser. No. 13/273,712). The length of CS donor wafer orthogonal connect strip 2928 may be drawn/layed-out over and parallel to the oxide isolation regions 2910. CS donor wafer bonding oxide 2930 may be deposited in preparation for oxide-oxide bonding. Thus, CS donor substrate 2991 may include silicon substrate 2900, buried oxide layer 2902, compound semiconductor template layer 2904, compound semiconductor regions 2908, oxide isolation regions 2910, compound semiconductor transistor source and drain regions 2920, compound semiconductor transistor gate regions 2922, CS donor substrate metallization isolation dielectric regions 2924, CS donor substrate metal interconnect wire and vias 2926, CS donor wafer orthogonal connect strip 2928, and CS donor wafer bonding oxide 2930.

As illustrated in FIG. 29C, crystalline substrate 2940 may be processed to form transistors, such as, for example, mono-crystalline silicon PMOSFETs and NMOSFETs, and a metal interconnect layer or layers wherein the top metal interconnect layer may include a base substrate orthogonal connect strip 2949. The details of the orthogonal connect strip methodology may be found as illustrated in at least FIGS. 30-33, 73-80, and 94 and related specification sections of U.S. Patent Application Publication 2012/0129301 (allowed U.S. patent application Ser. No. 13/273,712). Crystalline substrate 2940 may include semiconductor materials such as mono-crystalline silicon. The base substrate orthogonal connect strip 2949 may be drawn/laid-out in an orthogonal and mid-point intersect crossing manner with respect to the CS donor wafer orthogonal connect strip 2928. Acceptor wafer bonding oxide 2932 may be deposited in preparation for oxide-oxide bonding. Thus, acceptor base substrate 2992 may include crystalline substrate 2940, well regions 2942, Shallow Trench Isolation (STI) regions 2944, transistor source and drain regions 2945, transistor gate stack regions 2946, base substrate metallization isolation dielectric regions 2947, base substrate metal interconnect wires and vias 2948, base substrate orthogonal connect strip 2949, and acceptor wafer bonding oxide 2932. Acceptor base substrate 2992 may include alignment marks (not shown).

Figure 29D:
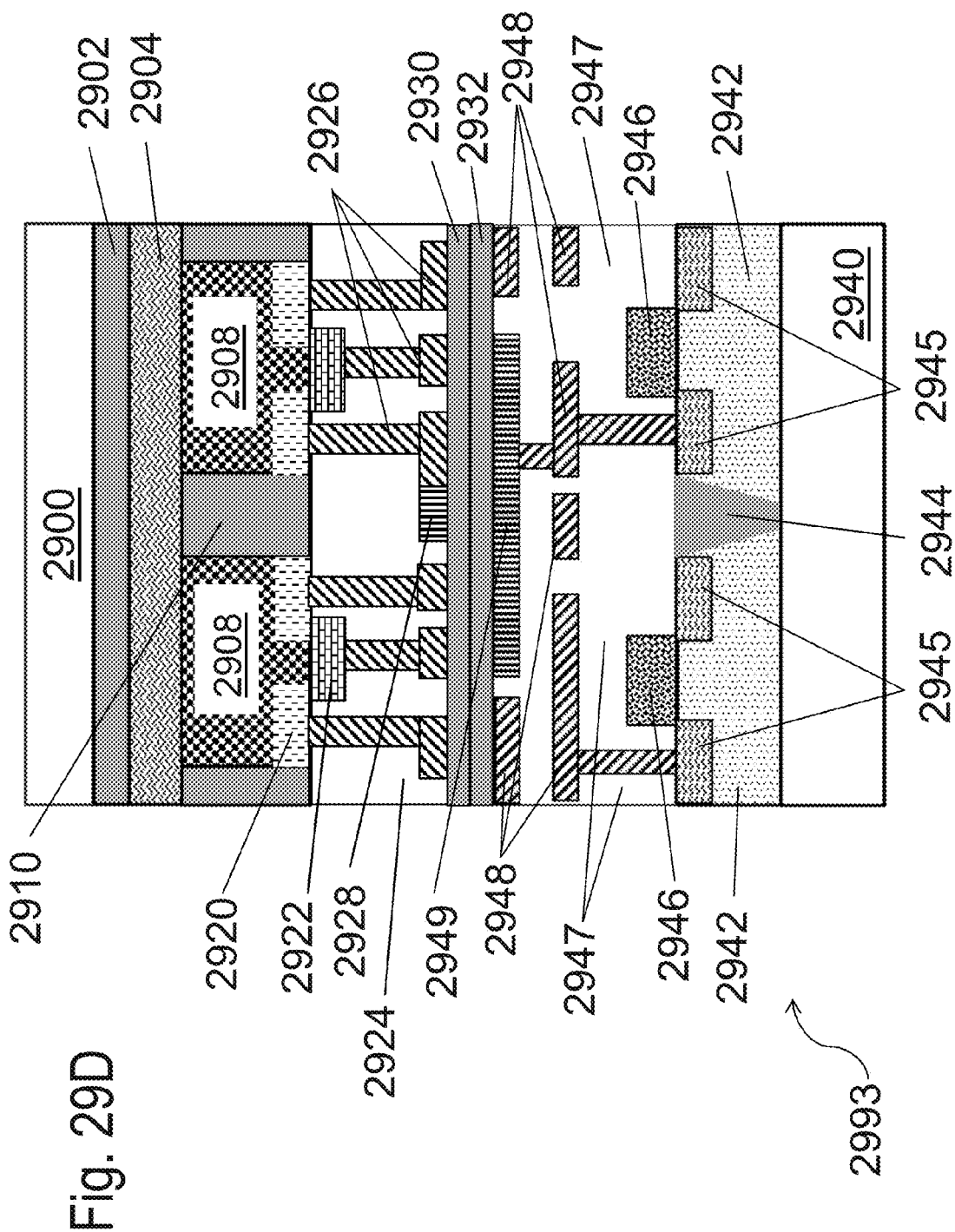

As illustrated in FIG. 29D, CS donor substrate 2991 may be flipped over, aligned (using information from alignment marks in CS donor substrate 2991 and acceptor base substrate 2992), and oxide to oxide bonded to acceptor base substrate 2992. The bonding may take place between the large area surfaces of acceptor wafer bonding oxide 2932 and CS donor wafer bonding oxide 2930. The bond may be made at low temperatures, such as less than about 400° C., so to protect the base substrate metallization and isolation structures. Thus, CS-base bonded substrate structure 2993 may be formed. The lengths of base substrate orthogonal connect strip 2949 and CS donor wafer orthogonal connect strip 2928 may be designed to compensate for misalignment of the wafer to wafer bonding process and other errors, as described in the referenced related specification cited previously. Pre-bond plasma pre-treatments and thermal anneals, such as a 250° C. anneal, may be utilized to strengthen the low temperature oxide-oxide bond.

Figure 29E:
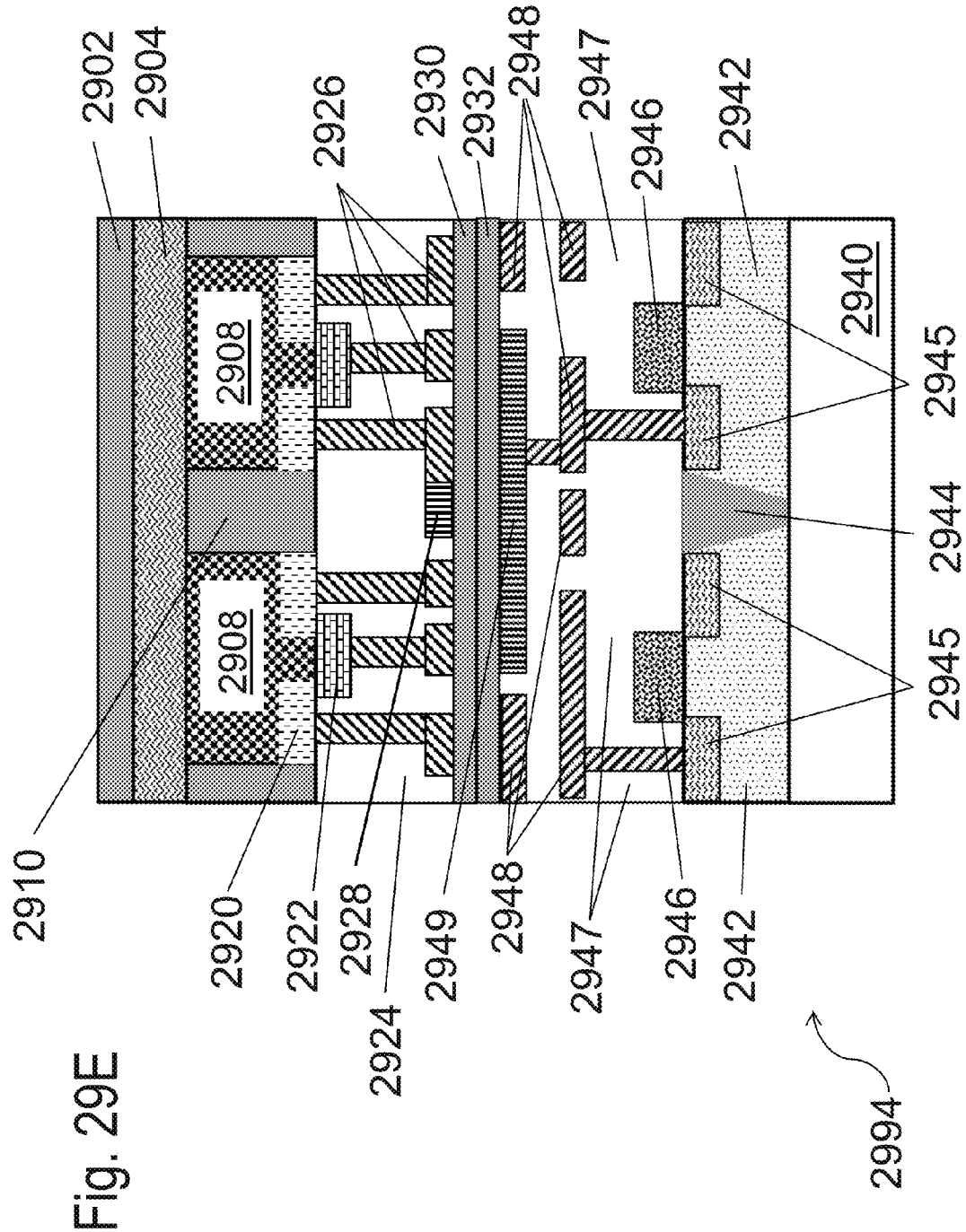

As illustrated in FIG. 29E, crystalline substrate 2940 of CS-base bonded substrate structure 2993 may be removed by processes such as wet etching crystalline substrate 2940 with warm KOH after protecting the sidewalls and backside of CS-base bonded substrate structure 2993 with, for example, resist and/or wax. Plasma, RIE, and/or CMP processes may also be employed. Thus CS-base bonded structure 2994 may be formed.

Figure 29F:
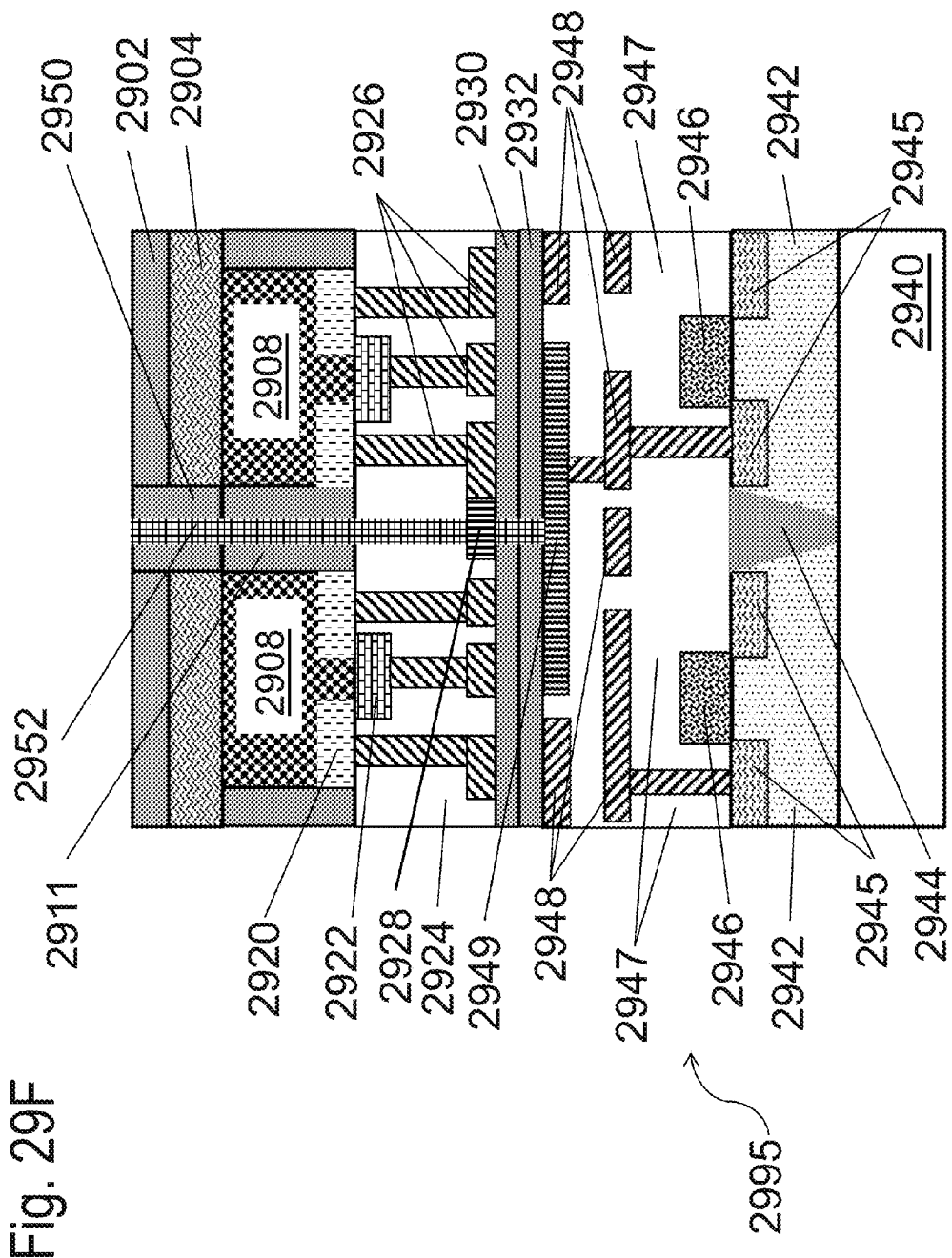
Figure 29G:
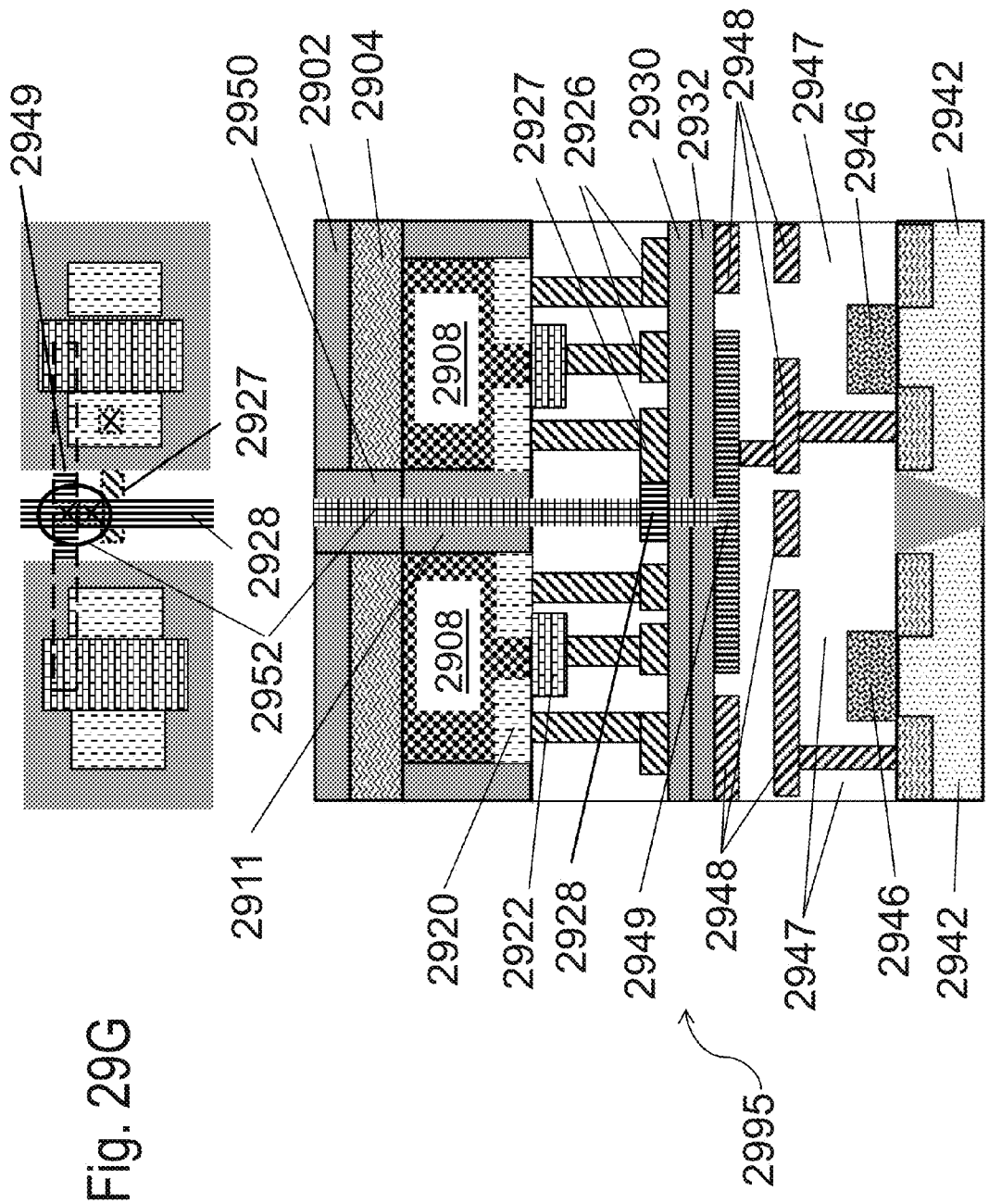
Figure 29H:
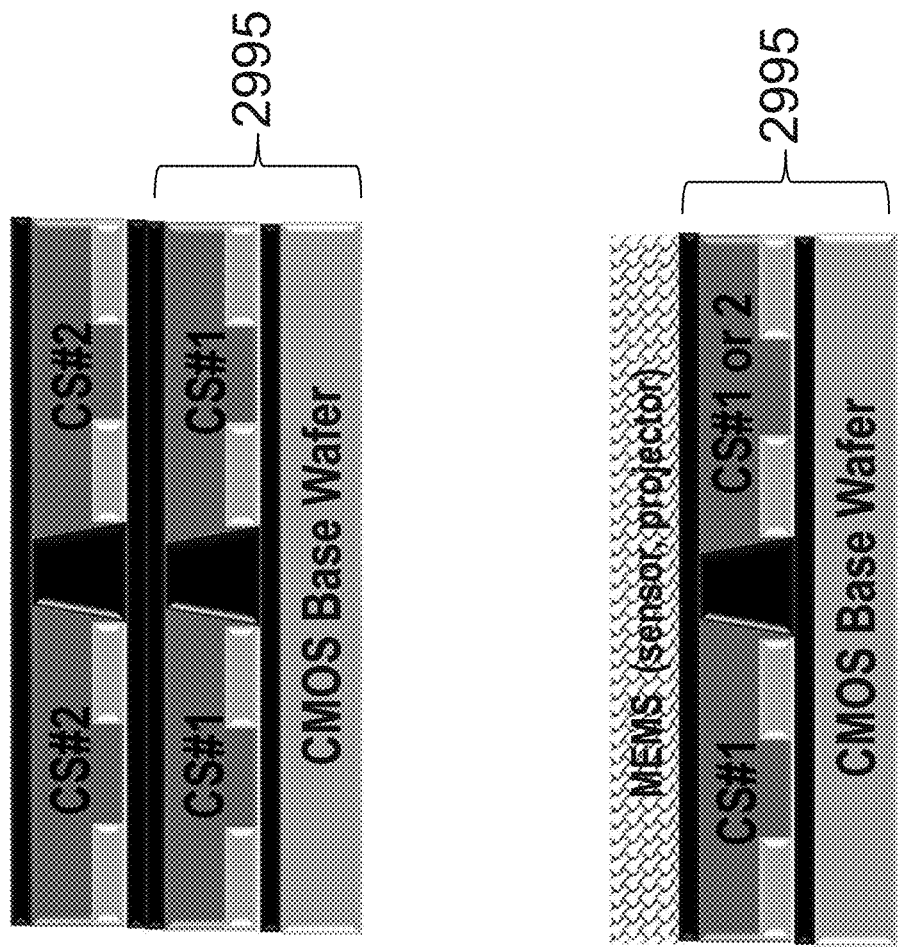

As illustrated in FIG. 29F, CS-base bonded structure 2994 may be processed to connect base substrate orthogonal connect strip 2949 to CS donor wafer orthogonal connect strip 2928 and thus form a short CS transistor to base CMOS transistor interconnect. Buried oxide layer 2902 and compound semiconductor template layer 2904 may be mask defined and etched substantially away in regions and oxide region 2950 may be formed by, for example, deposition, densification and etchback/planarization of a low temperature oxide, such as an SACVD oxide. Stitch via 2952 may be masked and etched through oxide region 2950, the indicated oxide isolation region 2910 (thus forming oxide regions 2911), CS donor substrate metallization isolation dielectric regions 2924, acceptor wafer bonding oxide 2932 and CS donor wafer bonding oxide 2930. Stitch via 2952 may be processed with a metal fill such as, for example, barrier metals such as TiN or CoN, and metal fill with Cu, W, or Al, and CMP polish to electrically (and physically) bridge or stitch base substrate orthogonal connect strip 2949 to CS donor wafer orthogonal connect strip 2928, thus forming a CS transistor to base CMOS transistor interconnect path. CS-base interconnected structure 2995 may thus be formed. FIG. 29G includes a top view of the CS-base interconnected structure 2995 showing stitch via 2952 connecting the base substrate orthogonal connect strip 2949 to CS donor wafer orthogonal connect strip 2928. Highlighted CS donor substrate metal interconnect CS source wire and via 2927 (one of the CS donor substrate metal interconnect wire and vias 2926) may provide the connection from the CS transistor to the CS donor wafer orthogonal connect strip 2928, which may be connected to the base substrate metal interconnect wires and vias 2948 (and thus the base substrate transistors) thru the stitch via 2952 and base substrate orthogonal connect strip 2949. Thus, a connection path may be formed between the CS transistor of the second, or donor, layer of the stack, and the CMOS transistors residing in the base substrate layer, or first layer. As illustrated in FIG. 29H top drawing, CS-base interconnected structure 2995 may be further processed to create orthogonal metal interconnect strips and stacking of a second CS transistor layer (thus the third layer in the stack) in a similar manner as described above in FIGS. 29A-F. Thus a third layer including CS#2 transistors, which may be a different type of CS transistor than the CS#1 transistors on the second layer, may be stacked and connected to the CS (#1) transistors of the second layer of CS-base interconnected structure 2995 and the CMOS transistors of the first layer of CS-base interconnected structure 2995. As illustrated in FIG. 29H bottom drawing, CS-base interconnected structure 2995 may be further processed to create orthogonal metal interconnect strips and stacking of a third layer in a similar manner as described above in FIGS. 29A-F, wherein that third layer may be a layer that includes, for example, MEMS sensor, image projector, SiGe transistors, or CMOS.

Persons of ordinary skill in the art will appreciate that the illustrations in FIG. 29 are exemplary and are not drawn to scale. Such skilled persons will further appreciate that many variations may be possible such as, for example, various types and structures of CS transistors may be formed and are not limited to the types and structures of transistors that may be suggested by the drawing illustrations. Moreover, non-repetitive transistor structures, techniques and formation process flows of CMOS and/or CS transistors at low temp on top of CMOS such as illustrated in at least FIGS. 57, 58, 65-68, 151, 152, 157, 158 and 160-161 and related specification sections in U.S. Patent Application Publication 2012/0129301 (allowed U.S. patent application Ser. No. 13/273,712) may be utilized. Further, during the backside etch step of FIG. 29E to remove crystalline substrate 2940, the etch may be continued (may switch chemistries, techniques) to remove buried oxide layer 2902 and partially or substantially remove compound semiconductor template layer 2904. Moreover, bonding methods other than oxide to oxide, such as oxide to metal, hybrid (metal and oxide to metal and oxide), may be utilized. Further, an ion-cut process may be used as part of the layer transfer process. Many other modifications within the scope of the illustrated embodiments of the invention will suggest themselves to such skilled persons after reading this specification. Thus the invention is to be limited only by the appended claims.

Figure 30:
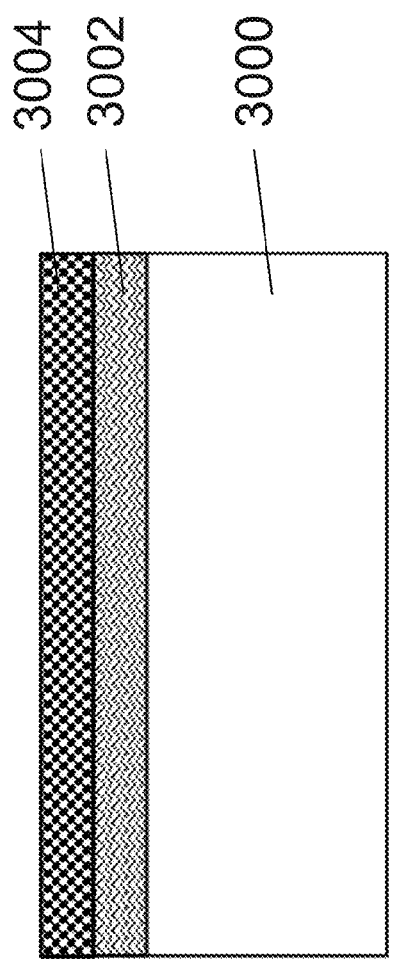
FIG. 30 is an exemplary drawing illustration of a partitioning of a circuit design into three layers of a 3D-IC.

Three dimensional devices offer a new possibility of partitioning designs into multiple layers or strata based various criteria, such as, for example, routing demands of device blocks in a design, lithographic process nodes, speed, cost, and density. Many of the criteria are illustrated in at least FIGS. 13, 210-215, and 239 and related specification sections in U.S. Patent Application Publication 2012/0129301 (allowed U.S. patent application Ser. No. 13/273,712), the contents are incorporated herein by reference. An additional criterion for partitioning decision-making may be one of trading cost for process complexity/attainment. For example, spacer based patterning techniques, wherein a lithographic critical dimension can be replicated smaller than the original image by single or multiple spacer depositions, spacer etches, and subsequent image (photoresist or prior spacer) removal, are becoming necessary in the industry to pattern smaller linewidths while still using the longer wavelength steppers and imagers. Other double, triple, and quad patterning techniques, such as pattern and cut, may also be utilized to overcome the lithographic constraints of the current imaging equipment. However, the spacer based and multiple patterning techniques are expensive to process and yield, and generally may be constraining to design and layout: they generally require regular patterns, sometimes substantially all parallel lines. An embodiment of the invention is to partition a design into those blocks and components that may be amenable and efficiently constructed by the above expensive patterning techniques onto one or more layers in the 3D-IC, and partition the other blocks and components of the design onto different layers in the 3D-IC. As illustrated in FIG. 30, third layer of circuits and transistors 3004 may be stacked on top of second layer of circuits and transistors 3002, which may be stacked on top of first layer/substrate of circuits and transistors 3000. The formation of, stacking, and interconnect within and between the three layers may be done by techniques described herein, in the incorporated by reference documents, or any other 3DIC stacking technique that can form vertical interconnects of a density greater than 10,000 vias/cm$^2$. Partitioning of the overall device between the three layers may, for example, consist of the first layer/substrate of circuits and transistors 3000 including the portion of the overall design wherein the blocks and components do not require the expensive patterning techniques discussed above; and second layer of circuits and transistors 3002 may include a portion of the overall design wherein the blocks and components require the expensive patterning techniques discussed above, and may be aligned in, for example, the 'x' direction, and third layer of circuits and transistors 3004 may include a portion of the overall design wherein the blocks and components require the expensive patterning techniques discussed above, and may be aligned in a direction different from second layer of circuits and transistors 3002, for example, the 'y' direction (perpendicular to the second layer's pattern). The partitioning constraint discussed above related to process complexity/attainment may be utilized in combination with other partitioning constraints to provide an optimized fit to the design's logic and cost demands. For example, the procedure and algorithm (illustrated in FIG. 239 and related specification found in the referenced patent document) to partition a design into two target technologies may be adapted to also include the constraints and criterion described herein FIG. 30.

Figure 31:
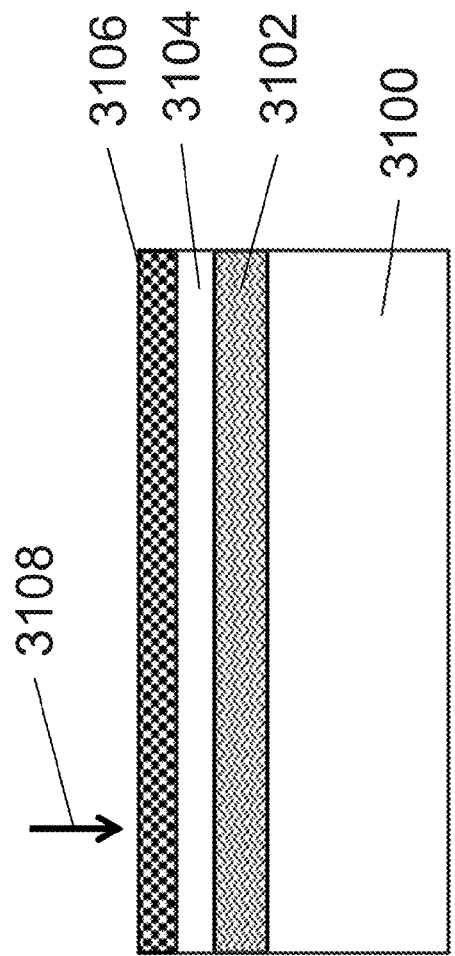
FIG. 31 is an exemplary drawing illustration of a carrier substrate with an integrated heat sink/spreader and/or optically reflective layer.

Ion implantation damage repair, and transferred layer annealing, such as activating doping, may utilize carrier wafer liftoff techniques as illustrated in at least FIGS. 184-189 and related specification sections in U.S. Patent Application Publication 2012/0129301 (allowed U.S. patent application Ser. No. 13/273,712), the contents are incorporated herein by reference. High temperature glass carrier substrates/wafers may be utilized, but may locally be structurally damaged or de-bond from the layer being annealed when exposed to LSA (laser spike annealing) or other optical anneal techniques that may locally exceed the softening or outgassing temperature threshold of the glass carrier. An embodiment of the invention is to improve the heat-sinking capability and structural strength of the glass carrier by inserting a layer of a material that may have a greater heat capacity and/or heat spreading capability than glass or fused quartz, and may have an optically reflective property, for example, aluminum, tungsten or forms of carbon such as carbon nanotubes. As illustrated in FIG. 31, carrier substrate 3199 may include substrate 3100, heat sink reflector material 3102, bonding material 3104, and desired transfer layer 3106. Substrate 3100 may include, for example, monocrystalline silicon wafers, high temperature glass or fused quartz wafers/ substrates, germanium wafers, InP wafers, or high temperature polymer substrates. Substrate 3100 may have a thickness greater than about 50 um, such as 100 um, 1000 um, 1 mm, 2 mm, 5 mm to supply structural integrity for the subsequent processing. Heat sink reflector material 3102 may include material that may have a greater heat capacity and/or heat spreading capability than glass or fused quartz, and may have an optically reflective property, for example, aluminum, tungsten, silicon based silicides, or forms of carbon such as carbon nanotubes. Bonding material 3104 may include silicon oxides, indium tin oxides, fused quartz, high temperature glasses, and other optically transparent to the LSA beam or optical annealing wavelength materials. Bonding material 3104 may have a thickness greater than about 5 nm, such as 10 nm, 20 nm, 100 nm, 200 nm, 300 nm, 500 nm. Desired transfer layer 3106 may include any layer transfer devices and/or layer or layers contained herein this document or the referenced document, for example, the gate-last partial transistor layers, DRAM Si/SiO2 layers, sub-stack layers of circuitry, RCAT doped layers, or starting material doped monocrystalline silicon. Carrier substrate 3199 may be exposed to an optical annealing beam, such as, for example, a laser-spike anneal beam from a commercial semiconductor material oriented single or dual-beam laser spike anneal DB-LSA system of Ultratech Inc., San Jose, Calif., USA or a short pulse laser (such as 160 ns), with 308 nm wavelength, such as offered by Excico of Gennevilliers, France. Optical anneal beam 3108 may locally heat desired transfer layer 3106 to anneal defects and/or activate dopants. The portion of the optical anneal beam 3108 that is not absorbed by desired transfer layer 3106 may pass through bonding material 3104 and be absorbed and or reflected by heat sink reflector material 3102. This may increase the efficiency of the optical anneal/activation of desired transfer layer 3106, and may also provide a heat spreading capability so that the temperature of desired transfer layer 3106 and bonding material 3104 locally near the optical anneal beam 3108, and in the beam's immediate past locations, may not exceed the debond temperature of the bonding material 3104 to desired transfer layer 3106 bond. The annealed and/or activated desired transfer layer 3106 may be layer transferred to an acceptor wafer or substrate, as described, for example, in the referenced patent document FIG. 186. Substrate 3100, heat sink reflector material 3102, and bonding material 3104 may be removed/decoupled from desired transfer layer 3106 by being etched away or removed during the layer transfer process.

A planar fully depleted n-channel Recessed Channel Array Transistor (FD-RCAT) suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an un-doped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. FIG. 32A-F illustrates an exemplary n-channel FD-RCAT which may be constructed in a 3D stacked layer using procedures outlined below and in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference.

As illustrated in FIG. 32A, a P− substrate donor wafer 3200 may be processed to include wafer sized layers of N+ doping 3202, P− doping 3206, channel 3203 and P+ doping 3204 across the wafer. The N+ doped layer 3202, P− doped layer 3206, channel layer 3203 and P+ doped layer 3204 may be formed by ion implantation and thermal anneal. P− substrate donor wafer 3200 may include a crystalline material, for example, mono-crystalline (single crystal) silicon. P− doped layer 3206 and channel layer 3203 may have additional ion implantation and anneal processing to provide a different dopant level than P− substrate donor wafer 3200. P− substrate donor wafer 3200 may be very lightly doped (less than 1e15 atoms/cm$^3$) or nominally un-doped (less than 1e14 atoms/cm$^3$). P− doped layer 3206, channel layer 3203, and P+ doped layer 3204 may have graded or various layers doping to mitigate transistor performance issues, such as, for example, short channel effects, after the FD-RCAT is formed, and to provide effective body biasing, whether adaptive or dynamic. The layer stack may alternatively be formed by successive epitaxially deposited doped silicon layers of N+ doped layer 3202, P− doped layer 3206, channel layer 3203 and P+ doped layer 3204, or by a combination of epitaxy and implantation Annealing of implants and doping may include, for example, conductive/inductive thermal, optical annealing techniques or types of Rapid Thermal Anneal (RTA or spike). The N+ doped layer 3202 may have a doping concentration that may be more than 10× the doping concentration of P− doped layer 3206 and/or channel layer 3203. The P+ doped layer 3204 may have a doping concentration that may be more than 10× the doping concentration of P− doped layer 3206 and/or channel layer 3203. The P− doped layer 3206 may have a doping concentration that may be more than 10× the doping concentration of channel layer 3203. Channel layer 3203 may have a thickness that may allow fully-depleted channel operation when the FD-RCAT transistor is substantially completely formed, such as, for example, less than 5 nm, less than 10 nm, or less than 20 nm.

As illustrated in FIG. 32B, the top surface of the P− substrate donor wafer 3200 layer stack may be prepared for oxide wafer bonding with a deposition of an oxide or by thermal oxidation of P+ doped layer 3204 to form oxide layer 3280. A layer transfer demarcation plane (shown as dashed line) 3299 may be formed by hydrogen implantation or other methods as described in the incorporated references. The P− substrate donor wafer 3200 and acceptor wafer 3210 may be prepared for wafer bonding as previously described and low temperature (less than approximately 400° C.) bonded. Acceptor wafer 3210, as described in the incorporated references, may include, for example, transistors, circuitry, and metal, such as, for example, aluminum or copper, interconnect wiring, a metal shield/heat sink layer, and thru layer via metal interconnect strips or pads. The portion of the N+ doped layer 3202 and the P− substrate donor wafer 3200 that may be above (when the layer stack is flipped over and bonded to the acceptor wafer) the layer transfer demarcation plane 3299 may be removed by cleaving or other low temperature processes as described in the incorporated references, such as, for example, ion-cut or other layer transfer methods.

As illustrated in FIG. 32C, oxide layer 3280, P+ doped layer 3204, channel layer 3203, P− doped layer 3206, and remaining N+ layer 3222 have been layer transferred to acceptor wafer 3210. The top surface of N+ layer 3222 may be chemically or mechanically polished. Now transistors may be formed with low temperature (less than approximately 400° C. exposure to the acceptor wafer 3210) processing and aligned to the acceptor wafer alignment marks (not shown) as described in the incorporated references.

As illustrated in FIG. 32D, the transistor isolation regions 3205 may be formed by mask defining and plasma/RIE etching remaining N+ layer 3222, P– doped layer 3206, channel layer 3203, and P+ doped layer 3204 substantially to the top of oxide layer 3280 (not shown), substantially into oxide layer 3280, or into a portion of the upper oxide layer of acceptor wafer 3210 (not shown). Additionally, a portion of the transistor isolation regions 3205 may be etched (separate step) substantially to P+ doped layer 3204, thus allowing multiple transistor regions to be connected by the same P+ doped region 3224. A low-temperature gap fill oxide may be deposited and chemically mechanically polished, the oxide remaining in isolation regions 3205. The recessed channel 3286 may be mask defined and etched thru remaining N+ doped layer 3222, P– doped layer 3206 and partially into channel layer 3203. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 3232, P– regions 3226, and channel region 3223 may be formed, which may substantially form the transistor body. The doping concentration of N+ source and drain regions 3232 may be more than 10× the concentration of channel region 3223. The doping concentration of the N– channel region 3223 may include gradients of concentration or layers of differing doping concentrations. The doping concentration of N+ source and drain regions 3232 may be more than 10× the concentration of P– regions 3226. The etch formation of recessed channel 3286 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 3223 in the region below recessed channel 3286 may be of a thickness that allows fully-depleted channel operation. The thickness of channel region 3223 in the region below N+ source and drain regions 3232 may be of a thickness that allows fully-depleted transistor operation.

Figure 32E:
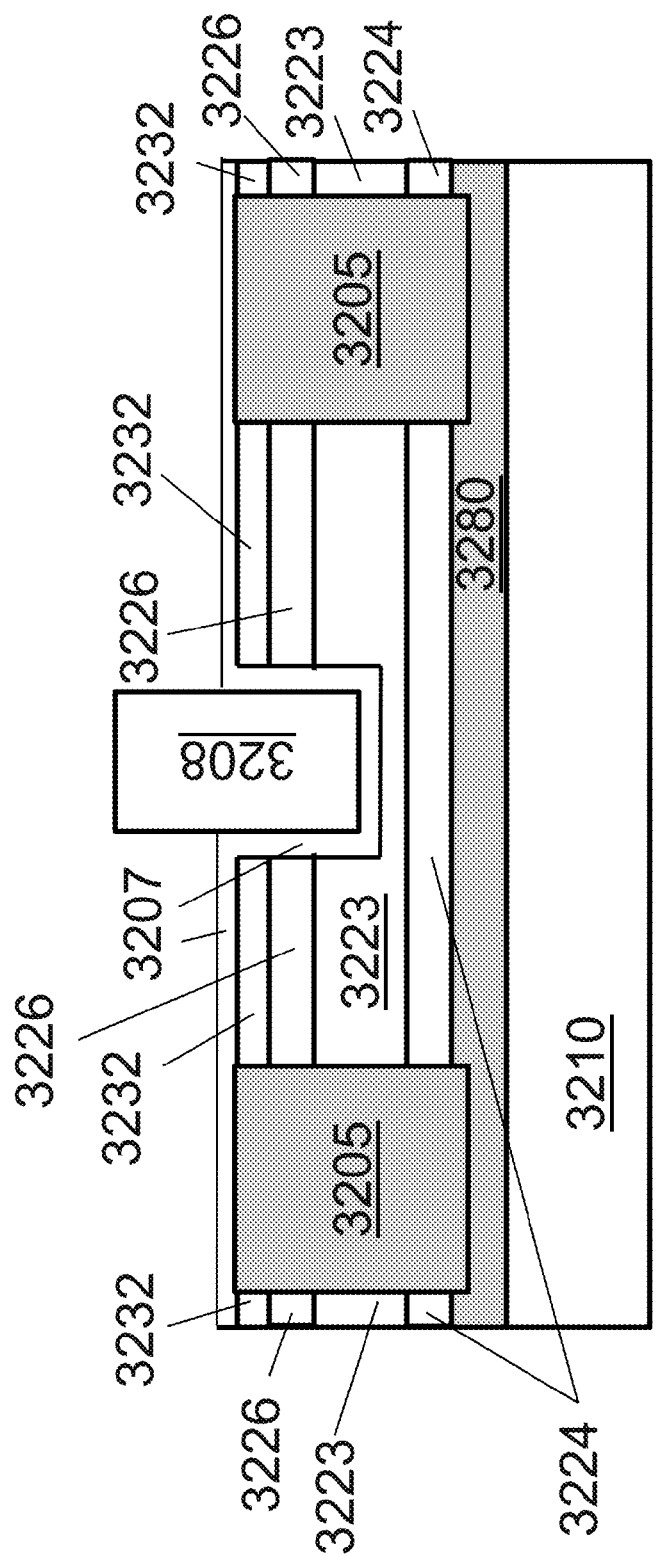

As illustrated in FIG. 32E, a gate dielectric 3207 may be formed and a gate metal material may be deposited. The gate dielectric 3207 may be an atomic layer deposited (ALD) gate dielectric that may be paired with a work function specific gate metal in the industry standard high k metal gate process schemes described in the incorporated references. Alternatively, the gate dielectric 3207 may be formed with a low temperature processes including, for example, oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 3208. The shape of gate electrode 3208 is illustrative, the gate electrode may also overlap a portion of N+ source and drain regions 3232.

Figure 32F:
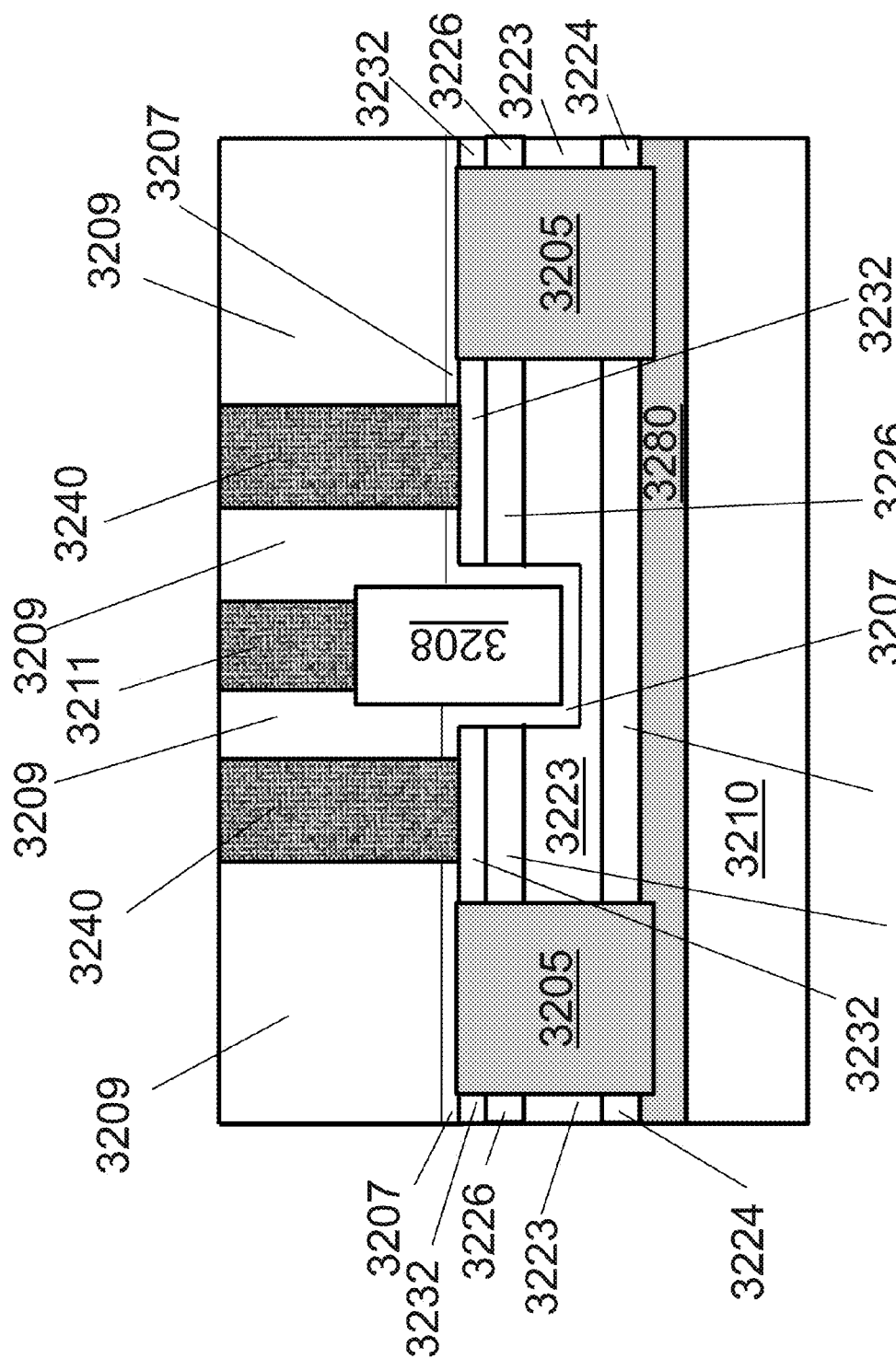

As illustrated in FIG. 32F, a low temperature thick oxide 3209 may be deposited and planarized, and source, gate, and drain contacts, P+ doped region contact (not shown) and thru layer via (not shown) openings may be masked and etched preparing the transistors to be connected via metallization. P+ doped region contact may be constructed thru isolation regions 3205, suitably when the isolation regions 3205 is formed to a shared P+ doped region 3224. Thus gate contact 3211 connects to gate electrode 3208, and source & drain contacts 3240 connect to N+ source and drain regions 3232. The thru layer via (not shown) provides electrical coupling among the donor wafer transistors and the acceptor wafer metal connect pads or strips (not shown) as described in the incorporated references.

Persons of ordinary skill in the art will appreciate that the illustrations in FIGS. 32A through 32F are exemplary only and are not drawn to scale. Such skilled persons will further appreciate that many variations are possible such as, for example, a p-channel FD-RCAT may be formed with changing the types of dopings appropriately. Moreover, the P– substrate donor wafer 3200 may be n type or un-doped. Further, P– doped channel layer 3203 may include multiple layers of different doping concentrations and gradients to fine tune the eventual FD-RCAT channel for electrical performance and reliability characteristics, such as, for example, off-state leakage current and on-state current. Furthermore, isolation regions 3205 may be formed by a hard mask defined process flow, wherein a hard mask stack, such as, for example, silicon oxide and silicon nitride layers, or silicon oxide and amorphous carbon layers, may be utilized. Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, P+ doped regions 3224 may be utilized for a double gate structure for the FD-RCAT and may utilize techniques described in the incorporated references. Further, efficient heat removal and transistor body biasing may be accomplished on a FD-RCAT by adding an appropriately doped buried layer (N– in the case of a n-FD-RCAT), forming a buried layer region underneath the P+ doped region 3224 for junction isolation, and connecting that buried region to a thermal and electrical contact, similar to what is described for layer 1606 and region 1646 in FIGS. 16A-G in the incorporated reference pending U.S. patent application Ser. No. 13/441,923. Many other modifications within the scope of the invention will suggest themselves to such skilled persons after reading this specification. Thus the invention is to be limited only by the appended claims.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting material layer or layers is incorporated between the sensitive metal interconnect layers and the layer or regions being optically irradiated and annealed, or annealed from the top of the 3D-IC stack using other methods. An exemplary generalized process flow is shown in FIGS. 33A-F. An exemplary process flow for an FD-RCAT with an integrated heat spreader is shown in FIGS. 34A-G. The 3D-ICs may be constructed in a 3D stacked layer using procedures outlined in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength) or a short pulse laser (such as 160 ns), with 308 nm wavelength, and large area irradiation such as offered by Excico of Gennevilliers, France, may be utilized. Additionally, the defect anneal may include, for example, laser anneals, Rapid Thermal Anneal (RTA), flash anneal, Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or reducing atmospheres (such as nitrogen or argon). The topside defect anneal may include temperatures of the layer being annealed above about 400° C. (a high temperature thermal anneal), including, for example, 600° C., 800° C., 900° C., 1000° C., 1050° C., 1100° C. and/or 1120° C. The topside defect anneal may include activation of semiconductor dopants, such as, for example, ion implanted dopants or PLAD applied dopants.

Figure 33A:
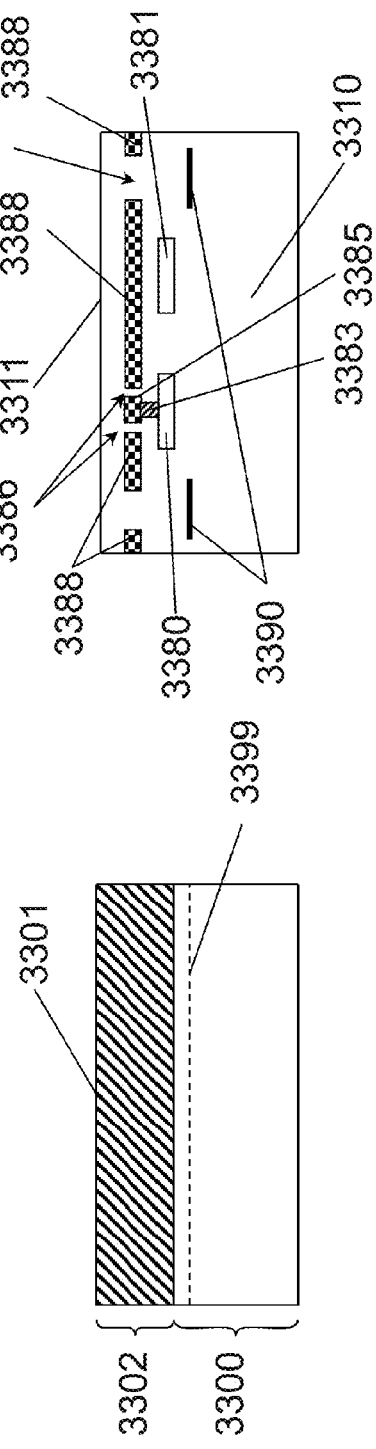

As illustrated in FIG. 33A, a generalized process flow may begin with a donor wafer 3300 that may be preprocessed with wafer sized layers 3302 of conducting, semi-conducting or insulating materials that may be formed by deposition, ion implantation and anneal, oxidation, epitaxial growth, combinations of above, or other semiconductor processing steps and methods. For example, donor wafer 3300 and wafer sized layers 3302 may include semiconductor materials such as, for example, mono-crystalline silicon, germanium, GaAs, InP, and graphene. For this illustration, mono-crystalline (single crystal) silicon may be used. The donor wafer 3300 may be preprocessed with a layer transfer demarcation plane (shown as dashed line) 3399, such as, for example, a hydrogen implant cleave plane, before or after (typical) wafer sized layers 3302 are formed. Layer transfer demarcation plane 3399 may alternatively be formed within wafer sized layers 3302. Other layer transfer processes, some described in the referenced patent documents, may alternatively be utilized. Damage/defects to crystalline structure of donor wafer 3300 may be annealed by some of the annealing methods described, for example the short wavelength pulsed laser techniques, wherein the donor wafer 3300 wafer sized layers 3302 and portions of donor wafer 3300 may be heated to defect annealing temperatures, but the layer transfer demarcation plane 3399 may be kept below the temperate for cleaving and/or significant hydrogen diffusion. Dopants in at least a portion of wafer sized layers 3302 may also be electrically activated. Thru the processing, donor wafer 3300 and/or wafer sized layers 3302 could be thinned from its original thickness, and their/its final thickness could be in the range of about 0.01 um to about 50 um, for example, 10 nm, 100 nm, 200 nm, 0.4 um, 1 um, 2 um or 5 um. Donor wafer 3300 and wafer sized layers 3302 may include preparatory layers for the formation of transistors such as, for example, MOSFETS, FinFets, FD-RCATs, BJTs, HEMTs, HBTs, or partially processed transistors (for example, the replacement gate process described in the referenced patent documents). Donor wafer 3300 and wafer sized layers 3302 may include the layer transfer devices and/or layer or layers contained herein this document or referenced patent documents, for example, DRAM Si/SiO2 layers, RCAT doped layers, or starting material doped or undoped monocrystalline silicon, or polycrystalline silicon. Donor wafer 3300 and wafer sized layers 3302 may have alignment marks (not shown). Acceptor wafer 3310 may be a preprocessed wafer that may have fully functional circuitry including metal layers (including aluminum or copper metal interconnect layers that may connect acceptor wafer 3310 transistors) or may be a wafer with previously transferred layers, or may be a blank carrier or holder wafer, or other kinds of substrates suitable for layer transfer processing. Acceptor wafer 3310 may have alignment marks 3390 and metal connect pads or strips 3380 and ray blocked metal interconnect 3381. Acceptor wafer 3310 may include transistors such as, for example, MOSFETS, FinFets, FD-RCATs, BJTs, HEMTs, and/or HBTs. Acceptor wafer 3310 may include shield/heat sink layer 3388, which may include materials such as, for example, Aluminum, Tungsten, Copper, silicon or cobalt based silicides, or forms of carbon such as carbon nanotubes. Shield/heat sink layer 3388 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 3388 may include isolation openings 3386, and alignment mark openings 3387, which may be utilized for short wavelength alignment of top layer (donor) processing to the acceptor wafer alignment marks 3390. Shield/heat sink layer 3388 may include shield path connect 3385 and shield path via 3383. Shield path via 3383 may thermally and/or electrically couple and connect shield path connect 3385 to acceptor wafer 3310 interconnect metallization layers such as, for example, metal connect pads or strips 3380 (shown). If two shield/heat sink layers 3388 are utilized, one on top of the other and separated by an isolation layer common in semiconductor BEOL, such as carbon doped silicon oxide, shield path connect 3385 may also thermally and/or electrically couple and connect each shield/heat sink layer 3388 to the other and to acceptor wafer 3310 interconnect metallization layers such as, for example, metal connect pads or strips 3380, thereby creating a heat conduction path from the shield/heat sink layer 3388 to the acceptor wafer substrate, and a heat sink (shown in FIG. 33F.).

Figure 33B:
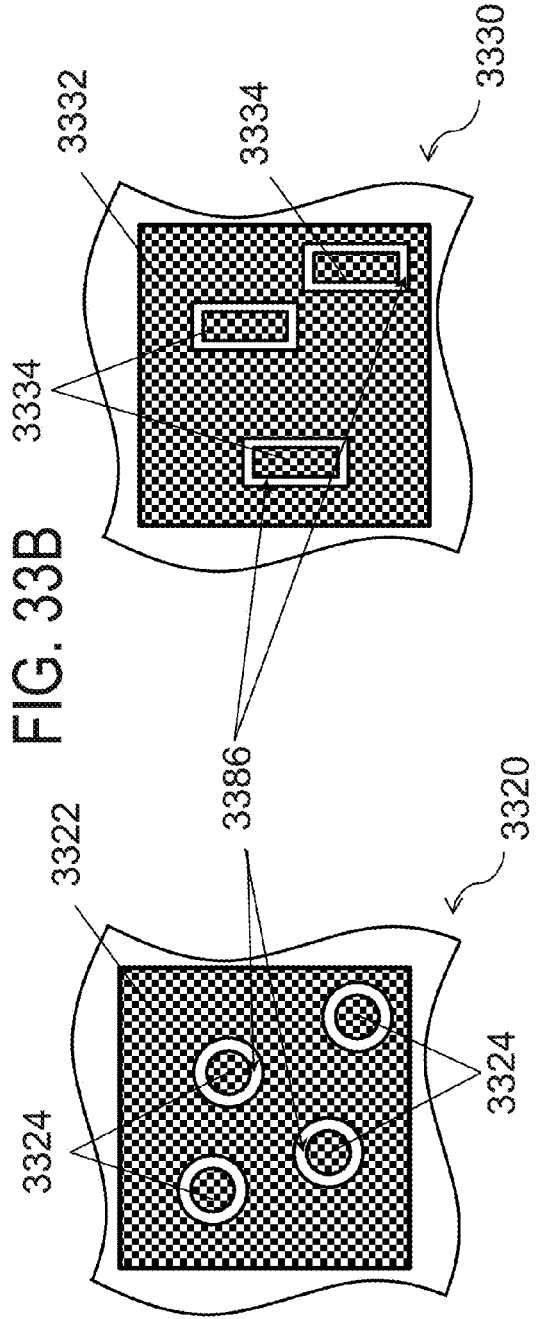

As illustrated in FIG. 33B, two exemplary top views of shield/heat sink layer 3388 are shown. In shield/heat sink portion 3320 a shield area 3322 of the shield/heat sink layer 3388 materials described above and in the incorporated references may include TLV/TSV connects 3324 and isolation openings 3386. Isolation openings 3386 may be the absence of the material of shield area 3322. TLV/TSV connects 3324 are an example of a shield path connect 3385. TLV/TSV connects 3324 and isolation openings 3386 may be drawn in the database of the 3D-IC stack and may formed during the acceptor wafer 3310 processing. In shield/heat sink portion 3330 a shield area 3332 of the shield/heat sink layer 3388 materials described above and in the incorporated references may have metal interconnect strips 3334 and isolation openings 3386. Metal interconnect strips 3334 may be surrounded by regions, such as isolation openings 3386, where the material of shield area 3332 may be etched away, thereby stopping electrical conduction from metal interconnect strips 3334 to shield area 3332 and to other metal interconnect strips. Metal interconnect strips 3334 may be utilized to connect/couple the transistors formed in the donor wafer layers, such as 3302, to themselves from the 'backside' or 'underside' and/or to transistors in the acceptor wafer level/layer. Metal interconnect strips 3334 and shield/heat sink layer 3388 regions such as shield area 3322 and shield area 3332 may be utilized as a ground plane for the transistors above it residing in the donor wafer layers.

Bonding surfaces, donor bonding surface 3301 and acceptor bonding surface 3311, may be prepared for wafer bonding by depositions (such as silicon oxide), polishes, plasma, or wet chemistry treatments to facilitate successful wafer to wafer bonding.

As illustrated in FIG. 33C, the donor wafer 3300 with wafer sized layers 3302 and layer transfer demarcation plane 3399 may be flipped over, aligned, and bonded to the acceptor wafer 3310. The donor wafer 3300 with wafer sized layers 3302 may have alignment marks (not shown). Various topside defect anneals may be utilized. For this illustration, an optical beam such as the laser annealing previously described is used. Optical anneal beams may be optimized to focus light absorption and heat generation at or near the layer transfer demarcation plane (shown as dashed line) 3399 to provide a hydrogen bubble cleave with exemplary cleave ray 3351. The laser assisted hydrogen bubble cleave with the absorbed heat generated by exemplary cleave ray 3351 may also include a pre-heat of the bonded stack to, for example, about 100° C. to about 400° C., and/or a thermal rapid spike to temperatures above about 200° C. to about 600° C. The laser assisted ion-cut cleave may provide a smoother cleave surface upon which better quality transistors may be manufactured. Reflected ray 3353 may be reflected and/or absorbed by shield/heat sink layer 3388 regions thus blocking the optical absorption of ray blocked metal interconnect 3381. Additionally, shield/heat sink layer 3388 may laterally spread and conduct the heat generated by the topside defect anneal, and in conjunction with the dielectric materials (low heat conductivity) above and below shield/heat sink layer 3388, keep the interconnect metals and low-k dielectrics of the acceptor wafer interconnect layers cooler than a damage temperature, such as, for example, 400 C Annealing of dopants or annealing of damage, such as from the H cleave implant damage, may be accomplished by a rays such as repair ray 3355. A small portion of the optical energy, such as unblocked ray 3357, may hit and heat, or be reflected, by (a few rays as the area of the heat shield openings, such as 3324, is small compared to the die or device area) such as metal connect pads or strips 3380. Heat generated by absorbed photons from, for example, cleave ray 3351, reflected ray 3353, and/or repair ray 3355 may also be absorbed by shield/heat sink layer 3388 regions and dissipated laterally and may keep the temperature of underlying metal layers, such as ray blocked metal interconnect 3381, and other metal layers below it, cooler and prevent damage. Shield/heat sink layer 3388 may act as a heat spreader. A second layer of shield/heat sink layer 3388 (not shown) may have been constructed (during the acceptor wafer 3310 formation) with a low heat conductive material sandwiched between the two heat sink layers, such as silicon oxide or carbon doped 'low-k' silicon oxides, for improved thermal protection of the acceptor wafer interconnect layers, metal and dielectrics. Electrically conductive materials may be used for the two layers of shield/heat sink layer 3388 and thus may provide, for example, a Vss and a Vdd plane for power delivery that may be connected to the donor layer transistors above, as well may be connected to the acceptor wafer transistors below. Shield/heat sink layer 3388 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 3388 may be sandwiched and/or substantially enclosed by materials with a low thermal conductivity less than 10 W/m-K, for example, silicon dioxide (about 1.4 W/m-K). The sandwiching of high and low thermal conductivity materials in layers, such as shield/heat sink layer 3388 and under & overlying dielectric layers, spreads the localized heat/light energy of the topside anneal laterally and protect the underlying layers of interconnect metallization & dielectrics, such as in the acceptor wafer, from harmful temperatures or damage.

As illustrated in FIG. 33D, the donor wafer 3300 may be cleaved at or thinned to (or past, not shown) the layer transfer demarcation plane 3399, leaving donor wafer portion 3303 and the pre-processed layers 3302 bonded to the acceptor wafer 3310, by methods such as, for example, ion-cut or other layer transfer methods. The layer transfer demarcation plane 3399 may instead be placed in the pre-processed layers 3302. Optical anneal beams may be optimized to focus light absorption and heat generation within or at the surface of donor wafer portion 3303 and provide surface smoothing and/or defect annealing (defects may be from the cleave and/or the ion-cut implantation) with exemplary smoothing/annealing ray 3366. The laser assisted smoothing/annealing with the absorbed heat generated by exemplary smoothing/annealing ray 3366 may also include a pre-heat of the bonded stack to, for example, about 100° C. to about 400° C., and/or a thermal rapid spike to temperatures above about 200° C. to about 600° C. Reflected ray 3363 may be reflected and/or absorbed by shield/heat sink layer 3388 regions thus blocking the optical absorption of ray blocked metal interconnect 3381. Annealing of dopants or annealing of damage, such as from the H cleave implant damage, may be also accomplished by a set of rays such as repair ray 3365. A small portion of the optical energy, such as unblocked ray 3367, may hit and heat, or be reflected, by a few rays (as the area of the heat shield openings, such as 3324, is small) such as metal connect pads or strips 3380. Heat generated by absorbed photons from, for example, smoothing/annealing ray 3366, reflected ray 3363, and/or repair ray 3365 may also be absorbed by shield/heat sink layer 3388 regions and dissipated laterally and may keep the temperature of underlying metal layers, such as ray blocked metal interconnect 3381, and other metal layers below it, cooler and prevent damage. A second layer of shield/ heat sink layer 3388 may be constructed with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 3388 may act as a heat spreader. Electrically conductive materials may be used for the two layers of shield/heat sink layer 3388 and thus may provide, for example, a Vss and a Vdd plane that may be connected to the donor layer transistors above, as well may be connected to the acceptor wafer transistors below.

Figure 33F:
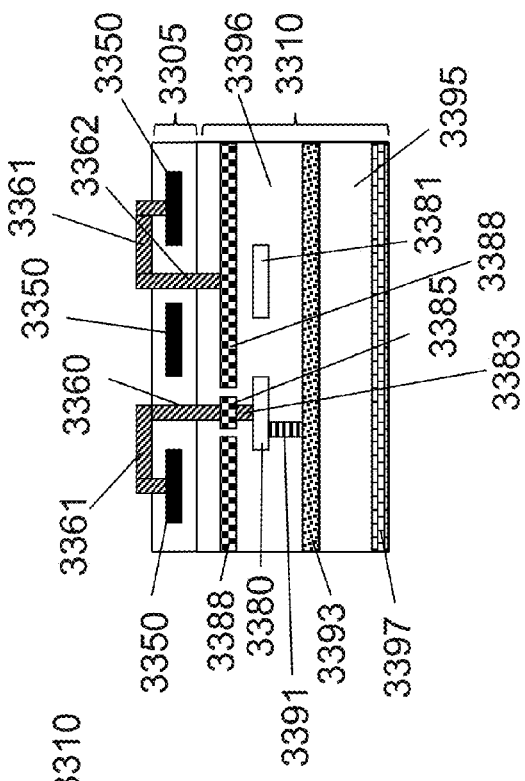
Figure 33E:
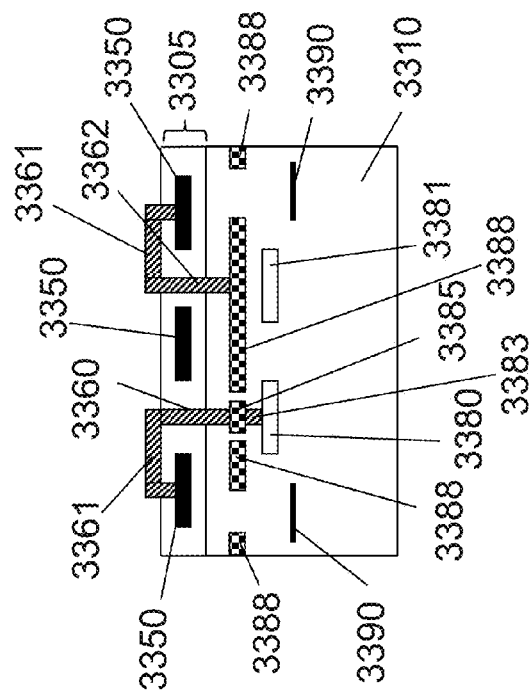

As illustrated in FIG. 33E, the remaining donor wafer portion 3303 may be removed by polishing or etching and the transferred layers 3302 may be further processed to create second device layer 3305 which may include donor wafer device structures 3350 and metal interconnect layers (such as second device layer metal interconnect 3361) that may be precisely aligned to the acceptor wafer alignment marks 3390. Donor wafer device structures 3350 may include, for example, CMOS transistors such as N type and P type transistors, or any of the other transistor or device types discussed herein this document or referenced patent documents. Second device layer metal interconnect 3361 may include electrically conductive materials such as copper, aluminum, conductive forms of carbon, and tungsten. Donor wafer device structures 3350 may utilize second device layer metal interconnect 3361 and thru layer vias (TLVs) 3360 to electrically couple (connection paths) the donor wafer device structures 3350 to the acceptor wafer metal connect pads or strips 3380, and thus couple donor wafer device structures (the second layer transistors) with acceptor wafer device structures (first layer transistors). Thermal TLVs 3362 may be constructed of thermally conductive but not electrically conductive materials, for example, DLC (Diamond Like Carbon), and may connect donor wafer device structures 3350 thermally to shield/heat sink layer 3388. TLVs 3360 may be constructed out of electrically and thermally conductive materials, such as Tungsten, Copper, or aluminum, and may provide a thermal and electrical connection path from donor wafer device structures 3350 to shield/heat sink layer 3388, which may be a ground or Vdd plane in the design/layout. TLVs 3360 and thermal TLVs 3362 may be also constructed in the device scribelanes (predesigned in base layers or potential dicelines) to provide thermal conduction to the heat sink, and may be sawed/diced off when the wafer is diced for packaging. Shield/heat sink layer 3388 may be configured to act as an emf (electro-motive force) shield to prevent direct layer to layer cross-talk between transistors in the donor wafer layer and transistors in the acceptor wafer. In addition to static ground or Vdd biasing, shield/heat sink layer 3388 may be actively biased with an anti-interference signal from circuitry residing on, for example, a layer of the 3D-IC or off chip. TLVs 3360 may be formed through the transferred layers 3302. As the transferred layers 3302 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 3302, the smaller the thru layer via diameter obtainable, which may result from maintaining manufacturable via aspect ratios. Thus, the transferred layers 3302 (and hence, TLVs 3360) may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable obtainable lithographic resolution, such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. Transferred layers 3302 may be considered to be overlying the metal layer or layers of acceptor wafer 3310. Alignment marks in acceptor wafer 3310 and/or in transferred layers 3302 may be utilized to enable reliable contact to transistors and circuitry in transferred layers 3302 and donor wafer device structures 3350 and electrically couple them to the transistors and circuitry in the acceptor wafer 3310. The donor wafer 3300 may now also be processed, such as smoothing and annealing, and reused for additional layer transfers.

As illustrated in FIG. 33F, a thermal conduction path may be constructed from the devices in the upper layer, the transferred donor layer and formed transistors, to the acceptor wafer substrate and associated heat sink. The thermal conduction path from the donor wafer device structures 3350 to the acceptor wafer heat sink 3397 may include second device layer metal interconnect 3361, TLVs 3360, shield path connect 3385, shield path via 3383, metal connect pads or strips 3380, first (acceptor) layer metal interconnect 3391, acceptor wafer transistors and devices 3393, and acceptor substrate 3395. The elements of the thermal conduction path may include materials that have a thermal conductivity greater than 10 W/m-K, for example, copper (about 400 W/m-K), aluminum (about 237 W/m-K), and Tungsten (about 173 W/m-K). The acceptor wafer interconnects may be substantially surrounded by BEOL dielectric 3396.

A planar fully depleted n-channel Recessed Channel Array Transistor (FD-RCAT) with an integrated shield/heat sink layer suitable for a monolithic 3D IC may be constructed as follows. The FD-RCAT may provide an improved source and drain contact resistance, thereby allowing for lower channel doping (such as undoped), and the recessed channel may provide for more flexibility in the engineering of channel lengths and transistor characteristics, and increased immunity from process variations. The buried doped layer and channel dopant shaping, even to an un-doped channel, may allow for efficient adaptive and dynamic body biasing to control the transistor threshold and threshold variations, as well as provide for a fully depleted or deeply depleted transistor channel. Furthermore, the recessed gate allows for an FD transistor but with thicker silicon for improved lateral heat conduction. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 34A-G illustrates an exemplary n-channel FD-RCAT which may be constructed in a 3D stacked layer using procedures outlined below and in U.S. Patent Application Publication 2012/0129301 (allowed U.S. patent application Ser. No. 13/273,712) and pending U.S. patent application Ser. Nos. 13/441,923 and 13/099,010. The contents of the foregoing applications are incorporated herein by reference.

Figure 34A:
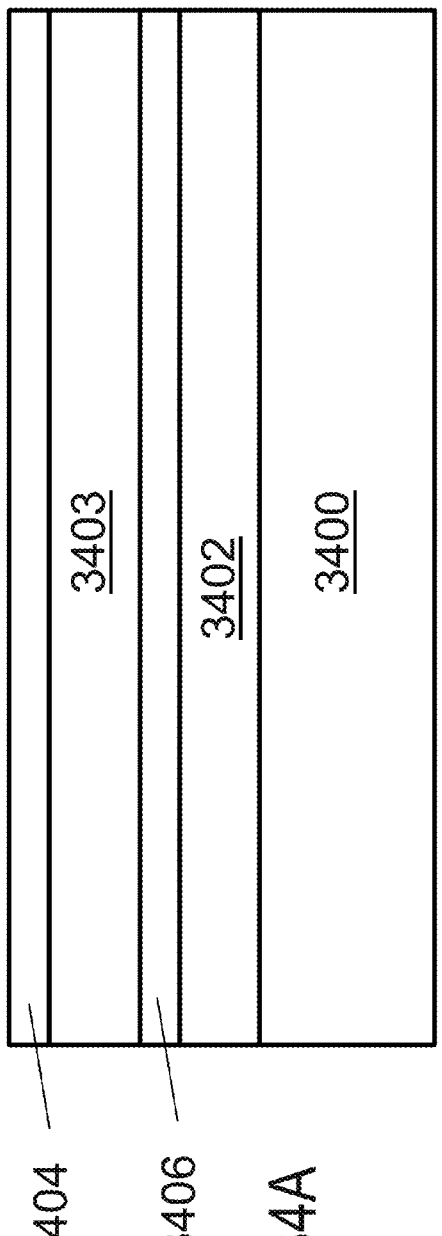

As illustrated in FIG. 34A, a P− substrate donor wafer 3400 may be processed to include wafer sized layers of N+ doping 3402, P− doping 3406, channel 3403 and P+ doping 3404 across the wafer. The N+ doped layer 3402, P− doped layer 3406, channel layer 3403 and P+ doped layer 3404 may be formed by ion implantation and thermal anneal. P− substrate donor wafer 3400 may include a crystalline material, for example, mono-crystalline (single crystal) silicon. P− doped layer 3406 and channel layer 3403 may have additional ion implantation and anneal processing to provide a different dopant level than P− substrate donor wafer 3400. P− substrate donor wafer 3400 may be very lightly doped (less than 1e15 atoms/cm$^3$) or nominally un-doped (less than 1e14 atoms/cm$^3$). P− doped layer 3406, channel layer 3403, and P+ doped layer 3404 may have graded or various layers doping to mitigate transistor performance issues, such as, for example, short channel effects, after the FD-RCAT is formed, and to provide effective body biasing, whether adaptive or dynamic. The layer stack may alternatively be formed by successive epitaxially deposited doped silicon layers of N+ doped layer 3402, P− doped layer 3406, channel layer 3403 and P+ doped layer 3404, or by a combination of epitaxy and implantation, or by layer transfer Annealing of implants and doping may include, for example, conductive/inductive thermal, optical annealing techniques or types of Rapid Thermal Anneal (RTA or spike). The N+ doped layer 3402 may have a doping concentration that may be more than 10× the doping concentration of P– doped layer 3406 and/or channel layer 3403. The P+ doped layer 3404 may have a doping concentration that may be more than 10× the doping concentration of P– doped layer 3406 and/or channel layer 3403. The P– doped layer 3406 may have a doping concentration that may be more than 10× the doping concentration of channel layer 3403. Channel layer 3403 may have a thickness that may allow fully-depleted channel operation when the FD-RCAT transistor is substantially completely formed, such as, for example, less than 5 nm, less than 10 nm, or less than 20 nm.

Figure 34B:
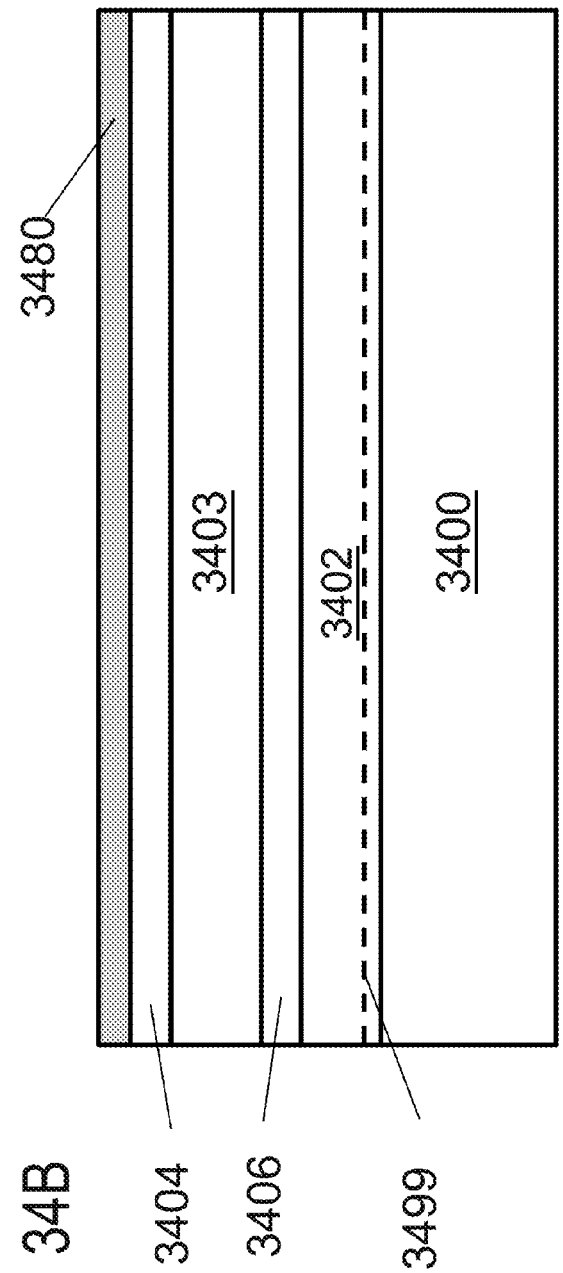

As illustrated in FIG. 34B, the top surface of the P– substrate donor wafer 3400 layer stack may be prepared for oxide wafer bonding with a deposition of an oxide or by thermal oxidation of P+ doped layer 3404 to form oxide layer 3480. A layer transfer demarcation plane (shown as dashed line) 3499 may be formed by hydrogen implantation or other methods as described in the incorporated references. The P– substrate donor wafer 3400 and acceptor wafer 3410 may be prepared for wafer bonding as previously described and low temperature (less than approximately 400° C.) bonded. Acceptor wafer 3410, as described in the incorporated references, may include, for example, transistors, circuitry, and metal, such as, for example, aluminum or copper, interconnect wiring, a metal shield/heat sink layer, and thru layer via metal interconnect strips or pads. Acceptor wafer 3410 may include transistors such as, for example, MOSFETS, FinFets, FD-RCATs, BJTs, HEMTs, and/or HBTs. The portion of the N+ doped layer 3402 and the P– substrate donor wafer 3400 that may be above (when the layer stack is flipped over and bonded to the acceptor wafer) the layer transfer demarcation plane 3499 may be removed by cleaving or other low temperature processes as described in the incorporated references, such as, for example, ion-cut or other layer transfer methods. Damage/defects to crystalline structure of N+ doped layer 3402, P– doped layer 3406, channel layer 3403 and P+ doped layer 3404 may be annealed by some of the annealing methods described, for example the short wavelength pulsed laser techniques, wherein the N+ doped layer 3402, P– doped layer 3406, channel layer 3403 and P+ doped layer 3404 or portions of them may be heated to defect annealing temperatures, but the layer transfer demarcation plane 3499 may be kept below the temperate for cleaving and/or significant hydrogen diffusion. The optical energy may be deposited in the upper layer of the stack, for example in P+ doped layer 3404, and annealing of the other layer may take place via heat diffusion. Dopants in at least a portion of N+ doped layer 3402, P– doped layer 3406, channel layer 3403 and P+ doped layer 3404 may also be electrically activated by the anneal.

As illustrated in FIG. 34C, oxide layer 3480, P+ doped layer 3404, channel layer 3403, P– doped layer 3406, and remaining N+ layer 3422 have been layer transferred to acceptor wafer 3410. The top surface of N+ layer 3422 may be chemically or mechanically polished. Thru the processing, the wafer sized layers such as N+ layer 3422 P+ doped layer 3404, channel layer 3403, and P– doped layer 3406, could be thinned from its original total thickness, and their/its final total thickness could be in the range of about 0.01 um to about 50 um, for example, 10 nm, 100 nm, 200 nm, 0.4 um, 1 um, 2 um or 5 um. Acceptor wafer 3410 may include one or more (two are shown in this example) shield/heat sink layers 3488, which may include materials such as, for example, Aluminum, Tungsten, Copper, silicon or cobalt based silicides, or forms of carbon such as carbon nanotubes. Each shield/heat sink layer 3488 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 3488 may include isolation openings 3487, and alignment mark openings (not shown), which may be utilized for short wavelength alignment of top layer (donor) processing to the acceptor wafer alignment marks (not shown). Shield/heat sink layer 3488 may include one or more shield path connect 3485 and shield path via 3483. Shield path via 3483 may thermally and/or electrically couple and connect shield path connect 3485 to acceptor wafer 3410 interconnect metallization layers such as, for example, acceptor metal interconnect 3481 (shown). Shield path connect 3485 may also thermally and/or electrically couple and connect each shield/heat sink layer 3488 to the other and to acceptor wafer 3410 interconnect metallization layers such as, for example, acceptor metal interconnect 3481, thereby creating a heat conduction path from the shield/heat sink layer 3488 to the acceptor substrate 3495, and a heat sink (shown in FIG. 34G.). Isolation openings 3486 may include dielectric materials, similar to those of BEOL isolation 3496. Acceptor wafer 3410 may include first (acceptor) layer metal interconnect 3491, acceptor wafer transistors and devices 3493, and acceptor substrate 3495. Various topside defect anneals may be utilized. For this illustration, an optical beam such as the laser annealing previously described is used. Optical anneal beams may be optimized to focus light absorption and heat generation within or at the surface of N+ layer 3422 and provide surface smoothing and/or defect annealing (defects may be from the cleave and/or the ion-cut implantation) with exemplary smoothing/annealing ray 3466. The laser assisted smoothing/annealing with the absorbed heat generated by exemplary smoothing/annealing ray 3466 may also include a pre-heat of the bonded stack to, for example, about 100° C. to about 400° C., and/or a rapid thermal spike to temperatures above about 200° C. to about 600° C. Reflected ray 3463 may be reflected and/or absorbed by shield/heat sink layer 3488 regions thus blocking the optical absorption of ray blocked metal interconnect 3481. Annealing of dopants or annealing of damage, such as from the H cleave implant damage, may be also accomplished by a set of rays such as repair ray 3465. Heat generated by absorbed photons from, for example, smoothing/annealing ray 3466, reflected ray 3463, and/or repair ray 3465 may also be absorbed by shield/heat sink layer 3488 regions and dissipated laterally and may keep the temperature of underlying metal layers, such as metal interconnect 3481, and other metal layers below it, cooler and prevent damage. Shield/heat sink layer 3488 and associated dielectrics may laterally spread and conduct the heat generated by the topside defect anneal, and in conjunction with the dielectric materials (low heat conductivity) above and below shield/heat sink layer 3488, keep the interconnect metals and low-k dielectrics of the acceptor wafer interconnect layers cooler than a damage temperature, such as, for example, 400° C. A second layer of shield/heat sink layer 3488 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 3488 may act as a heat spreader. Electrically conductive materials may be used for the two layers of shield/heat sink layer 3488 and thus may provide, for example, a Vss and a Vdd plane that may be connected to the donor layer transistors above, as well may be connected to the acceptor wafer transistors below. Shield/heat sink layer 3488 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 3488 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 3488 and under & overlying dielectric layers, spreads the localized heat/light energy of the topside anneal laterally and protect the underlying layers of interconnect metallization & dielectrics, such as in the acceptor wafer, from harmful temperatures or damage. Now transistors may be formed with low temperature (less than approximately 400° C. exposure to the acceptor wafer 3410) processing, and may be aligned to the acceptor wafer alignment marks (not shown) as described in the incorporated references. The donor wafer 3400 may now also be processed, such as smoothing and annealing, and reused for additional layer transfers.

Figure 34D:
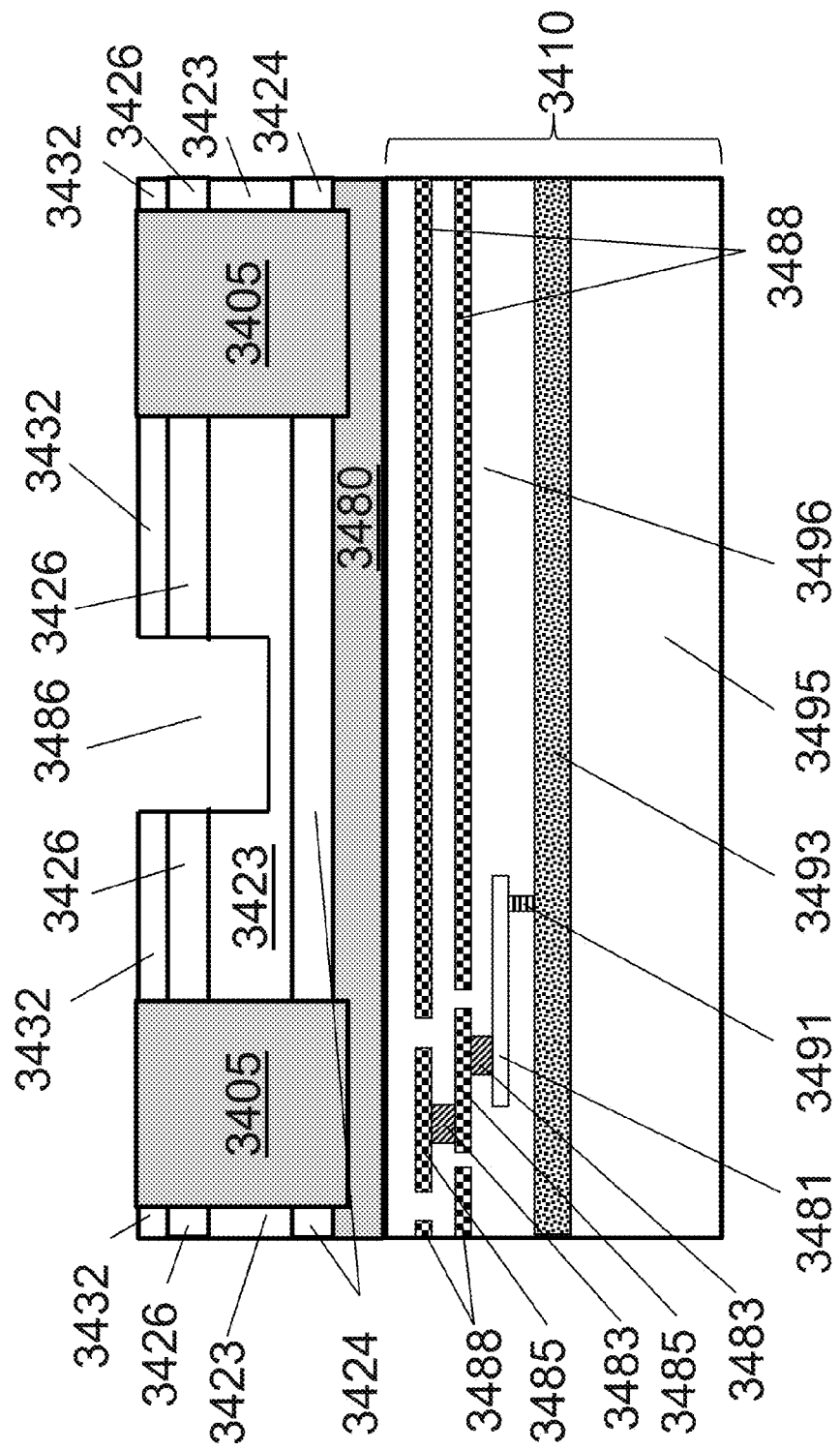

As illustrated in FIG. 34D, transistor isolation regions 3405 may be formed by mask defining and plasma/RIE etching remaining N+ layer 3422, P− doped layer 3406, channel layer 3403, and P+ doped layer 3404 substantially to the top of oxide layer 3480 (not shown), substantially into oxide layer 3480, or into a portion of the upper oxide layer of acceptor wafer 3410 (not shown). Additionally, a portion of the transistor isolation regions 3405 may be etched (separate step) substantially to P+ doped layer 3404, thus allowing multiple transistor regions to be connected by the same P+ doped region 3424. A low-temperature gap fill oxide may be deposited and chemically mechanically polished, the oxide remaining in isolation regions 3405. The recessed channel 3486 may be mask defined and etched thru remaining N+ doped layer 3422, P− doped layer 3406 and partially into channel layer 3403. The recessed channel surfaces and edges may be smoothed by processes, such as, for example, wet chemical, plasma/RIE etching, low temperature hydrogen plasma, or low temperature oxidation and strip techniques, to mitigate high field effects. The low temperature smoothing process may employ, for example, a plasma produced in a TEL (Tokyo Electron Labs) SPA (Slot Plane Antenna) machine. Thus N+ source and drain regions 3432, P− regions 3426, and channel region 3423 may be formed, which may substantially form the transistor body. The doping concentration of N+ source and drain regions 3432 may be more than 10× the concentration of channel region 3423. The doping concentration of the N− channel region 3423 may include gradients of concentration or layers of differing doping concentrations. The doping concentration of N+ source and drain regions 3432 may be more than 10× the concentration of P− regions 3426. The etch formation of recessed channel 3486 may define the transistor channel length. The shape of the recessed etch may be rectangular as shown, or may be spherical (generally from wet etching, sometimes called an S-RCAT: spherical RCAT), or a variety of other shapes due to etching methods and shaping from smoothing processes, and may help control for the channel electric field uniformity. The thickness of channel region 3423 in the region below recessed channel 3486 may be of a thickness that allows fully-depleted channel operation. The thickness of channel region 3423 in the region below N+ source and drain regions 3432 may be of a thickness that allows fully-depleted transistor operation.

Figure 34E:
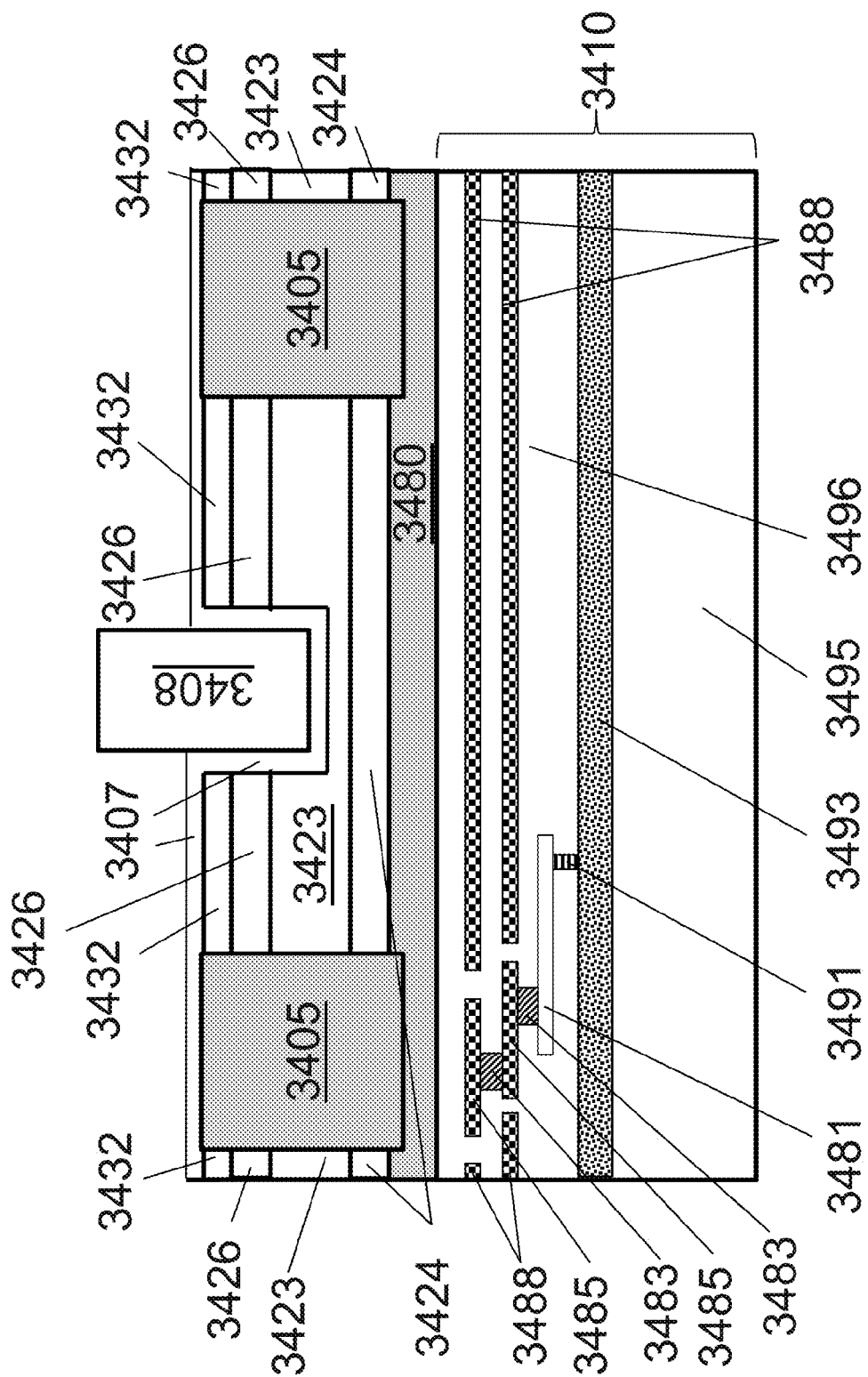

As illustrated in FIG. 34E, a gate dielectric 3407 may be formed and a gate metal material may be deposited. The gate dielectric 3407 may be an atomic layer deposited (ALD) gate dielectric that may be paired with a work function specific gate metal in the industry standard high k metal gate process schemes described in the incorporated references. Alternatively, the gate dielectric 3407 may be formed with a low temperature processes including, for example, oxide deposition or low temperature microwave plasma oxidation of the silicon surfaces and a gate material with proper work function and less than approximately 400° C. deposition temperature such as, for example, tungsten or aluminum may be deposited. The gate material may be chemically mechanically polished, and the gate area defined by masking and etching, thus forming the gate electrode 3408. The shape of gate electrode 3408 is illustrative, the gate electrode may also overlap a portion of N+ source and drain regions 3432.

Figure 34F:
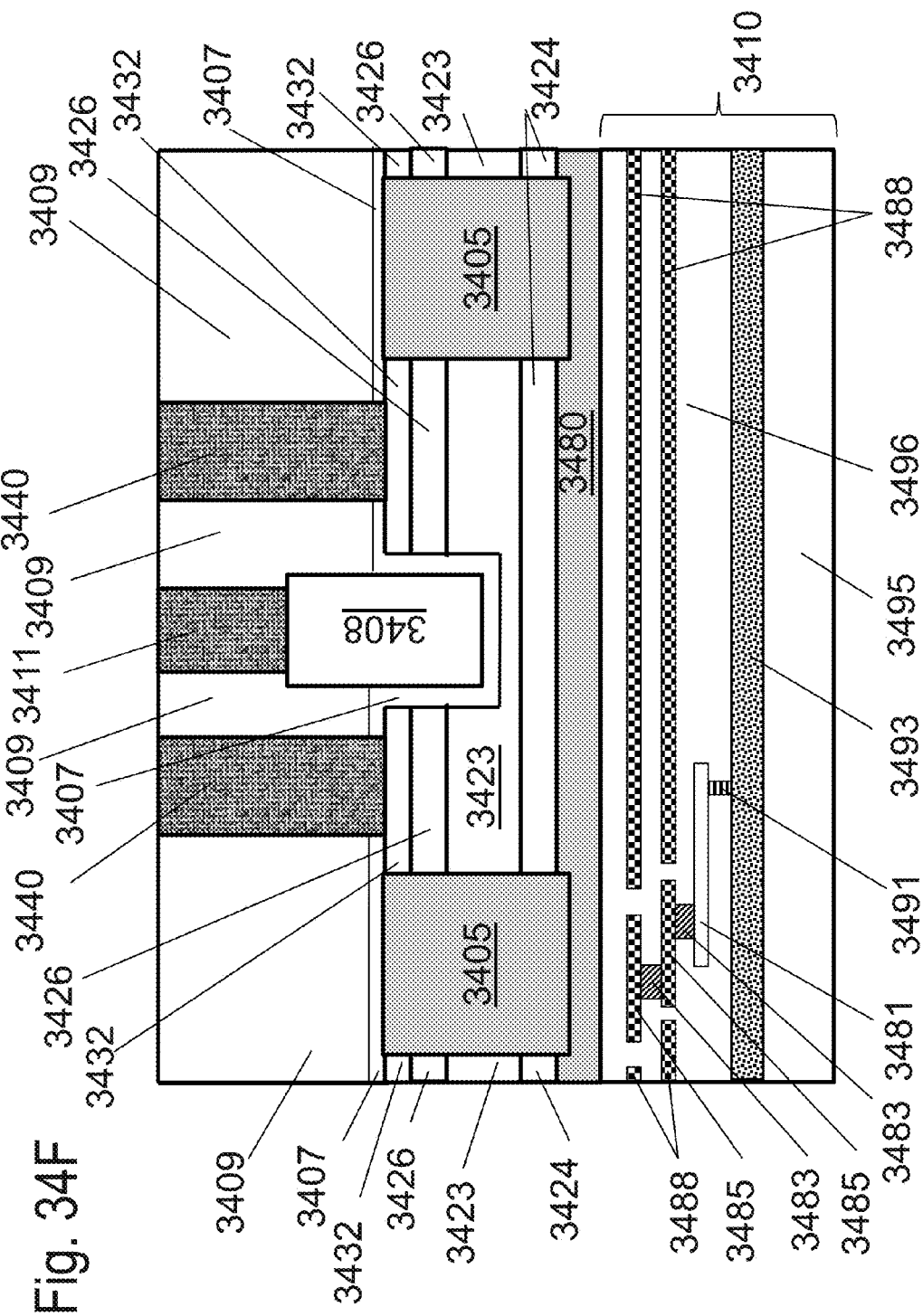

As illustrated in FIG. 34F, a low temperature thick oxide 3409 may be deposited and planarized, and source, gate, and drain contacts, P+ doped region contact (not shown) and thru layer via (not shown) openings may be masked and etched preparing the transistors to be connected via metallization. P+ doped region contact may be constructed thru isolation regions 3405, suitably when the isolation regions 3405 is formed to a shared P+ doped region 3424. Thus gate contact 3411 connects to gate electrode 3408, and source & drain contacts 3440 connect to N+ source and drain regions 3432.

Figure 34G:
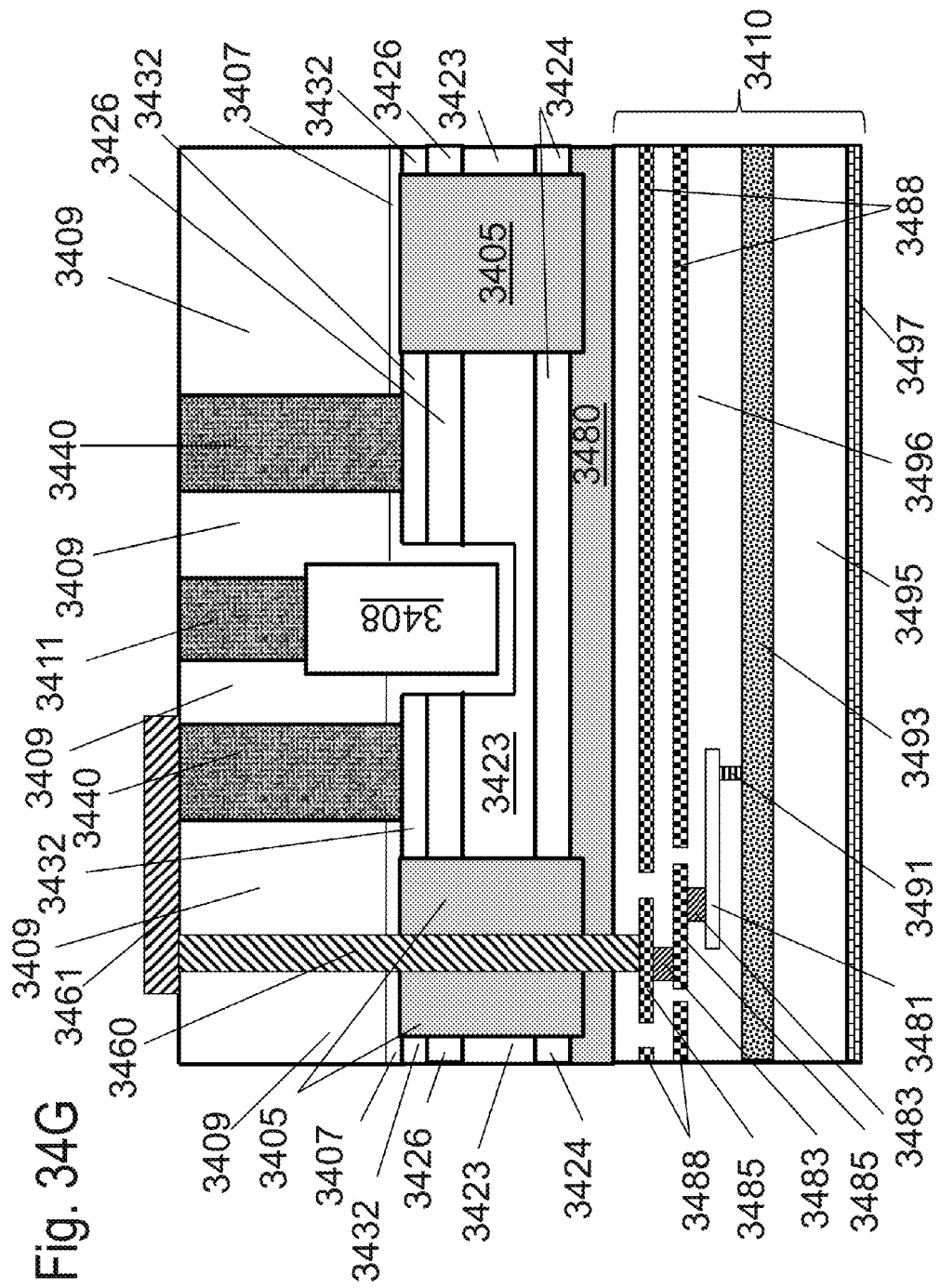

As illustrated in FIG. 34G, thru layer vias (TLVs) 3460 may be formed by etching thick oxide 3409, gate dielectric 3407, isolation regions 3405, oxide layer 3480, into a portion of the upper oxide layer BEOL isolation 3496 of acceptor wafer 3410 BEOL, and filling with an electrically and thermally conducting material or an electrically non-conducting but thermally conducting material. Second device layer metal interconnect 3461 may be formed by conventional processing. TLVs 3460 may be constructed of thermally conductive but not electrically conductive materials, for example, DLC (Diamond Like Carbon), and may connect the FD-RCAT transistor device and other devices on the top (second) crystalline layer thermally to shield/heat sink layer 3488. TLVs 3460 may be constructed out of electrically and thermally conductive materials, such as Tungsten, Copper, or aluminum, and may provide a thermal and electrical connection path from the FD-RCAT transistor device and other devices on the top (second) crystalline layer to shield/heat sink layer 3488, which may be a ground or Vdd plane in the design/layout. TLVs 3460 may be also constructed in the device scribelanes (pre-designed in base layers or potential dicelines) to provide thermal conduction to the heat sink, and may be sawed/diced off when the wafer is diced for packaging not shown). Shield/heat sink layer 3488 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 3488 may be actively biased with an anti-interference signal from circuitry residing on, for example, a layer of the 3D-IC or off chip. A thermal conduction path may be constructed from the devices in the upper layer, the transferred donor layer and formed transistors, to the acceptor wafer substrate and associated heat sink. The thermal conduction path from the FD-RCAT transistor device and other devices on the top (second) crystalline layer, for example, N+ source and drain regions 3432, to the acceptor wafer heat sink 3497 may include source & drain contacts 3440, second device layer metal interconnect 3461, TLV 3460, shield path connect 3485 (shown as twice), shield path via 3483 (shown as twice), metal interconnect 3481, first (acceptor) layer metal interconnect 3491, acceptor wafer transistors and devices 3493, and acceptor substrate 3495. The elements of the thermal conduction path may include materials that have a thermal conductivity greater than 10 W/m-K, for example, copper (about 400 W/m-K), aluminum (about 237 W/m-K), and Tungsten (about 173 W/m-K).

Persons of ordinary skill in the art will appreciate that the illustrations in FIGS. 34A through 34G are exemplary only and are not drawn to scale. Such skilled persons will further appreciate that many variations are possible such as, for example, a p-channel FD-RCAT may be formed with changing the types of dopings appropriately. Moreover, the P– substrate donor wafer 3400 may be n type or un-doped. Further, P– doped channel layer 3403 may include multiple layers of different doping concentrations and gradients to fine tune the eventual FD-RCAT channel for electrical performance and reliability characteristics, such as, for example, off-state leakage current and on-state current. Furthermore, isolation regions 3405 may be formed by a hard mask defined process flow, wherein a hard mask stack, such as, for example, silicon oxide and silicon nitride layers, or silicon oxide and amorphous carbon layers, may be utilized. Moreover, CMOS FD-RCATs may be constructed with n-JLRCATs in a first mono-crystalline silicon layer and p-JLRCATs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Furthermore, P+ doped regions 3424 may be utilized for a double gate structure for the FD-RCAT and may utilize techniques described in the incorporated references. Further, efficient heat removal and transistor body biasing may be accomplished on a FD-RCAT by adding an appropriately doped buried layer (N– in the case of a n-FD-RCAT), forming a buried layer region underneath the P+ doped regions 3424 for junction isolation, and connecting that buried region to a thermal and electrical contact, similar to what is described for layer 1606 and region 1646 in FIGS. 16A-G in the incorporated reference pending U.S. patent application Ser. Nos. 13/441,923. Implants after the formation of the isolation regions 3405 may be annealed by optical (such as pulsed laser) means as previously described and the acceptor wafer metallization may be protected by the shield/heat sink layer 3488. Many other modifications within the scope of the invention will suggest themselves to such skilled persons after reading this specification. Thus the invention is to be limited only by the appended claims.

The ion-cut implant that forms the layer transfer demarcation plane in the donor wafer in many of the 3D stacked layer procedures outlined herein and in U.S. Patent Application Publication 2012/0129301 (allowed U.S. patent application Ser. No. 13/273,712) and pending U.S. patent application Ser. Nos. 13/441,923 and 13/099,010, the contents of the foregoing applications are incorporated herein by reference, is implanted into a doped layer or region. This now allows the ion-cut process to take advantage of the co-implantation effect, wherein the effect of ion-cut species, generally hydrogen, is enhanced die to the presence of another dopant and/or that dopant's damage creation, for example, boron, in the crystalline silicon. This may allow a lower temperature cleaving, for example, under about 400° C. and under about 250° C., may allow the use of a lower ion-cut species dose (and the resultant lower cost process), and may allow a smoother cleave. Two of the papers on the co-implantation topic are Tong, Q.-Y., et al., "Low Temperature Si Layer Splitting", Proceedings 1997 IEEE International SOI Conference, October 1997, pp. 126-127 and Ma, X., et al., "A high-quality SOI structure fabricated by low-temperature technology with B+/H+ co-implantation and plasma bonding", Semiconductor Science and Technology, Vol., 21, 2006, pp. 959-963.

As illustrated in FIG. 35, a P– substrate donor wafer 3500 may be processed to include wafer sized layers of P+ doping 3502, and N– doping 3503 across the wafer, or in regions across the wafer (not shown). The P+ doped layer 3502 may be formed by ion implantation and thermal anneal. N– doped layer 3503 may have additional ion implantation and anneal processing to provide a different dopant level than P– substrate donor wafer 3500. N– doped layer 3503 and P+ doped layer 3502 may have graded or various layers of N– doping. The layer stack may alternatively be formed by successive epitaxially deposited doped silicon layers of P+ 3502 and N– 3503, or by a combination of epitaxy and implantation Annealing of implants and doping may include, for example, conductive/inductive thermal, optical annealing techniques or types of Rapid Thermal Anneal (RTA or spike). The P+ doped layer 3502 may have a doping concentration that may be more than 10× the doping concentration of N– doped layer 3503. N– doped layer 3503 may have a thickness that may allow fully-depleted channel operation. The types of doping of P– substrate donor wafer 3500, N– doped layer 3503, and P+ doped layer 3502 may be changed according to the type, such an n-channel or p-channel, of transistor desired. P– substrate donor wafer 3500 and/or N– doped layer 3503 may be undoped. There may also be more layers or regions formed, such as, for example, as shown herein this document for the FD-RCAT. The top surface of P– substrate donor wafer 3500 may be prepared for oxide wafer bonding with a deposition of an oxide or by thermal oxidation of N– doped layer 3503 to form oxide layer 3580. A layer transfer demarcation plane (shown as dashed line) 3599 may be formed by hydrogen implantation or other methods as described in the incorporated references. Layer transfer demarcation plane 3599 may be formed within or close to P+ doped layer 3502 to take advantage of the co-implantation effect.

Various methods and procedures to form Finfet transistors and thin-side-up transistors, many as part of a 3D stacked layer formation, are outlined herein and in U.S. Patent Application Publication 2012/0129301 (allowed U.S. patent application Ser. No. 13/273,712) (at least in FIGS. 58, 146, 220 and associated specification paragraphs) and pending U.S. patent application Ser. Nos. 13/441,923 and 13/099,010, the contents of the foregoing applications are incorporated herein by reference. An embodiment of the invention is to modify the finfet/thin-side-up transistor formation process wherein multiple regions of differing fin thickness are formed, thus allowing multiple Vt finfet transistors on the same circuit, device, die or substrate. Threshold voltage dependence of fin height has been described in Pei, G., et al., *IEEE Transactions on Electron Devices*, vol. 49, no. 8, p. 1411-1419 (2002).

Figure 36:
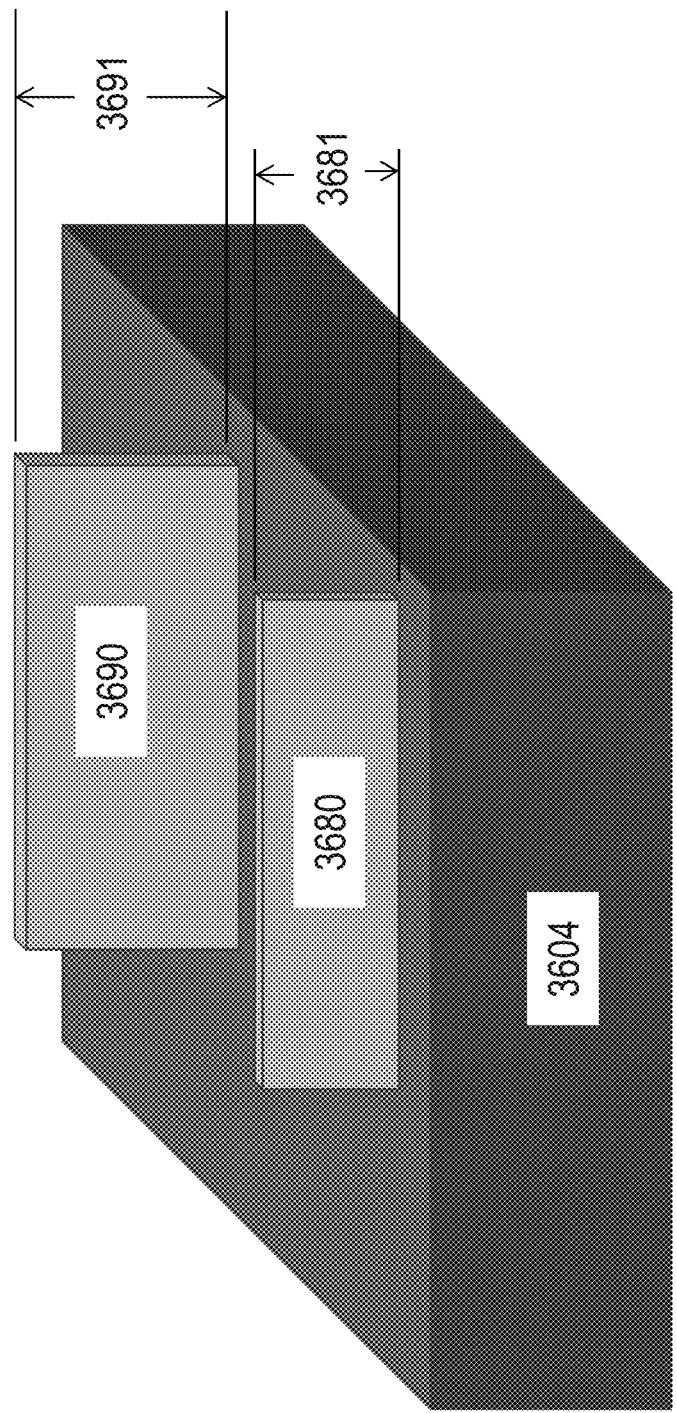
FIG. 36 is an exemplary drawing illustration of forming multiple Vt finfet transistors on the same circuit, device, die or substrate.

As illustrated in FIG. 36, the crystalline fins, for example, monocrystalline silicon fins, made be formed by conventional lithography (spacer enabled) and etch, forming a multiplicity of tall fins 3690 on substrate 3604. Substrate 3604 may be a bulk crystalline substrate or wafer, such as monocrystalline silicon, doped or undoped, or substrate 3604 may be and SOI wafer (Silicon On Insulator). Tall fins 3690 may have a fin height 3691, which may be in a range from about 3 nm to about 300 nm. Short fins 3680 may be formed by protecting the desired at end-of-process tall fins 3690, lithographically exposing the tall fins 3690 that are desired to become short fins 3680, and partially etching (by plasma, RIE, or wet etching) the crystalline material of the exposed tall fins 3690. An approach may be to deposit a filling material (not shown), such as an oxide, covering tall fins 3690, and planarize (with CMP or like processes). The planarized level may be above the top of the tall fins 3690, or just at the top level exposing the tops of tall fins 3690, or below the top of tall fins 3690. Lithography processes (may have hard masks employed as well) may be utilized to cover the desired at end-of-process tall fins 3690 and exposing the tall fins 3690 that are desired to become short fins 3680, and partially etching (by plasma, RIE, or wet etching) the crystalline material of the exposed tall fins 3690, thus resulting in short fins 3680 of short fin height 3681, which may be in a range from about 3 nm to about 300 nm. Short fin height 3681 may be less than fin height 3691, typically by at least 10% of fin height 3691. The filling material may be fully or partially removed, and the conventional finfet processing may continue.

With reference to at least FIG. 70B-1 and associated specification descriptions in U.S. Patent Application Publication 2012/0129301 (allowed U.S. patent application Ser. No. 13/273,712, the contents of the foregoing applications are incorporated herein by reference, an ion-implant may be screened from regions on a chip. For example, this may be applied to the ion-cut implant may be used to form the layer transfer demarcation plane and form various 3D structures as described herein this document and the referenced applications incorporated. As illustrated in FIG. 37, the implant of an atomic species 3710 (illustrated as arrows), such as, for example, H+, may be screened from the sensitive gate areas 3703, which may include gate dielectrics and gate metals, by first masking and etching a shield implant stopping layer of a dense material 3750, for example about 5000 angstroms of Tantalum, and may be combined with about 5,000 angstroms of photoresist 3752. The ion implant screen may also be formed by a thick layer of photoresist, for example, about 3 microns of KTI 950K PMMA and Shipley 1400-30 as described in Yun, C. H., et al., "Transfer of patterned ion-cut silicon layers", *Applied Physics Letters*, vol. 73, no. 19, p. 2772-2774 (November 2008). Various materials and thicknesses could be utilized for the defined screen layer dense material 3752 and photoresist 3752 to effectively screen the implant from harming the underlying structures. In general, the higher the atomic weight and denser the material, the more effective implant screening that can be obtained for a given thickness of the material. The implant of an atomic species 3710 may create a segmented cleave plane 3712 in the bulk (or other layers) of the donor substrate 3700, for example, a monocrystalline silicon wafer. Thus, ion masked region 3713 may be formed. The source and drain of a transistor structure may also be protected from the implant of an atomic species 3710 by the dense material 3752*a* and photoresist 3752*a*, thus ion masked region 3713*a* may be formed. Ion masked regions 3713*a* may be combined by merging the regions of dense material 3752*a* and photoresist 3752*a* to create large regions of ion masked regions. The large regions of ion-masking could be, for example, in the range of 100× 100 nm and even greater than 4 um by 4 um, and may protect a multiplicity of transistors at a time. Many top-viewed shapes and sizes of the ion-masked and ion-implanted regions may be utilized. After cleaving, additional polishing may be applied to provide a smooth bonding surface for layer transfer suitability. To mitigate the inclined ion profile after implant from the sloping edge of the photoresist, photoresist 3752 could be removed prior to the implant and the thickness of dense material 3752 may be adjusted appropriately to substantially block the implant.

It is desirable to tightly integrate compound semiconductor (CS) devices, such as GaN HBTs, InP HEMTs, etc. with silicon based CMOS devices; substantially all formed monolithically (2D or 3D) on the same die and in close proximity to each other (a few microns, etc.). One approach to doing so is to manufacture a hybrid substrate that can be processed to form CS and silicon (Si) based CMOS transistors wherein the hybrid substrate may have high quality and close proximity silicon and CS regions and high quality surfaces. One of the approaches to generating this CS/Si hybrid substrate is to take a monocrystalline silicon wafer (bulk or SOI), etch holes entirely thru the thickness of the monocrystalline silicon wafer, such as TSVs, oxidize to form a thin layer of silicon dioxide, attach the TSV'd monocrystalline silicon wafer to one or more CS template wafers or portions (generally a substantially pure crystalline CS so to provide a perfect epi template), and grow high quality CS epi in the TSV hole, generally via LPE (Liquid Phase Epitaxy) or MOCVD (Metal-Organic Chemical Vapor Deposition) techniques. The TSVs may have many possible sidewall angles with respect to the top surface of the monocrystalline silicon wafer, such as, for example, at about a 90 degree angle or about a 45 degree angle. Generally, the TSV'd silicon substrate may be thinner than the standard thickness-for-wafer-diameter standard (to enable good epitaxial growth quality, rates and efficiencies), and as such, may not be acceptable for standard conventional transistor processing in a production wafer fabrication facility. As well, reuse of the CS/Si hybrid wafer may be desired, as it may generate multiple usable thin layers for processing hybrid (heterogeneous) circuits and devices. It may be desirable to ion-cut a thin layer of the CS/Si hybrid substrate and layer transfer this thin layer (about 5 nm to 1000 nm thick, can be as thick as about 50 um if the transferred to substrate is thinned) to a standard sized silicon substrate, which could be conventionally processed in a production wafer fab. The TSVs of CS may also be trenches, or other shaped regions. The TSVs may be selectively filled with different CS materials, for example, one region of CS filled TSVs may include GaAs, another region on the same silicon substrate may have GaN filled TSVs, and so on, by use of different CS templates attached to the bottom of the TSV'd silicon substrate.

As illustrated in FIG. 38A, a silicon/CS hybrid wafer may include monocrystalline silicon substrate 3800, CS#1 in CS#1via 3857, CS#2 in CS#2via 3858, and surface 3801. For this example, CS#1 and CS#2 are different CS materials and CS#1 may have a higher atomic density than CS#2. An ion-cut implant 3810 of an atomic species, for example hydrogen, may be performed to generate a plane of defects (a perforation layer) in silicon substrate 3800, CS#1 in CS#1via 3857, CS#2 in CS#2via 3858 that may be utilized for cleaving a thin hybrid layer to transfer to another substrate for further processing/manufacturing. However, an uneven cleave plane of defects may result from the differing ion-implant ranges from surface 3801 due to the differing densities of material into which it is implanted. This may substantially preclude a high quality ion-cut cleave for the desired layer transfer. For example, Si perforation plane 3899 may be deeper with respect to surface 3801 than CS#2 perforation plane 3898, both which may be deeper than CS#1 perforation plane 3897. If the three perforation planes are close enough in depth to each other, on the order of about 0-100 nm or less, the ion-cut implant dose may be increased and a high quality cut may be obtained. However, this may also create a higher electrical and physical defectivity in the thin films and material that the ion implant travels thru. The defects may be annealed with techniques disclosed in the referenced documents and herein, such as short wavelength laser anneals and perforated carrier wafer techniques.

As illustrated in FIG. 38B, if a higher implant dose cannot accomplish a high quality ion-cut cleave, the material stack that ion-cut implant 3810 travels thru may be modulated over each substrate region by deposition/growth of an implant depth modulation material. Implant modulation material for silicon regions 3840 may be deposited, etched, formed over the silicon substrate 3800 regions at exposed surface 3801, and an implant modulation material for CS#2 regions 3842 may be deposited, etched, formed over CS#2via 3858 regions at exposed surface 3801. Thus, the three perforation planes, Si perforation plane 3899, CS#2 perforation plane 3898, and CS#1 perforation plane 3897, may be brought close enough in depth to each other to allow a high quality cleave with an even cleave plane. Implant modulation material for silicon regions 3840 and implant modulation material for CS#2 regions 3842 may include, for example, silicon oxide, indium tin oxide, photoresist, silicon nitride, and other semiconductor thin film materials, including combinations of materials, such as, for example, photoresist and silicon oxide. Implant modulation material for silicon regions 3840 and implant modulation material for CS#2 regions 3842 may be constructed with different materials from each other, or may simply be the same material with a different thickness. The edges of implant modulation material for silicon regions 3840 and implant modulation material for CS#2 regions 3842 may be sloped (shown) to approximately match the slope of the silicon substrate TSVs so that the perforated planes at the interface between Si and CS#1 or Si and CS#2 may be substantially even. The sloping may be accomplished with well-known photoresist exposure and develop techniques or with etching (plasma and wet chemical) techniques. Alternatively to or in combination with the modulation layer regions, a selective chemical etch that is selective to the denser CS#1 material may be utilized to remove a the top portion (not shown) of CS#1via 3857 to achieve an even cleave plane.

While concepts in this patent application have been described with respect to 3D-ICs with two stacked device layers, those of ordinary skill in the art will appreciate that it can be valid for 3D-ICs with more than two stacked device layers. Additionally, some of the concepts may be applied to 2D ICs.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. A device, comprising:
   a first layer of first transistors, overlaid by at least one interconnection layer, wherein said interconnection layer comprises copper or aluminum;
   a second layer comprising second transistors, the said second layer overlaying said interconnection layer, wherein said second layer is less than about 0.4 micron thick, wherein said second layer has a coefficient of thermal expansion; and
   a connection path connecting said second transistors to said interconnection layer, wherein said connection path comprises at least one through-layer via, and said through-layer via comprises material whose co-efficient of thermal expansion is within about 50 percent of said second layer coefficient of thermal expansion.

2. A device according to claim 1, wherein said through-layer via comprises tungsten.

3. A device according to claim 1, wherein said connection path comprises copper or aluminum.

4. A device according to claim 1, further comprising:
   a thermal connection to at least one of said second transistors, wherein said thermal connection is electrically isolated from said at least one of said second transistors, and
   said thermal connection provides a thermally conductive path between said at least one of said second transistors and the top or bottom surface of said device, and
   said thermally conducting path has a thermal conductivity of at least 100 W/m-K.

5. A device according to claim 1, wherein said first layer comprises at least one alignment mark, and at least one said through-layer via is aligned at least partially to said first alignment mark with less than 10 nm alignment error.

6. A mobile phone comprising the device of claim 1.

7. A device according to claim 1, wherein said interconnection layer comprises a power grid to provide power to at least one of said second transistors.

8. A device, comprising:
   a first layer of first transistors, overlaid by at least one interconnection layer, wherein said interconnection layer comprises copper or aluminum; and
   a second layer comprising second transistors, the said second layer overlaying said interconnection layer, wherein said second layer is less than about 0.4 micron thick, and said interconnection layer comprises a power grid to provide power to at least one of said second transistors.

9. A device according to claim 8, further comprising logic cells comprising second transistors, wherein at least one of said logic cells comprises a connection made by said interconnection layer.

10. A device according to claim 8, further comprising a connection path between said second transistors and said interconnection layer, wherein
    said connection path comprises at least one through-layer via, and said through-layer via comprises material whose co-efficient of thermal expansion is within about 50 percent of a coefficient of thermal expansion of said second layer.

11. A device according to claim 8, wherein said first layer comprises a first alignment mark, and at least one via through said second layer, and said at least one via comprises alignment at least partially to said first alignment mark.

12. A device according to claim 11, wherein said at least one via comprises tungsten.

13. A device according to claim 8, comprising:
    a thermal connection to at least one of said second transistors, wherein said thermal connection is electrically isolated from said at least one of said second transistors, and
    said thermal connection provides a thermally conductive path between said at least one of said second transistors and the top or bottom surface of said device, and
    said thermally conducting path has a thermal conductivity of at least 100 W/m-K.

14. A device, comprising:
    a first layer of first transistors, overlaid by at least one interconnection layer, wherein said interconnection layer comprises copper or aluminum;

a second layer comprising second transistors, said second layer overlaying said interconnection layer, wherein said second layer is less than about 0.4 micron thick; and a thermal connection to at least one of said second transistors, wherein
- said thermal connection is electrically isolated from said at least one of said second transistors, and
- said thermal connection provides a thermally conductive path between said at least one of said second transistors and the top or bottom surface of said device.

15. A device according to claim 14, wherein the top or bottom surface of said device comprises a heat sink.

16. A mobile phone comprising the device of claim 14.

17. A device according to claim 14, wherein said thermally conducting path has a thermal conductivity of at least 100 W/m-K.

18. A device according to claim 14, wherein said thermal connection comprises a reverse biased p-n junction.

19. A device according to claim 14, wherein said interconnection layer comprises a power grid to provide power to at least one of said second transistors.

20. A device according to claim 14, further comprising
- a connection path connecting said second transistors to said interconnection layer, wherein
- said connection path comprises at least one through-layer via, and said through-layer via comprises material whose co-efficient of thermal expansion is within about 50 percent of said second layer coefficient of thermal expansion.

21. A device according to claim 14, wherein said first layer comprises a first alignment mark, and at least one of said second transistors is aligned to said first alignment mark.

22. A device according to claim 14, further comprising:
- logic cells comprising said second transistors, wherein at least one of said logic cells comprises a connection made by said interconnection layer.

23. A device, comprising:
- a first layer of first transistors, overlaid by at least one interconnection layer, wherein said interconnection layer comprises copper or aluminum;
- a second layer comprising second transistors, said second layer overlaying said interconnection layer, wherein said second layer is less than 0.4 micron thick; and
- a plurality of thermally conducting paths from said second transistors to a heat sink, wherein
  - at least one of said thermally conducting paths has a thermal conductivity of at least 100 W/m-K, and
  - wherein the power delivery paths to at least one of said second transistors comprises said thermally conducting paths.

24. A device according to claim 23, wherein said thermally conducting paths comprise a heat spreader layer between said first layer and said second layer.

25. A device according to claim 23, wherein at least one of said thermal conducting paths comprises a thermal connection to said second layer, and
said thermal connection is electrically non-conducting.

26. A mobile system comprising the device of claim 23.

27. A device according to claim 23, wherein at least one of said second transistors has at least three sides, and thermally conductive dielectric regions are located on the at least three sides.

28. A device according to claim 23, wherein said thermal connection comprises a biased p-n junction.

29. A device according to claim 23, wherein said interconnection layer comprises a power grid to provide power to at least one of said second transistors.

30. A device according to claim 23, further comprising:
- a connection path connecting said second transistors to said interconnection layer, wherein
  - said connection path comprises at least one through-layer via, and
  - said through-layer via comprises material whose co-efficient of thermal expansion is within about 50 percent of said second layer coefficient of thermal expansion.

* * * * *